(12) United States Patent
Dousset et al.

(10) Patent No.: US 11,627,786 B2
(45) Date of Patent: Apr. 18, 2023

(54) GEMSTONE COATINGS AND METHODS OF MAKING AND USING THE SAME

(71) Applicant: GLISTEN LLC, West Hollywood, CA (US)

(72) Inventors: Jean Dousset, West Hollywood, CA (US); Heidi Renate McMahon, West Hollywood, CA (US); James Nathan Hohman, West Hollywood, CA (US); Moonhee Kim, West Hollywood, CA (US)

(73) Assignee: Glisten LLC, West Hollywood, CA (US)

( * ) Notice: Subject to any disclaimer, the term of this patent is extended or adjusted under 35 U.S.C. 154(b) by 418 days.

(21) Appl. No.: 16/738,859

(22) Filed: Jan. 9, 2020

(65) Prior Publication Data

US 2020/0221833 A1    Jul. 16, 2020

Related U.S. Application Data

(63) Continuation of application No. PCT/US2018/041853, filed on Jul. 12, 2018.

(60) Provisional application No. 62/564,634, filed on Sep. 28, 2017, provisional application No. 62/532,805, filed on Jul. 14, 2017.

(51) Int. Cl.
| | |
|---|---|
| *A44C 27/00* | (2006.01) |
| *B05D 1/00* | (2006.01) |
| *B05D 5/08* | (2006.01) |
| *A44C 17/00* | (2006.01) |
| *C04B 41/45* | (2006.01) |
| *C09D 5/00* | (2006.01) |
| *C09D 105/16* | (2006.01) |
| *C30B 33/00* | (2006.01) |

(52) U.S. Cl.
CPC .......... *A44C 27/007* (2013.01); *A44C 27/008* (2013.01); *B05D 1/60* (2013.01); *B05D 5/086* (2013.01); *A44C 17/007* (2013.01); *C04B 41/459* (2013.01); *C04B 41/4552* (2013.01); *C04B 41/4584* (2013.01); *C09D 5/008* (2013.01); *C09D 105/16* (2013.01); *C30B 33/00* (2013.01)

(58) Field of Classification Search
CPC ......... A44C 27/007; B05D 5/086; B05D 1/60
USPC .............................................. 428/403
See application file for complete search history.

(56) References Cited

U.S. PATENT DOCUMENTS

| | | | |
|---|---|---|---|
| 4,917,956 A | 4/1990 | Rohrbach | |
| 5,372,888 A * | 12/1994 | Ogawa | ........ B05D 1/185 428/422 |
| 5,455,072 A | 10/1995 | Bension et al. | |
| 6,303,225 B1 | 10/2001 | Veerasamy | |
| 6,350,191 B1 | 2/2002 | D'Evelyn | |
| 2004/0083759 A1 | 5/2004 | Starcke et al. | |
| 2006/0182883 A1 | 8/2006 | Neogi et al. | |
| 2007/0207321 A1 | 9/2007 | Abe et al. | |
| 2008/0161219 A1 | 7/2008 | Ohlhausen et al. | |
| 2010/0068503 A1 | 3/2010 | Neogi et al. | |
| 2012/0088099 A1 | 4/2012 | Tosatti et al. | |
| 2013/0186851 A1 | 7/2013 | Sullivan et al. | |
| 2014/0186426 A1 | 7/2014 | Tseng et al. | |
| 2015/0218323 A1 | 8/2015 | Kim et al. | |
| 2016/0272749 A1 * | 9/2016 | Letondor | ............ C10M 107/38 |

FOREIGN PATENT DOCUMENTS

| | | |
|---|---|---|
| CA | 2197441 | 9/2001 |
| CN | 101565384 A | 10/2009 |
| CN | 111050593 A | 4/2020 |
| EP | 0 498 339 A1 | 8/1992 |
| EP | 3651606 A1 | 5/2020 |
| WO | WO 2016/174266 A2 | 11/2016 |
| WO | WO 2016/174969 A1 | 11/2016 |
| WO | WO 2019/014465 A1 | 1/2019 |
| WO | WO 2020/150109 A1 | 7/2020 |

OTHER PUBLICATIONS

International Search Report and Written Opinion of the International Searching Authority, in PCT/US18/41853 dated Nov. 30, 2018., 26 pages.
Wang, H.et al., "Langmuir" 2008, 24 (3), 862-868.
Liang, Y.et al., 'Colloid Interface Sci' 2011 354, 23-30.
Price, B. K. et al., "J. Am. Chem. Soc" (2006), 128, 12899-12904.
Štimac, A. et al., 'Molecules' 2017, 22 (2), 297-311.
Krueger, A. et al. "Adv. Funct. Mater." 2012, 22, 890-906.
Yan, C. et al., 'Phys. Chem. Chem. Phys.' 2016, 18, 23358-23364.
Zhong, Y.L. et al., "Chem. Asian J." 2010, 5, 1532-1540.
Mendez-Aroy, A.et al., 'Langmuir' 2014, 30, 3467-3476.
Sipahigil et al, 2016, An integrated diamond nanophotonics platform for quantum-optical networks, Science 354, 847-850.
Q.-D. Hu et al,2014, Cyclodextrin-Based Host-Guest Supramolecular Nanoparticles for Delivery: From Design to Applications, Acc. Chem. Res., 47, 2017-2025.
D. Granadero et al, 2010, Host-Guest Complexation Studied by Fluorescence Correlation Spectroscopy: Adamantane-Cyclodextrin Inclusion, Int J Mol Sci. 11, 173-188.

* cited by examiner

*Primary Examiner* — Hui H Chin
(74) *Attorney, Agent, or Firm* — Knobbe, Martens, Olson & Bear, LLP

(57) ABSTRACT

Disclosed herein are coated gemstones, coatings for gemstones, methods of coating gemstones, and methods of using coatings on gemstones to avoid blemishes on gemstones. In some embodiments, diamonds are functionalized with anchor molecules that bind hydrophilic cyclodextrin molecules to confer hydrophilicity on the diamond. In some embodiments, the diamonds resist dirt and grime build-up.

19 Claims, 33 Drawing Sheets

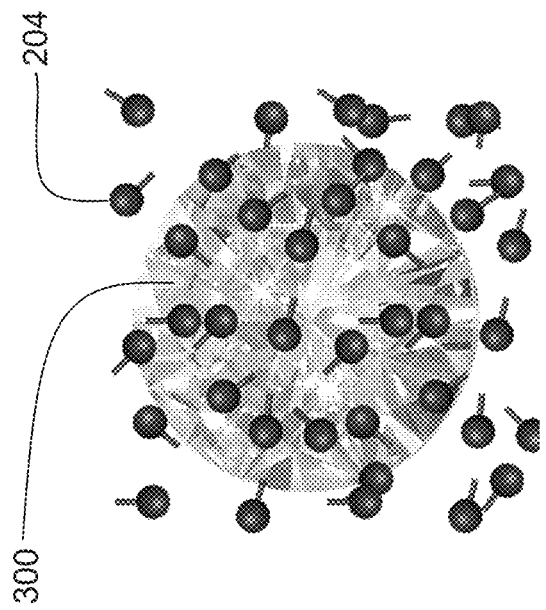
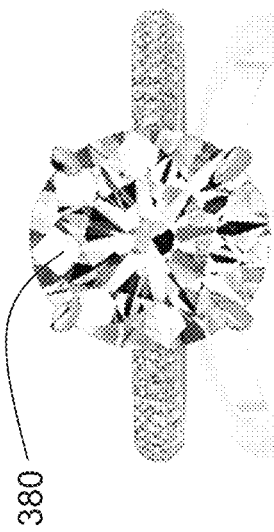
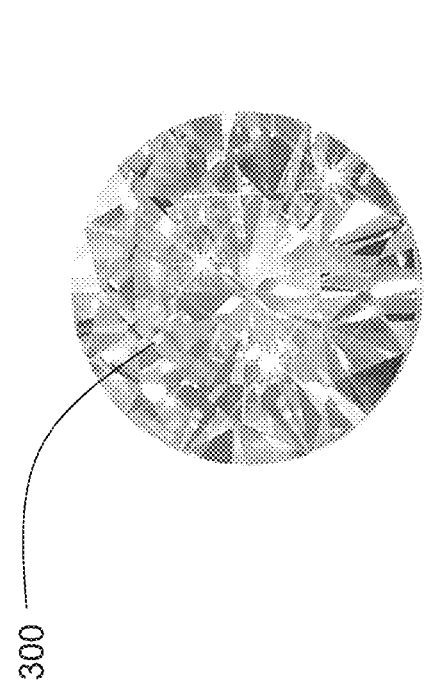
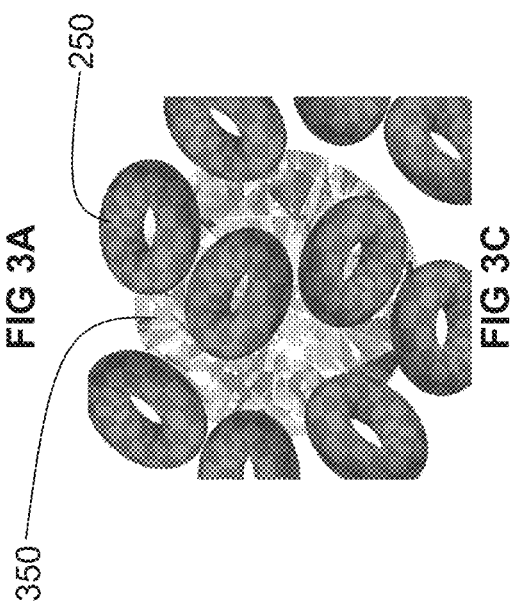
FIG 3A
FIG 3B
FIG 3C
FIG 3D

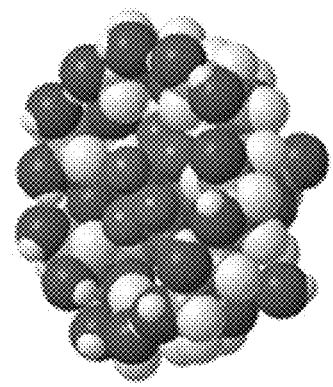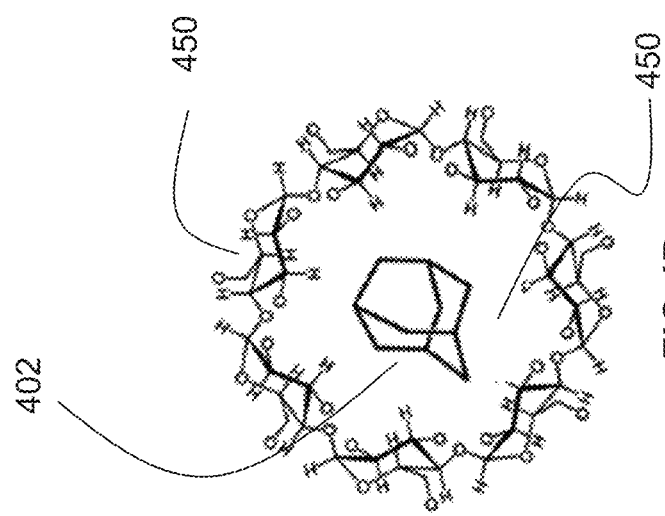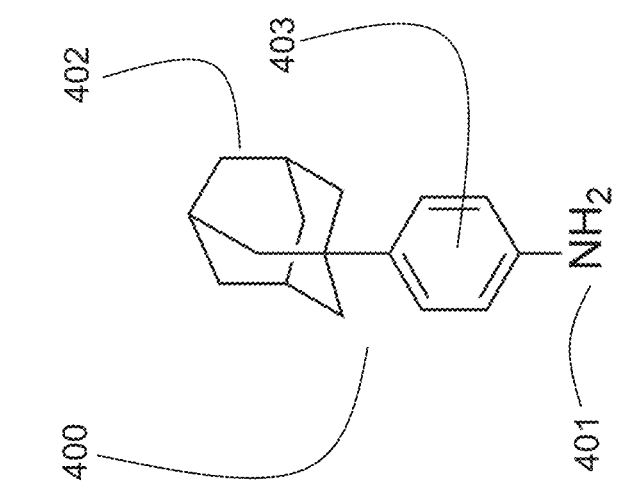

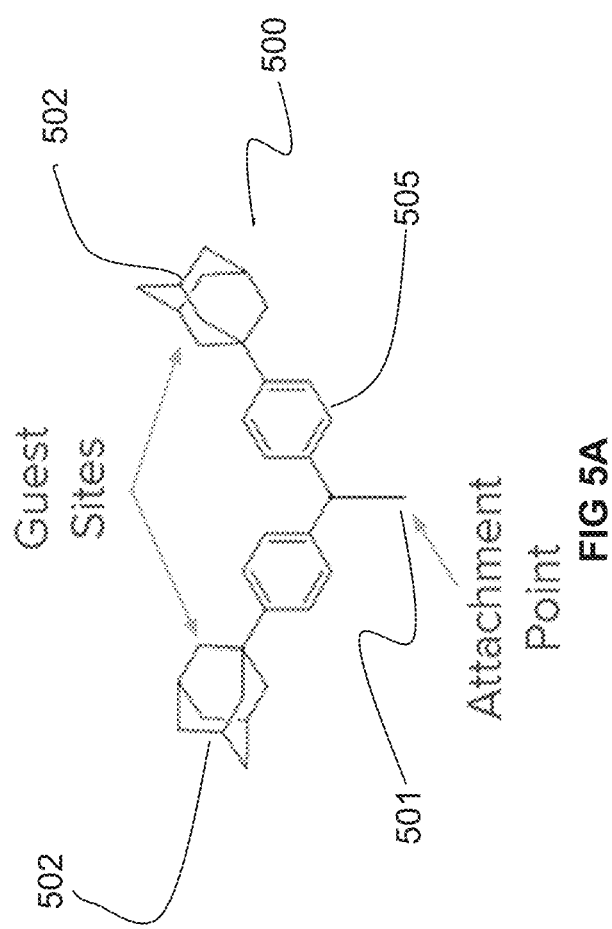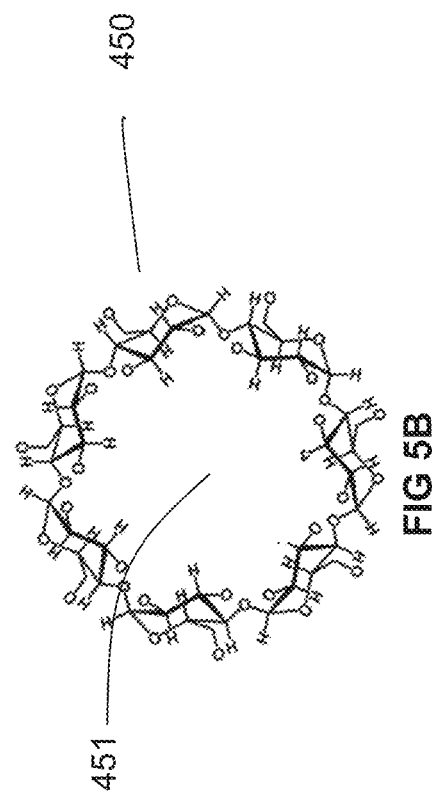

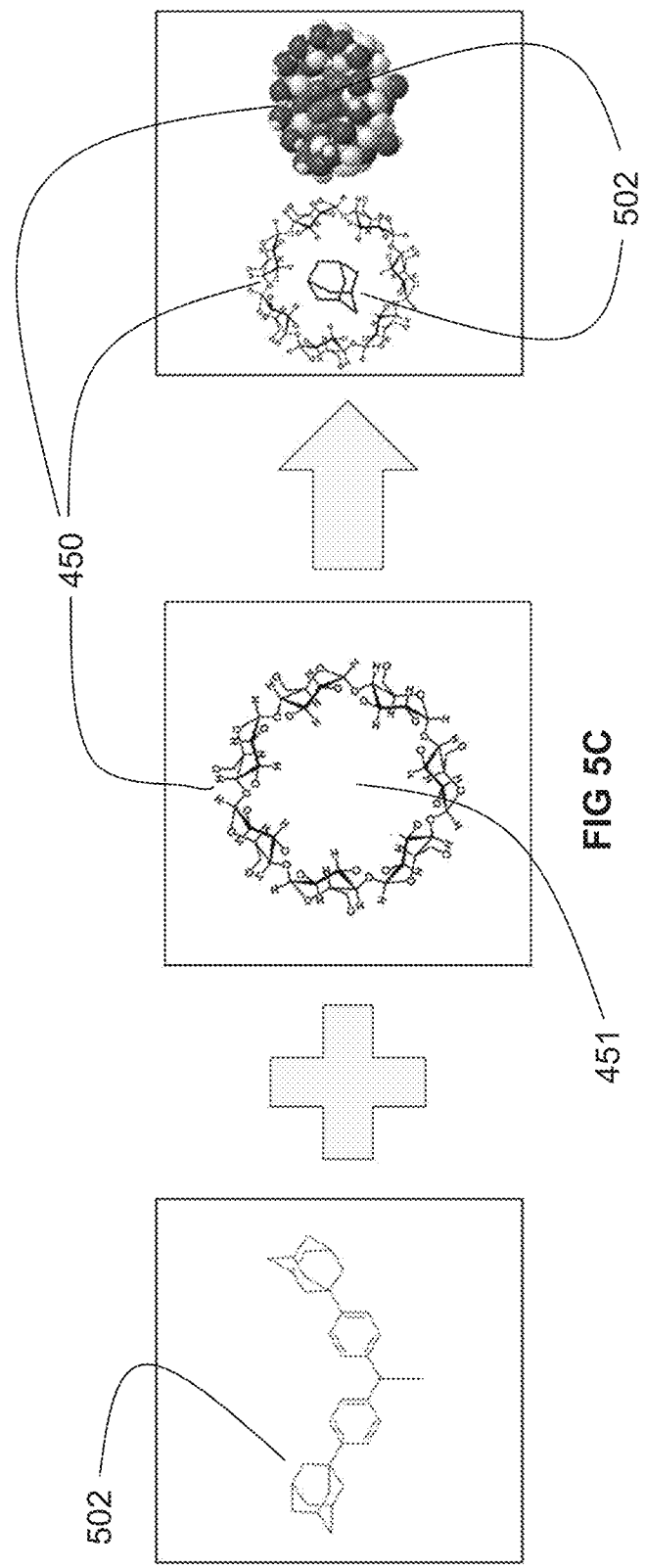

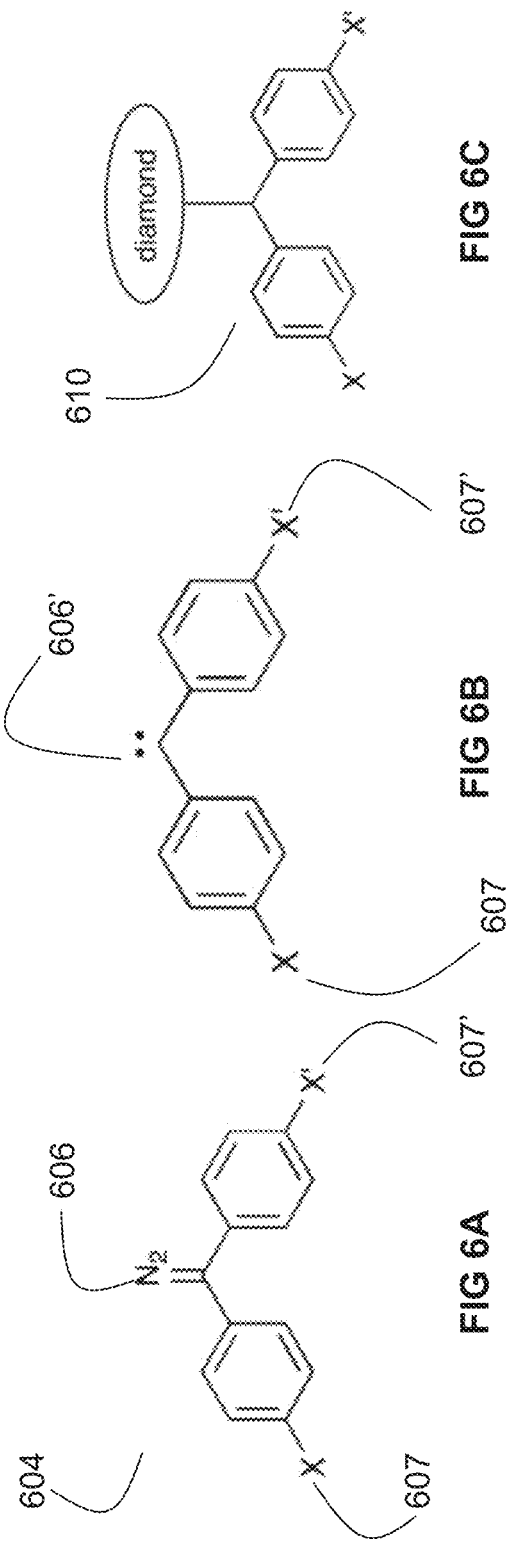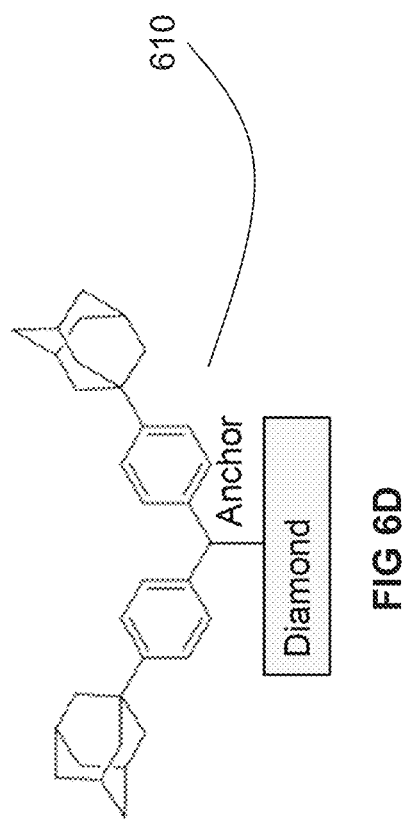
FIG 6A FIG 6B FIG 6C FIG 6D

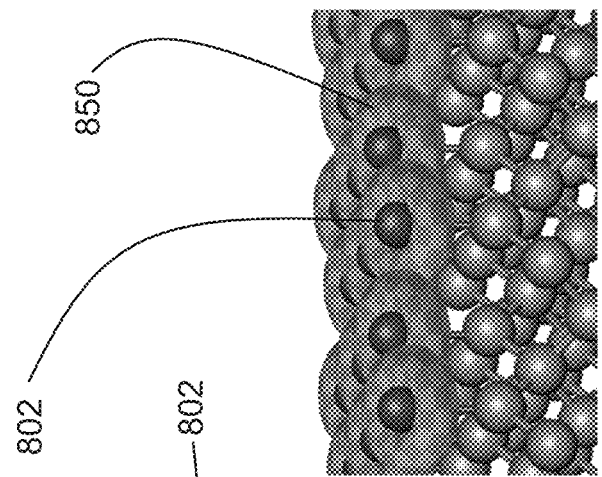
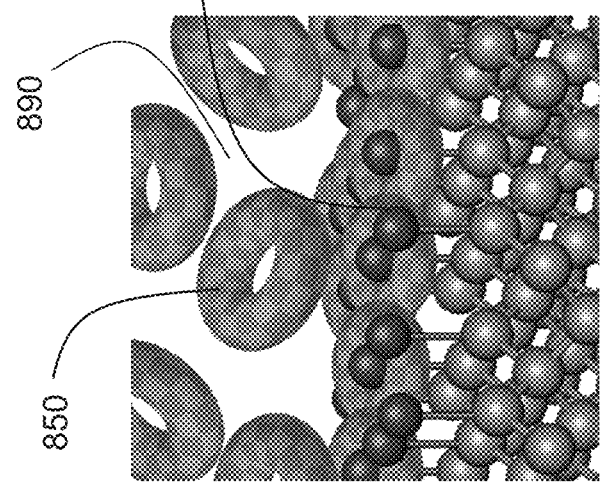
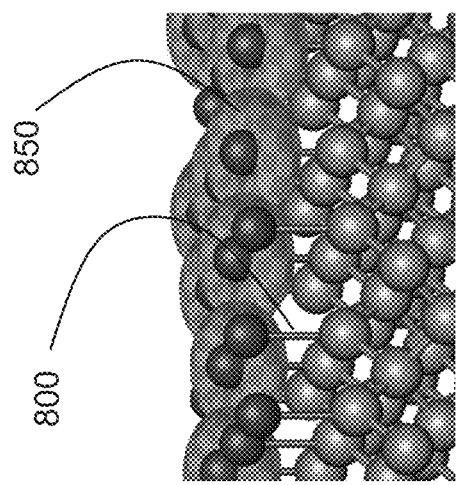
FIG 8C
FIG 8B
FIG 8A

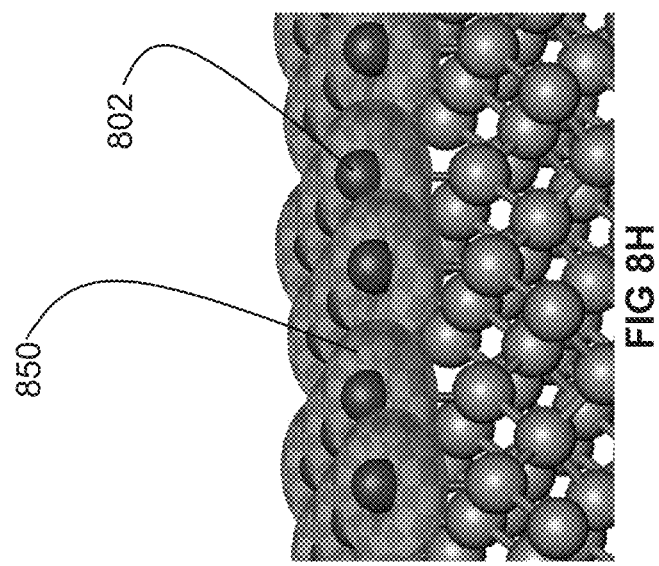
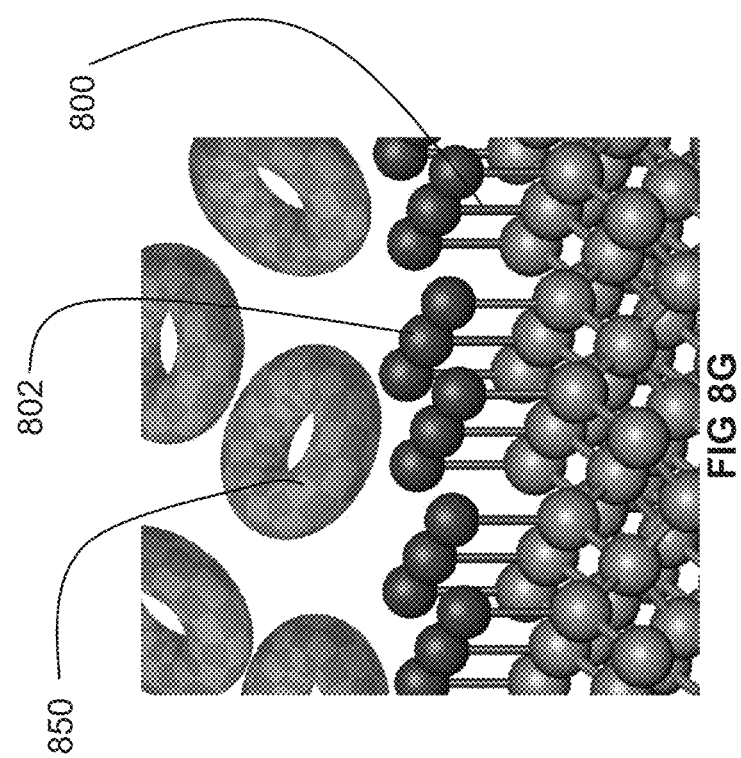

GEMSTONE COATINGS AND METHODS OF MAKING AND USING THE SAME

CROSS REFERENCE TO RELATED APPLICATIONS

The present application is a continuation of International PCT Application No. PCT/US2018/041853, filed Jul. 12, 2018, which claims the benefit of priority to U.S. Provisional Patent Application No. 62/564,634, filed Sep. 28, 2017, and U.S. Provisional Patent Application No. 62/532,805, filed Jul. 14, 2017. The entirety of each of the foregoing applications is hereby incorporated by reference herein.

BACKGROUND

Field of the Invention

This disclosure relates generally to coatings for jewelry and to coatings that resist oil, dirt, and grime build-up.

Description of the Related Art

Over time, gemstone surfaces (e.g., the surface of a diamond or other gemstone), can attract dirt and grime. Dirt and grime can dull the appearance of the gemstone.

SUMMARY

Some embodiments, disclosed herein pertain to coated gemstones. In some embodiments, the coated gemstones are resistant to the build-up of foreign materials (dirt, grime, fingerprints, smudges, oils, etc.) on the surface of the gemstone. In some embodiments, the coating is a multi-part (e.g., two-part) system comprising an anchor functionality bound to the gemstone surface and a separate host molecule. In some embodiments, the anchor functionality comprises a permanent linkage to the surface of the gemstone. In some embodiments, the anchor functionality comprises one or more pendant guest moieties (e.g., a plurality of guest moieties). In some embodiments, the guest moiety (e.g., the guest) interacts with the separate host molecule. In some embodiments, the host-guest unit provides a coating for the gemstone having desired surface properties for the gemstone (e.g., a coated gemstone). In some embodiments, the host molecule confers different surface properties on the coated gemstone such that the surface properties of the coated gemstone are different from than the uncoated gemstone.

Any of the embodiments described above, or described elsewhere herein, can include one or more of the following features.

In some embodiments, the host molecule confers a surface property that is chemically and/or physically different than the chemical properties of the starting gemstone and/or the anchor-functionalized gemstone. In some embodiments, the host-guest unit confers one or more surface properties of the host molecule on the coated gemstone so that, by changing the host molecule, various surface properties can be achieved through the host-guest unit. In some embodiments, the host molecule is hydrophilic and/or has hydrophilic properties. In some embodiments, the surface property conferred on the coated gemstone by the host-guest unit is hydrophilicity. In some embodiments, the coated gemstone (which comprises the anchor-functionalized gemstone and the host) has increased hydrophilicity relative to the gemstone and/or relative to the anchor-functionalized gemstone.

In some embodiments, the linkage between an anchor molecule and the surface of the gemstone is a covalent bond. In some embodiments, the pendant guest portion of the anchor comprises a space-filling molecule. In some embodiments, the host portion of the coating comprises a pocket portion configured to accommodate the guest and/or bind to the guest portion. In some embodiments, the guest of the anchor and the host of the host molecule bind together as an inclusion complex. In some embodiments, the guest of the anchor and the host of the host molecule bind together through one or more of coulombic interactions and/or Van der Waals forces.

In some embodiments, the guest is an adamantyl group. In some embodiments, the guest is an optionally substituted adamantyl group. In some embodiments, the host molecule is a cyclodextrin. In some embodiments, the host molecule is an optionally substituted cyclodextrin. In some embodiments, the host molecule is β-cyclodextrin.

In other embodiments, the anchor portion of the anchor-functionalized gemstone comprises a pocket moiety (e.g., a host) configured to accommodate a space-filling binding agent (guest). In some embodiments, the guest molecule confers a desired property on the gemstone.

In some embodiments, the gemstone is a precious or semi-precious stone. In some embodiments, the gemstone is selected from the group consisting of alexandrite, amethyst, aquamarine, citrine, diamond, emerald, garnet, glass, jade, lapis lazuli, moonstone, morganite, onyx, opal, paraiba, pearls, peridot, rubellite, ruby, sapphire, spinel, tanzanite, topaz, tourmaline, turquoise, zircon, and the like. In some embodiments, the gemstone is a diamond.

Some embodiments pertain to a coated gemstone comprising a coating and a gemstone, the coated gemstone represented by Formula I:

In some embodiments, G represents the gemstone and the coating comprises -A(-X)$_m$. In some embodiments, A is an anchor moiety coupled to G. In some embodiments, X is a guest moiety covalently bonded to A and configured to bind to a host molecule. In some embodiments, m is an integer between 1 and 5. In some embodiments, the coated gemstone is configured to resist the accumulation of oil and dirt on the surface of the gemstone when functionalized with the host. In some embodiments, G is permanently coupled to A (e.g., via a covalent bond).

In some embodiments, A is represented by Formula AIII:

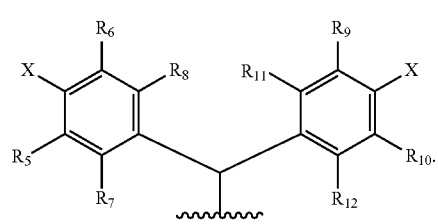

where " " indicates a bond to G. In some embodiments, $R_5$, $R_6$, $R_7$, $R_8$, $R_9$, $R_{10}$, $R_{11}$, and $R_{12}$ are independently selected from —H, $C_1$ to $C_6$ alkyl optionally substituted with halogen or hydroxy, $C_1$ to $C_6$ alkenyl optionally substituted with halogen or hydroxy, $C_1$ to $C_6$ alkynyl optionally substituted with halogen or hydroxy, $C_1$ to $C_6$ alkoxy, hydroxyl, halogen, $C_1$ to $C_6$ haloalkyl, $C_1$ to $C_6$ haloalkoxy, a mono-substituted amine($C_1$ to $C_6$ alkyl), a di-substituted amine($C_1$ to $C_6$ alkyl), a diamino-group, a polyamino, a diether-group, and a polyether-.

In some embodiments, X is a guest moiety represented the following structure:

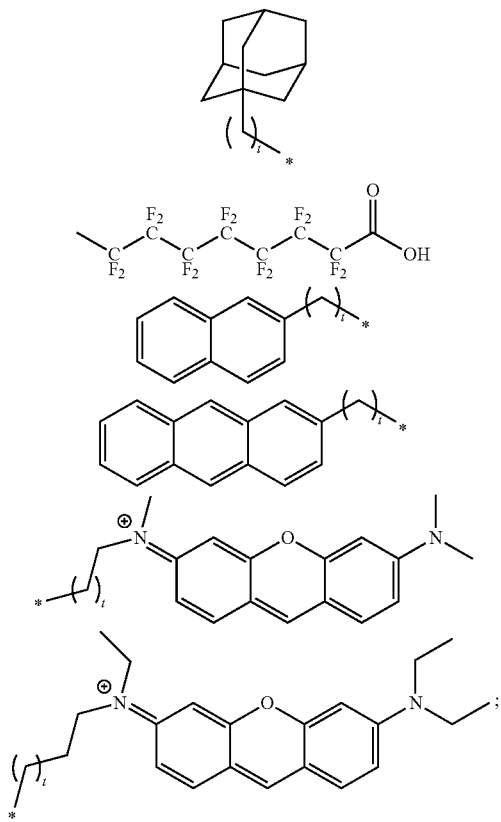

where * represents a bond to A. In some embodiments, t is an integer from 0 to 5.

In some embodiments, $R_5$, $R_6$, $R_7$, $R_8$, $R_9$, $R_{10}$, $R_{11}$, and $R_{12}$ are independently selected from —H, $C_1$ to $C_6$ alkyl, hydroxyl, a halogen, and —$OCH_3$.

In some embodiments, X is represented the following structure:

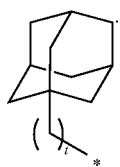

In some embodiments, t is 0 or 1.

In some embodiments, the guest moiety is configured to bind to the host through the formation of an inclusion complex. In some embodiments, guest moiety is configured to be received in the pore (e.g., cavity) of a cyclodextrin. In some embodiments, guest moiety is sized or shaped to reside in the pore of a cyclodextrin. In some embodiments, the cyclodextrin is selected from the group consisting of an α-cyclodextrin, a β-cyclodextrin, and a γ-cyclodextrin.

In some embodiments, the coated gemstone comprises the host molecule. In some embodiments, the host is an optionally substituted cyclodextrin. In some embodiments, the optionally substituted cyclodextrin is represented by the following structure:

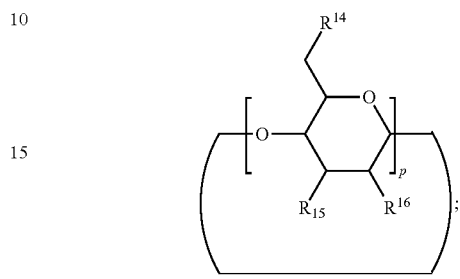

where p is an integer from 1 to 8. In some embodiments, each of $R_{14}$, $R_{15}$, and $R_{16}$ is independently selected from —H, $C_1$ to $C_6$ alkoxy, halogen, and polyether. In some embodiments, the cyclodextrin is selected from the group consisting of an optionally substituted α-cyclodextrin, an optionally substituted β-cyclodextrin, and an optionally substituted γ-cyclodextrin. In some embodiments, the host molecule is β-cyclodextrin.

In some embodiments, the gemstone is selected from the group consisting of alexandrite, amethyst, aquamarine, citrine, diamond, emerald, garnet, jade, lapis lazuli, moonstone, morganite, onyx, opal, paraiba, pearls, peridot, rubellite, ruby, sapphire, spinel, tanzanite, topaz, tourmaline, turquoise, and zircon.

In some embodiments, the gemstone is a diamond and -A(-X)m is represented by the following structure:

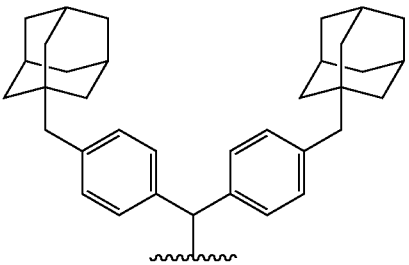 [SMILES: *C(c1ccc(CC23CC4CC(CC(C4)C2)C3)cc1)c1ccc(CC23CC4CC(CC(C4)C2)C3)cc1]

where ⌇ indicates a bond to G. In some embodiments, the coated gemstone comprises the host molecule. In some embodiments, the host molecule is β-cyclodextrin.

Some embodiments pertain to a coated, soil-resistant gemstone comprising an anchor irreversibly linked to the gemstone and a binding agent, wherein the anchor comprises a pendant binding portion that reversibly binds to the binding agent.

In some embodiments, the binding agent is hydrophilic. In some embodiments, the binding agent is configured to change one or more surface properties of the gemstone to provide soil resistance.

In some embodiments, the coated gemstone has a contact angle for water that is at least 50° lower than a contact angle of the gemstone prior to coating.

Some embodiments pertain to a coated gemstone. In some embodiments, the coated gemstone comprises a gemstone with an anchor functionality. In some embodiments, the anchor functionality comprises a linkage to the gemstone. In some embodiments, the anchor functionality comprises a pendant guest portion. In some embodiments, the coated gemstone comprises host molecule bound to the gemstone via the pendant guest portion of the anchor molecule.

In some embodiments, the host molecule confers a surface property on the gemstone. In some embodiments, the surface property conferred on the gemstone by the host molecule is a different surface property than the gemstone has when uncoated. In some embodiments, the surface property conferred on the gemstone is hydrophilicity.

In some embodiments, the gemstone is a diamond.

In some embodiments, the linkage is a covalent bond.

In some embodiments, the pendant guest portion is an adamantyl group.

In some embodiments, the host molecule is a cyclodextrin. In some embodiments, the cyclodextrin is functionalized with one or more of a hydrophilic moiety, a hydrophobic moiety, or an amphiphilic moiety. In some embodiments, the host molecule is beta-cyclodextrin. In some embodiments, more than one host molecule binds to an anchor/guest unit. In some embodiments, the host molecule is selected based on the size of a guest site located on the host molecule and the guest portion of the anchor is selected to fit within the guest site of the host molecule.

Some embodiments pertain to a coated gemstone comprising a coating and a gemstone, the coated gemstone represented by Formula II:

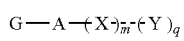

Formula II

In some embodiments, G represents the gemstone and the coating comprises -A(-X)$_m$. In some embodiments, A is an anchor moiety covalently bonded to G. In some embodiments, X is a guest moiety coupled to A and configured to bind to a host molecule. In some embodiments, X is a guest moiety covalently bonded to A. In some embodiments, m is an integer between 1 and 5. In some embodiments, Y is the host molecule. In some embodiments, q is an integer between 1 and 5. In some embodiments, the coated gemstone is configured to resist the accumulation of oil and dirt on the surface of the gemstone.

In some embodiments, A is represented by Formula AIII:

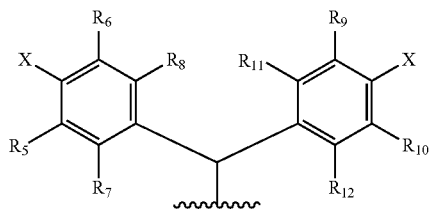

Formula AIII wherein ⌇ indicates a bond to G. In some embodiments, $R_5$, $R_6$, $R_7$, $R_8$, $R_9$, $R_{10}$, $RR_{11}$, and $R_{12}$ are independently selected from —H, $C_1$ to $C_6$ alkyl optionally substituted with halogen or hydroxy, $C_1$ to $C_6$ alkenyl optionally substituted with halogen or hydroxy, $C_1$ to $C_6$ alkynyl optionally substituted with halogen or hydroxy, $C_1$ to $C_6$ alkoxy, hydroxyl, halogen, $C_1$ to $C_6$ haloalkyl, $C_1$ to $C_6$ haloalkoxy, a mono-substituted amine($C_1$ to $C_6$ alkyl), a di-substituted amine($C_1$ to $C_6$ alkyl), a diamino-group, a polyamino, a diether-group, and a polyether-.

In some embodiments, X is a guest moiety represented the following structure:

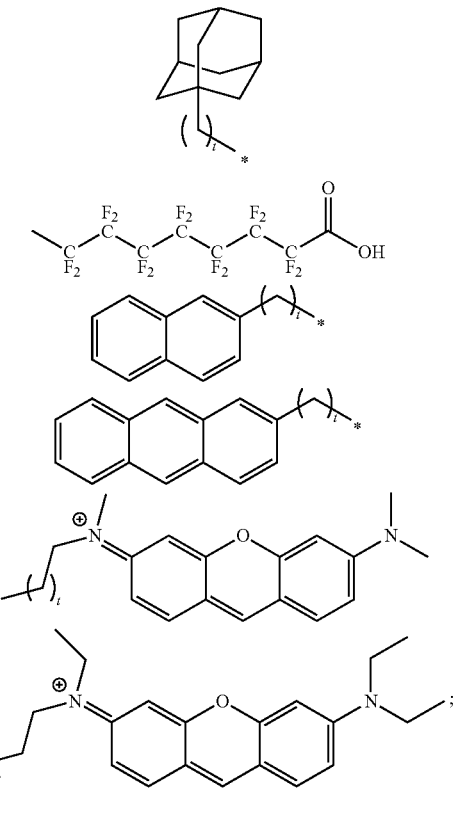

where * represents a bond to A. In some embodiments, t is an integer from 0 to 5.

In some embodiments, Y is represented by the following structure:

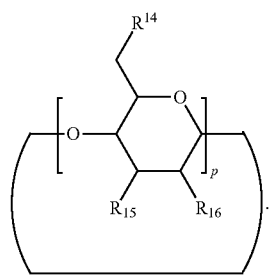

In some embodiments, p is an integer from 1 to 8. In some embodiments, each of $R_{14}$, $R_{15}$, and $R_{16}$ is independently selected from —H, $C_1$ to $C_6$ alkoxy, halogen, and polyether.

In some embodiments, the coated gemstone comprises a gemstone that is jewelry grade.

Some embodiments disclosed herein pertain to a jewelry piece comprising a coated gemstone as disclosed herein.

Some embodiments disclosed herein pertain to a method of manufacturing a coated gemstone. In some embodiments, an anchor-guest reagent is reacted with a gemstone to provide a gemstone having pendant guest moieties. In some embodiments, the gemstone comprising pendant guest moieties is exposed to a host molecule.

Some embodiments disclosed herein pertain to a method of preventing or delaying the soiling of a gemstone. In some embodiments, a coated gemstone is provided. In some embodiments, the coated gemstone is exposed to host molecule to provide a soil-resistant gemstone. In some embodiments, the host molecule is reapplied to the anchor-functionalized gemstone after a period of use of the soil-resistant gemstone. In some embodiments, the soil resistant gemstone is washed to remove residual host molecules after a period of use of the soil-resistant gemstone. In some embodiments, the host molecule is reapplied after a period of use of the soil-resistant gemstone.

BRIEF DESCRIPTION OF THE DRAWINGS

FIGS. 1C and 1E show a photograph and an ASET image, respectively, of a clean diamond. FIGS. 1D and 1F show a photograph and an ASET image, respectively, of a dirty diamond. FIG. 1G shows a representative SEM image of a fouled diamond having dirt particles and grime accumulated (see arrows). The scale bars indicate 2 mm and 200 μm.

FIGS. 3A-3D depict a diamond (FIG. 3A), the functionalization of the diamond surface with an anchor molecule (FIG. 3B), the treatment of the functionalized diamond with a hydrophilic agent that binds to the anchor molecule (FIG. 3C), and the resultant treated diamond (FIG. 3D) set in a ring.

FIGS. 4A-C show an embodiment of starting material for an anchor molecule (FIG. 4A) that can be bound to the surface of a diamond, a skeletal structure depiction of an embodiment of a hydrophilic binding agent binding to a portion of the anchor molecule (FIG. 4B) and a space-filling depiction of the interaction of the anchor molecule and hydrophilic binding agent (FIG. 4C).

FIGS. 5A-C depict an embodiment of an anchor molecule (FIG. 5A), a depiction of an embodiment of a hydrophilic binding agent (FIG. 5B), and a scheme (FIG. 5C) showing an anchor molecule with a host moiety (left panel) interacting with a host molecule (middle panel) to provide bound host-guest moiety (right panel; partial view).

FIGS. 6A-6D show embodiments of anchor-moieties as disclosed herein. FIG. 6A shows a genus of the anchor molecules with variable guest sites (X, X'), showing nitrogen-based, diazo-attachment point 606. FIG. 6B shows the genus of FIG. 6A in activated anionic form. FIG. 6C shows an embodiment of an anchor molecule bound to a carbon diamond surface. FIG. 6D shows an embodiment of an anchor molecule with adamantyl guest sites bound to a cyclodextrin host.

FIGS. 8A-8H depict the wearing away of host molecules from the surface of a diamond and the regeneration of a diamond surface with host molecules. FIG. 8A shows a diamond surface irreversibly functionalized with anchor molecules. As shown, certain anchor molecules of the diamond lack host molecules. FIG. 8B shows the exposure of the anchors of the diamond surface of FIG. 8A to host molecules. FIG. 8C shows the diamond surface of FIG. 8A where after treatment with host molecules in FIG. 8B. FIG. 8D shows the diamond surface of FIG. 8C after some of the host molecules have been worn-off. FIG. 8E shows the removal of host molecules from the diamond surface. FIG. 8F shows the diamond surface of FIG. 8C after all the host molecules have been removed. FIG. 8G shows the exposure of the anchor of the diamonds surface of FIG. 8F to host molecules. FIG. 8H shows the diamond surface of FIG. 8F where all the anchors have been functionalized with host molecules.

FIG. 9A shows wafers after droplet coatings of two concentrations of anchor-functionalizing solutions are applied. FIG. 9B shows the wafers after evaporation of the anchor-functionalizing solutions. FIG. 9C shows the rinsing of the wafers. FIG. 9D shows diamonds droplet-coated with two concentrations of anchor-functionalizing solutions.

DETAILED DESCRIPTION

Figure 1B:
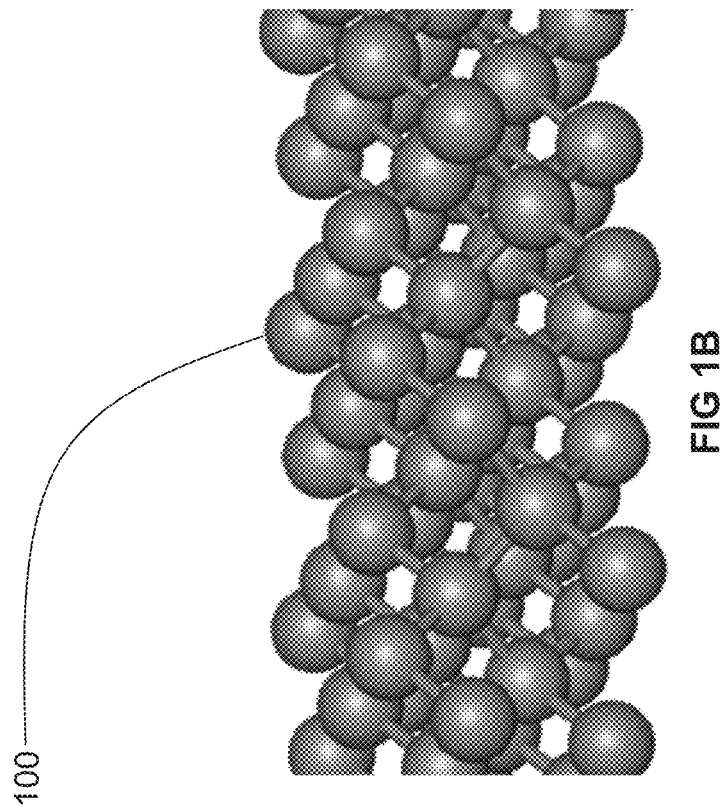
FIG. 1B is a depiction of a portion of a diamond crystal lattice comprising carbon atoms bonded to other carbon atoms.

Some embodiments disclosed here pertain to molecular coatings for gemstones (e.g., diamonds), methods of coating gemstones, and methods of using gemstone coatings to resist dulling of gemstones. In some embodiments, the molecular coating comprises an anchor molecule and a host molecule. In some embodiments, the anchor molecular comprises one or more guest functionalities that interact with and/or bind to the host molecule. In some embodiments, the host molecule alters the physical properties of the gemstone. For instance, in some embodiments, hydrophobic gem surfaces can be converted to hydrophilic surfaces using a hydrophilic host molecule. Conversely, in some embodiments, hydrophilic gem surfaces can be converted to hydrophobic surfaces using a hydrophobic host molecule. In some embodiments, mixed surfaces (hydrophilic, amphiphilic, or hydrophobic) can be achieved through the selection of varying guest or host molecules. The following description provides context and examples, but should not be interpreted to limit the scope of the inventions covered by the claims that follow in this specification or in any other application that claims priority to this specification. No single component or collection of components is essential or indispensable. For example, some embodiments may lack a host molecule and the anchor may itself confer the desired physical properties to the gem surface. While several examples are discussed below using diamond as a reference gemstone, the techniques and chemistry described herein can be adapted to other gemstones, other crystalline materials (e.g. SiC, synthetic diamond, CVD diamond wafer, etc.), other carbonaceous materials (e.g. carbide-derived carbon, carbonaceous aerogel, nanocrystalline diamond and graphitic carbon containing matrices), and vitrified amorphous surfaces (e.g. diverse glasses). In some embodiments, the techniques disclosed herein also can be employed on glass surfaces by using a different anchor attachment chemistry (e.g., silane)

Whenever a group is described herein as being "optionally substituted" that group may be unsubstituted or substituted with one or more of the indicated substituents. Likewise, when a group is described as "unsubstituted or substituted" (or "substituted or unsubstituted") if substituted, the substituent(s) may be selected from one or more of the indicated substituents. If no substituents are indicated, it is meant that the indicated "optionally substituted" or "substituted" group may be substituted with one or more group(s) individually and independently selected from alkyl, alkenyl, alkynyl, cycloalkyl, cycloalkenyl, aryl, heteroaryl, heterocyclyl, aryl(alkyl), cycloalkyl(alkyl), heteroaryl(alkyl), heterocyclyl(alkyl), hydroxy, alkoxy, acyl, cyano, halogen, thiocarbonyl, O-carbamyl, N-carbamyl, O-thiocarbamyl, N-thiocarbamyl, C-amido, N-amido, S-sulfonamido, N-sulfonamido, C-carboxy, O-carboxy, nitro, sulfenyl, sulfinyl, sulfonyl, haloalkyl, haloalkoxy, an amino, a mono-substituted amine group, a di-substituted amine group, a mono-substituted amine(alkyl), a di-substituted amine(alkyl), a diamino-group, a polyamino, a diether-group, and a polyether-.

As used herein, "$C_a$ to $C_b$" in which "a" and "b" are integers refer to the number of carbon atoms in a group. The indicated group can contain from "a" to "b", inclusive, carbon atoms. Thus, for example, a "$C_1$ to $C_4$ alkyl" group refers to all alkyl groups having from 1 to 4 carbons, that is 1, 2, 3, or 4 carbons as $CH_3$—, $CH_3CH_2$—, $CH_3CH_2CH_2$—, $(CH_3)_2CH$—, $CH_3CH_2CH_2CH_2$—, $CH_3CH_2CH(CH_3)$—, $CH_3CH(CH_3)CH_2$— and $(CH_3)_3C$—. If no "a" and "b" are designated, the broadest range described in these definitions is to be assumed.

If two "R" groups are described as being "taken together" the R groups and the atoms they are attached to can form a cycloalkyl, cycloalkenyl, aryl, heteroaryl or heterocycle. For example, without limitation, if $R^a$ and $R^b$ of an $NR^aR^b$ group are indicated to be "taken together," it means that they are covalently bonded to one another to form a ring:

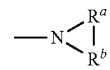

As used herein, the term "alkyl" refers to a fully saturated aliphatic hydrocarbon group. The alkyl moiety may be branched or straight chain. Examples of branched alkyl groups include, but are not limited to, iso-propyl, sec-butyl, t-butyl and the like. Examples of straight chain alkyl groups include, but are not limited to, methyl, ethyl, n-propyl, n-butyl, n-pentyl, n-hexyl, n-heptyl and the like. The alkyl group may have 1 to 30 carbon atoms (whenever it appears herein, a numerical range such as "1 to 30" refers to each integer in the given range; e.g., "1 to 30 carbon atoms" means that the alkyl group may consist of 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 carbon atoms, although the present definition also covers the occurrence of the term "alkyl" where no numerical range is designated). The "alkyl" group may also be a medium size alkyl having 1 to 12 carbon atoms. The "alkyl" group could also be a lower alkyl having 1 to 6 carbon atoms. An alkyl group may be substituted or unsubstituted. By way of example only, "$C_1$-$C_5$ alkyl" indicates that there are one to five carbon atoms in the alkyl chain, i.e., the alkyl chain is selected from methyl, ethyl, n-propyl, isopropyl, n-butyl, isobutyl, tert-butyl, pentyl (branched and straight-chained), etc. Typical alkyl groups include, but are in no way limited to, methyl, ethyl, propyl, isopropyl, butyl, isobutyl, tertiary butyl, pentyl and hexyl.

As used herein, the term "alkylene" refers to a bivalent fully saturated straight chain aliphatic hydrocarbon group. Examples of alkylene groups include, but are not limited to, methylene, ethylene, propylene, butylene, pentylene, hexylene, heptylene and octylene. An alkylene group may be represented by ⌇, followed by the number of carbon atoms, followed by a "*". For example,

to represent ethylene. The alkylene group may have 1 to 30 carbon atoms (whenever it appears herein, a numerical range such as "1 to 30" refers to each integer in the given range; e.g., "1 to 30 carbon atoms" means that the alkyl group may consist of 1 carbon atom, 2 carbon atoms, 3 carbon atoms, etc., up to and including 30 carbon atoms, although the present definition also covers the occurrence of the term "alkylene" where no numerical range is designated). The alkylene group may also be a medium size alkyl having 1 to 12 carbon atoms. The alkylene group could also be a lower alkyl having 1 to 6 carbon atoms. An alkylene group may be substituted or unsubstituted. For example, a lower alkylene group can be substituted by replacing one or more hydrogen of the lower alkylene group and/or by substituting both hydrogens on the same carbon with a $C_{3-6}$ monocyclic cycloalkyl group

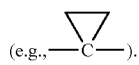

The term "alkenyl" used herein refers to a monovalent straight or branched chain radical of from two to twenty carbon atoms containing a carbon double bond(s) including, but not limited to, 1-propenyl, 2-propenyl, 2-methyl-1-propenyl, 1-butenyl, 2-butenyl and the like. An alkenyl group may be unsubstituted or substituted.

The term "alkynyl" used herein refers to a monovalent straight or branched chain radical of from two to twenty carbon atoms containing a carbon triple bond(s) including, but not limited to, 1-propynyl, 1-butynyl, 2-butynyl and the like. An alkynyl group may be unsubstituted or substituted.

As used herein, "cycloalkyl" refers to a completely saturated (no double or triple bonds) mono- or multi-cyclic (such as bicyclic) hydrocarbon ring system. When composed of two or more rings, the rings may be joined together in a fused, bridged or spiro fashion. As used herein, the term "fused" refers to two rings which have two atoms and one bond in common. As used herein, the term "bridged cycloalkyl" refers to compounds wherein the cycloalkyl contains a linkage of one or more atoms connecting non-adjacent atoms. As used herein, the term "spiro" refers to two rings which have one atom in common and the two rings are not linked by a bridge. Cycloalkyl groups can contain 3 to 30 atoms in the ring(s), 3 to 20 atoms in the ring(s), 3 to 10 atoms in the ring(s), 3 to 8 atoms in the ring(s) or 3 to 6 atoms in the ring(s). A cycloalkyl group may be unsubstituted or substituted. Examples of mono-cycloalkyl groups include, but are in no way limited to, cyclopropyl, cyclobutyl, cyclopentyl, cyclohexyl, cycloheptyl and cyclooctyl. Examples of fused cycloalkyl groups are decahydronaphthalenyl, dodecahydro-1H-phenalenyl and tetradecahydroanthracenyl; examples of bridged cycloalkyl groups are bicyclo[1.1.1]pentyl, adamantanyl and norbornanyl; and examples of spiro cycloalkyl groups include spiro[3.3]heptane and spiro[4.5]decane.

As used herein, "cycloalkenyl" refers to a mono- or multi-cyclic (such as bicyclic) hydrocarbon ring system that contains one or more double bonds in at least one ring; although, if there is more than one, the double bonds cannot form a fully delocalized pi-electron system throughout all the rings (otherwise the group would be "aryl," as defined herein). Cycloalkenyl groups can contain 3 to 10 atoms in the ring(s), 3 to 8 atoms in the ring(s) or 3 to 6 atoms in the ring(s). When composed of two or more rings, the rings may be connected together in a fused, bridged or spiro fashion. A cycloalkenyl group may be unsubstituted or substituted.

As used herein, "aryl" refers to a carbocyclic (all carbon) monocyclic or multicyclic (such as bicyclic) aromatic ring system (including fused ring systems where two carbocyclic rings share a chemical bond) that has a fully delocalized pi-electron system throughout all the rings. The number of carbon atoms in an aryl group can vary. For example, the aryl group can be a $C_6$-$C_{14}$ aryl group, a $C_6$-$C_{10}$ aryl group or a $C_6$ aryl group. Examples of aryl groups include, but are not limited to, benzene, naphthalene and azulene. An aryl group may be substituted or unsubstituted. As used herein, "heteroaryl" refers to a monocyclic or multicyclic (such as bicyclic) aromatic ring system (a ring system with fully delocalized pi-electron system) that contain(s) one or more heteroatoms (for example, 1, 2 or 3 heteroatoms), that is, an element other than carbon, including but not limited to, nitrogen, oxygen and sulfur. The number of atoms in the ring(s) of a heteroaryl group can vary. For example, the heteroaryl group can contain 4 to 14 atoms in the ring(s), 5 to 10 atoms in the ring(s) or 5 to 6 atoms in the ring(s), such as nine carbon atoms and one heteroatom; eight carbon atoms and two heteroatoms; seven carbon atoms and three heteroatoms; eight carbon atoms and one heteroatom; seven carbon atoms and two heteroatoms; six carbon atoms and three heteroatoms; five carbon atoms and four heteroatoms; five carbon atoms and one heteroatom; four carbon atoms and two heteroatoms; three carbon atoms and three heteroatoms; four carbon atoms and one heteroatom; three carbon atoms and two heteroatoms; or two carbon atoms and three heteroatoms. Furthermore, the term "heteroaryl" includes fused ring systems where two rings, such as at least one aryl ring and at least one heteroaryl ring or at least two heteroaryl rings, share at least one chemical bond. Examples of heteroaryl rings include, but are not limited to, furan, furazan, thiophene, benzothiophene, phthalazine, pyrrole, oxazole, benzoxazole, 1,2,3-oxadiazole, 1,2,4-oxadiazole, thiazole, 1,2,3-thiadiazole, 1,2,4-thiadiazole, benzothiazole, imidazole, benzimidazole, indole, indazole, pyrazole, benzopyrazole, isoxazole, benzoisoxazole, isothiazole, triazole, benzotriazole, thiadiazole, tetrazole, pyridine, pyridazine, pyrimidine, pyrazine, purine, pteridine, quinoline, isoquinoline, quinazoline, quinoxaline, cinnoline and triazine. A heteroaryl group may be substituted or unsubstituted.

As used herein, "heterocyclyl" or "heteroalicyclyl" refers to three-, four-, five-, six-, seven-, eight-, nine-, ten-, up to 18-membered monocyclic, bicyclic and tricyclic ring system wherein carbon atoms together with from 1 to 5 heteroatoms constitute said ring system. A heterocycle may optionally contain one or more unsaturated bonds situated in such a way, however, that a fully delocalized pi-electron system does not occur throughout all the rings. The heteroatom(s) is an element other than carbon including, but not limited to, oxygen, sulfur and nitrogen. A heterocycle may further contain one or more carbonyl or thiocarbonyl functionalities, so as to make the definition include oxo-systems and thio-systems such as lactams, lactones, cyclic imides, cyclic thioimides and cyclic carbamates. When composed of two or more rings, the rings may be joined together in a fused, bridged or spiro fashion. As used herein, the term "fused" refers to two rings which have two atoms and one bond in common. As used herein, the term "bridged heterocyclyl" or "bridged heteroalicyclyl" refers to compounds wherein the heterocyclyl or heteroalicyclyl contains a linkage of one or more atoms connecting non-adjacent atoms. As used herein, the term "spiro" refers to two rings which have one atom in common and the two rings are not linked by a bridge. Heterocyclyl and heteroalicyclyl groups can contain 3 to 30 atoms in the ring(s), 3 to 20 atoms in the ring(s), 3 to 10 atoms in the ring(s), 3 to 8 atoms in the ring(s) or 3 to 6 atoms in the ring(s). For example, five carbon atoms and one heteroatom; four carbon atoms and two heteroatoms; three carbon atoms and three heteroatoms; four carbon atoms and one heteroatom; three carbon atoms and two heteroatoms; two carbon atoms and three heteroatoms; one carbon atom and four heteroatoms; three carbon atoms and one heteroatom; or two carbon atoms and one heteroatom. Additionally, any nitrogens in a heteroalicyclic may be quaternized. Heterocyclyl or heteroalicyclic groups may be unsubstituted or substituted. Examples of such "heterocyclyl" or "heteroalicyclyl" groups include but are not limited to, 1,3- dioxin, 1,3-dioxane, 1,4-dioxane, 1,2-dioxolane, 1,3-dioxolane, 1,4-dioxolane, 1,3-oxathiane, 1,4-oxathiin, 1,3-oxathiolane, 1,3-dithiole, 1,3-dithiolane, 1,4-oxathiane, tetrahydro-1,4-thiazine, 2H-1,2-oxazine, maleimide, succinimide, barbituric acid, thiobarbituric acid, dioxopiperazine, hydantoin, dihydrouracil, trioxane, hexahydro-1,3,5-triazine, imidazoline, imidazolidine, isoxazoline, isoxazolidine, oxazoline, oxazolidine, oxazolidinone, thiazoline, thiazolidine, morpholine, oxirane, piperidine N-Oxide, piperidine, piperazine, pyrrolidine, azepane, pyrrolidone, pyrrolidione, 4-piperidone, pyrazoline, pyrazolidine, 2-oxopyrrolidine, tetrahydropyran, 4H-pyran, tetrahydrothiopyran, thiamorpholine, thiamorpholine sulfoxide, thiamorpholine sulfone and their benzo-fused analogs (e.g., benzimidazolidinone, tetrahydroquinoline and/or 3,4-methylenedioxyphenyl). Examples of spiro heterocyclyl groups include 2-azaspiro[3.3]heptane, 2-oxaspiro[3.3]heptane, 2-oxa-6-azaspiro[3.3]heptane, 2,6-diazaspiro[3.3]heptane, 2-oxaspiro[3.4]octane and 2-azaspiro[3.4]octane.

As used herein, "aralkyl" and "aryl(alkyl)" refer to an aryl group connected, as a substituent, via a lower alkylene group. The lower alkylene and aryl group of an aralkyl may be substituted or unsubstituted. Examples include but are not limited to benzyl, 2-phenylalkyl, 3-phenylalkyl and naphthylalkyl.

As used herein, "cycloalkyl(alkyl)" refer to an cycloalkyl group connected, as a substituent, via a lower alkylene group. The lower alkylene and cycloalkyl group of a cycloalkyl(alkyl) may be substituted or unsubstituted.

As used herein, "heteroaralkyl" and "heteroaryl(alkyl)" refer to a heteroaryl group connected, as a substituent, via a lower alkylene group. The lower alkylene and heteroaryl group of heteroaralkyl may be substituted or unsubstituted. Examples include but are not limited to 2-thienylalkyl, 3-thienylalkyl, furylalkyl, thienylalkyl, pyrrolylalkyl, pyridylalkyl, isoxazolylalkyl and imidazolylalkyl and their benzo-fused analogs.

A "heteroalicyclyl(alkyl)" and "heterocyclyl(alkyl)" refer to a heterocyclic or a heteroalicyclic group connected, as a substituent, via a lower alkylene group. The lower alkylene and heterocyclyl of a (heteroalicyclyl)alkyl may be substituted or unsubstituted. Examples include but are not limited tetrahydro-2H-pyran-4-yl(methyl), piperidin-4-yl(ethyl), piperidin-4-yl(propyl), tetrahydro-2H-thiopyran-4-yl (methyl) and 1,3-thiazinan-4-yl(methyl).

As used herein, the term "hydroxy" refers to a —OH group.

As used herein, "alkoxy" refers to the Formula —OR wherein R is an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl) is defined herein. A non-limiting list of alkoxys are methoxy, ethoxy, n-propoxy, 1-methylethoxy (isopropoxy), n-butoxy, iso-butoxy, sec-butoxy, tert-butoxy, phenoxy and benzoxy. An alkoxy may be substituted or unsubstituted.

As used herein, "acyl" refers to a hydrogen, alkyl, alkenyl, alkynyl, aryl, heteroaryl, heterocyclyl, aryl(alkyl), heteroaryl(alkyl) and heterocyclyl(alkyl) connected, as substituents, via a carbonyl group. Examples include formyl, acetyl, propanoyl, benzoyl and acryl. An acyl may be substituted or unsubstituted.

As used herein, a "cyano" group refers to a "—CN" group.

The term "halogen atom" or "halogen" as used herein, means any one of the radio-stable atoms of column 7 of the Periodic Table of the Elements, such as, fluorine, chlorine, bromine and iodine.

A "thiocarbonyl" group refers to a "—C(=S)R" group in which R can be the same as defined with respect to O-carboxy. A thiocarbonyl may be substituted or unsubstituted.

An "O-carbamyl" group refers to a "—OC(=O)N($R_A R_B$)" group in which $R_A$ and $R_B$ can be independently hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl). An O-carbamyl may be substituted or unsubstituted.

An "N-carbamyl" group refers to an "ROC(=O)N($R_A$)—" group in which R and $R_A$ can be independently hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl). An N-carbamyl may be substituted or unsubstituted.

An "O-thiocarbamyl" group refers to a "—OC(=S)—N($R_A R_B$)" group in which $R_A$ and $R_B$ can be independently hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl). An O-thiocarbamyl may be substituted or unsubstituted.

An "N-thiocarbamyl" group refers to an "ROC(=S)N($R_A$)—" group in which R and $R_A$ can be independently hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl). An N-thiocarbamyl may be substituted or unsubstituted.

A "C-amido" group refers to a "—C(=O)N($R_A R_B$)" group in which $R_A$ and $R_B$ can be independently hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl). A C-amido may be substituted or unsubstituted.

An "N-amido" group refers to a "RC(=O)N($R_A$)—" group in which R and $R_A$ can be independently hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl). An N-amido may be substituted or unsubstituted.

An "S-sulfonamido" group refers to a "—$SO_2$N($R_A R_B$)" group in which $R_A$ and $R_B$ can be independently hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl). An S-sulfonamido may be substituted or unsubstituted.

An "N-sulfonamido" group refers to a "R$SO_2$N($R_A$)—" group in which R and $R_A$ can be independently hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl). An N-sulfonamido may be substituted or unsubstituted.

An "O-carboxy" group refers to a "RC(=O)O—" group in which R can be hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl), as defined herein. An O-carboxy may be substituted or unsubstituted.

The terms "ester" and "C-carboxy" refer to a "—C(=O)OR" group in which R can be the same as defined with respect to O-carboxy. An ester and C-carboxy may be substituted or unsubstituted.

A "nitro" group refers to an "—$NO_2$" group.

A "sulfenyl" group refers to an "—SR" group in which R can be hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl). A sulfenyl may be substituted or unsubstituted.

A "sulfinyl" group refers to an "—S(=O)—R" group in which R can be the same as defined with respect to sulfenyl. A sulfinyl may be substituted or unsubstituted.

A "sulfonyl" group refers to an "SO₂R" group in which R can be the same as defined with respect to sulfenyl. A sulfonyl may be substituted or unsubstituted.

As used herein, "haloalkyl" refers to an alkyl group in which one or more of the hydrogen atoms are replaced by a halogen (e.g., mono-haloalkyl, di-haloalkyl, tri-haloalkyl and polyhaloalkyl). Such groups include but are not limited to, chloromethyl, fluoromethyl, difluoromethyl, trifluoromethyl, 1-chloro-2-fluoromethyl, 2-fluoroisobutyl and pentafluoroethyl. A haloalkyl may be substituted or unsubstituted.

As used herein, "haloalkoxy" refers to an alkoxy group in which one or more of the hydrogen atoms are replaced by a halogen (e.g., mono-haloalkoxy, di-haloalkoxy and tri-haloalkoxy). Such groups include but are not limited to, chloromethoxy, fluoromethoxy, difluoromethoxy, trifluoromethoxy, 1-chloro-2-fluoromethoxy and 2-fluoroisobutoxy. A haloalkoxy may be substituted or unsubstituted.

The terms "amino" and "unsubstituted amino" as used herein refer to a —NH₂ group.

A "mono-substituted amine" group refers to a "—NHR$_A$" group in which R$_A$ can be an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl), as defined herein. The R$_A$ may be substituted or unsubstituted. A mono-substituted amine group can include, for example, a mono-alkylamine group, a mono-$C_1$-$C_6$ alkylamine group, a mono-arylamine group, a mono-$C_6$-$C_{10}$ arylamine group and the like. Examples of mono-substituted amine groups include, but are not limited to, —NH(methyl), —NH(phenyl) and the like.

A "di-substituted amine" group refers to a "—NR$_A$R$_B$" group in which R$_A$ and R$_B$ can be independently an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl), as defined herein. R$_A$ and R$_B$ can independently be substituted or unsubstituted. A di-substituted amine group can include, for example, a di-alkylamine group, a di-$C_1$-$C_6$ alkylamine group, a di-arylamine group, a di-$C_6$-$C_{10}$ arylamine group and the like. Examples of di-substituted amine groups include, but are not limited to, —N(methyl)₂, —N(phenyl)(methyl), —N(ethyl) (methyl) and the like.

As used herein, "mono-substituted amine(alkyl)" group refers to a mono-substituted amine as provided herein connected, as a substituent, via a lower alkylene group. A mono-substituted amine(alkyl) may be substituted or unsubstituted. A mono-substituted amine(alkyl) group can include, for example, a mono-alkylamine(alkyl) group, a mono-$C_1$-$C_6$ alkylamine($C_1$-$C_6$ alkyl) group, a mono-arylamine(alkyl group), a mono-$C_6$-$C_{10}$ arylamine($C_1$-$C_6$ alkyl) group and the like. Examples of mono-substituted amine(alkyl) groups include, but are not limited to, —CH₂NH(methyl), —CH₂NH(phenyl), —CH₂CH₂NH(methyl), —CH₂CH₂NH(phenyl) and the like.

As used herein, "di-substituted amine(alkyl)" group refers to a di-substituted amine as provided herein connected, as a substituent, via a lower alkylene group. A di-substituted amine(alkyl) may be substituted or unsubstituted. A di-substituted amine(alkyl) group can include, for example, a dialkylamine(alkyl) group, a di-$C_1$-$C_6$ alkylamine($C_1$-$C_6$ alkyl) group, a di-arylamine(alkyl) group, a di-$C_6$-$C_{10}$ arylamine($C_1$-$C_6$ alkyl) group and the like. Examples of di-substituted amine(alkyl)groups include, but are not limited to, —CH₂N(methyl)₂, —CH₂N(phenyl)(methyl), —CH₂N(ethyl)(methyl), —CH₂CH₂N(methyl)₂, —CH₂CH₂N(phenyl)(methyl), —NCH₂CH₂(ethyl)(methyl) and the like.

As used herein, the term "diamino-" denotes an a "—N(R$_A$)R$_B$—N(R$_C$)(R$_D$)" group in which R$_A$, R$_C$, and R$_D$ can be independently a hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl), as defined herein, and wherein R$_B$ connects the two "N" groups and can be (independently of R$_A$, R$_C$, and R$_D$) a substituted or unsubstituted alkylene group. R$_A$, R$_B$, R$_C$, and R$_D$ can independently further be substituted or unsubstituted.

As used herein, the term "polyamino" denotes a "—(N(R$_A$)R$_B$—)$_n$—N(R$_C$)(R$_D$)". For illustration, the term polyamino can comprise —N(R$_A$)alkyl-N(R$_A$)alkyl-N(R$_A$)alkyl-N(R$_A$)alkyl-H. In some embodiments, the alkyl of the polyamino is as disclosed elsewhere herein. While this example has only 4 repeat units, the term "polyamino" may consist of 1, 2, 3, 4, 5, 6, 7, 8, 9, or 10 repeat units. R$_A$, R$_C$, and R$_D$ can be independently a hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl), as defined herein, and wherein R$_B$ connects the two "N" groups and can be (independently of R$_A$, R$_C$, and R$_D$) a substituted or unsubstituted $C_1$ to $C_6$ alkylene group. R$_A$, R$_C$, and R$_D$ can independently further be substituted or unsubstituted. As noted here, the polyamino comprises amine groups with intervening alkyl groups (where alkyl is as defined elsewhere herein). If no "n" is designated, the broadest range described in these definitions is to be assumed.

As used herein, the term "diether-" denotes an a "—OR$_B$O—R$_A$" group in which R$_A$ can be a hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl), as defined herein, and wherein R$_B$ connects the two "O" groups and can be a substituted or unsubstituted alkylene group. R$_A$ can independently further be substituted or unsubstituted.

As used herein, the term "polyether" denotes a repeating —(OR$_B$—)$_o$OR$_A$ group. For illustration, the term polyether can comprise —Oalkyl-Oalkyl-Oalkyl-Oalkyl-OR$_A$. In some embodiments, the alkyl of the polyether is as disclosed elsewhere herein. While this example has only 4 repeat units, the term "polyether" may consist of 1, 2, 3, 4, 5, 6, 7, 8, 9, or 10 repeat units. R$_A$ can be a hydrogen, an alkyl, an alkenyl, an alkynyl, a cycloalkyl, a cycloalkenyl, aryl, heteroaryl, heterocyclyl, cycloalkyl(alkyl), aryl(alkyl), heteroaryl(alkyl) or heterocyclyl(alkyl), as defined herein. R$_B$ can be a substituted or unsubstituted $C_1$ to $C_6$ alkylene group. R$_A$ can independently further be substituted or unsubstituted. As noted here, the polyether comprises ether groups with intervening alkyl groups (where alkyl is as defined elsewhere herein and can be optionally substituted). If no "o" is designated, the broadest range described in these definitions is to be assumed.

Where the number of substituents is not specified (e.g. haloalkyl), there may be one or more substituents present. For example, "haloalkyl" may include one or more of the same or different halogens. As another example, "$C_1$-$C_3$ alkoxyphenyl" may include one or more of the same or different alkoxy groups containing one, two or three atoms.

As used herein, a radical indicates species with a single, unpaired electron such that the species containing the radical can be covalently bonded to another species. Hence, in this context, a radical is not necessarily a free radical. Rather, a radical indicates a specific portion of a larger molecule. The term "radical" can be used interchangeably with the term "group."

Some embodiments disclosed herein pertain to a two-step process of 1) covalently modifying a gemstone surface and 2) thereafter attaching a host molecule to a guest moiety pendant from the modified gemstone. As disclosed elsewhere herein, the host molecule can be selected to provide unique and/or different physical and/or chemical properties on the surface. In some embodiments, the two-step process for chemically modifying the gemstone surface allows the natural chemistry of the gemstone material to be altered and, in using an attached host molecule, surface properties of the gemstone can be modified. In some embodiments, the functionalization of the gemstone with a host-guest unit provides an immediate impact in the field of diamond surface chemistry, which lacks straightforward approaches to providing grime resistance. In some embodiments, the approach is amenable to commercialization for a variety of industrial applications, for instance, in commercial cleaning or cleaning by individual users.

In some embodiments, the strategy in the design of this nanomolecular layer is that it remain undetectable once attached to the gemstone's surface. In some embodiments, for example, there is no visual indication to the naked eye and/or a jeweler's loupe (under a magnification of equal to or at least about 10×, 20×, 30×, etc.) that the gemstone has been modified. In some embodiments, for example, there is no visual indication to the naked eye and/or a jeweler's loupe (under a magnification of equal to or at least about 10×, 20×, 30×, etc.) that the gemstone has been modified.

As disclosed elsewhere herein, in some embodiments, the gemstone is diamond. In some embodiments, the anchor molecule is composed entirely or primarily of carbon. In some embodiments, once covalently bonded with an anchor, atomically, the chemical makeup of the original diamond is preserved. In some embodiments, using chemically similar anchors makes the detection of the surface anchor on the surface difficult advantageously maintaining the look of the diamond (or other gemstone). In some embodiments, the clarity and/or color of diamond is substantially unchanged after a molecular coating is applied. For example, in some embodiments, a diamond that has a color grade of D will remain a color grade of D after coating. In some embodiments, a diamond that has a clarity of $VVS_2$ will remain a clarity of $VVS_2$ after coating.

Figure 1A:
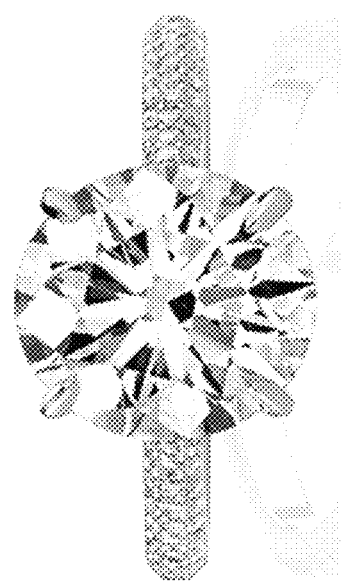
FIG. 1A is an illustration of a diamond affixed to a ring by a setting.
Figure 1D:
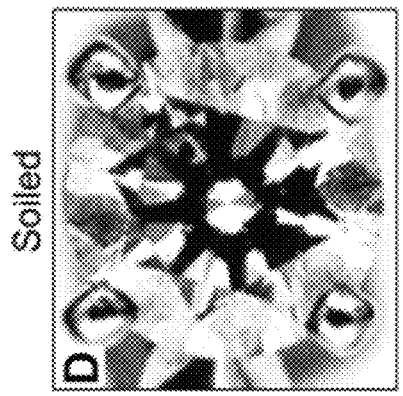
FIGS. 1C-1G are photographs and angular spectrum evaluation tool (ASET) images and SEM images of clean and soiled diamonds.
Figure 1F:
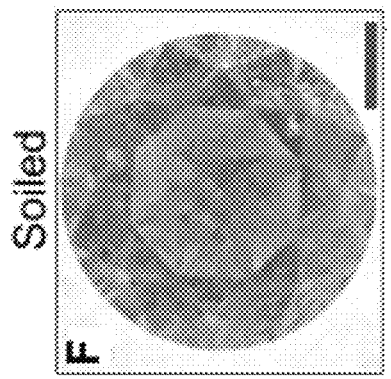
Figure 1C:
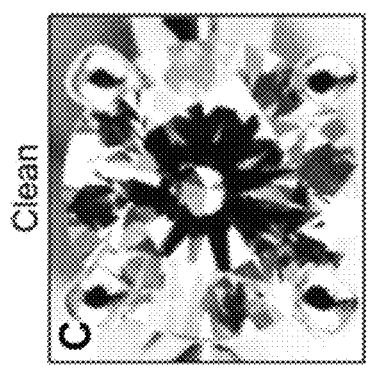
Figure 1E:
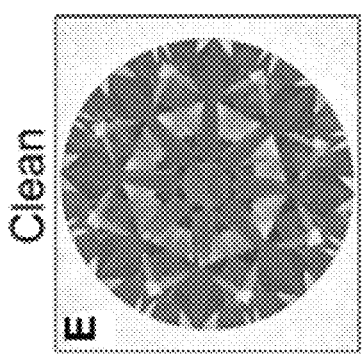
Figure 1G:
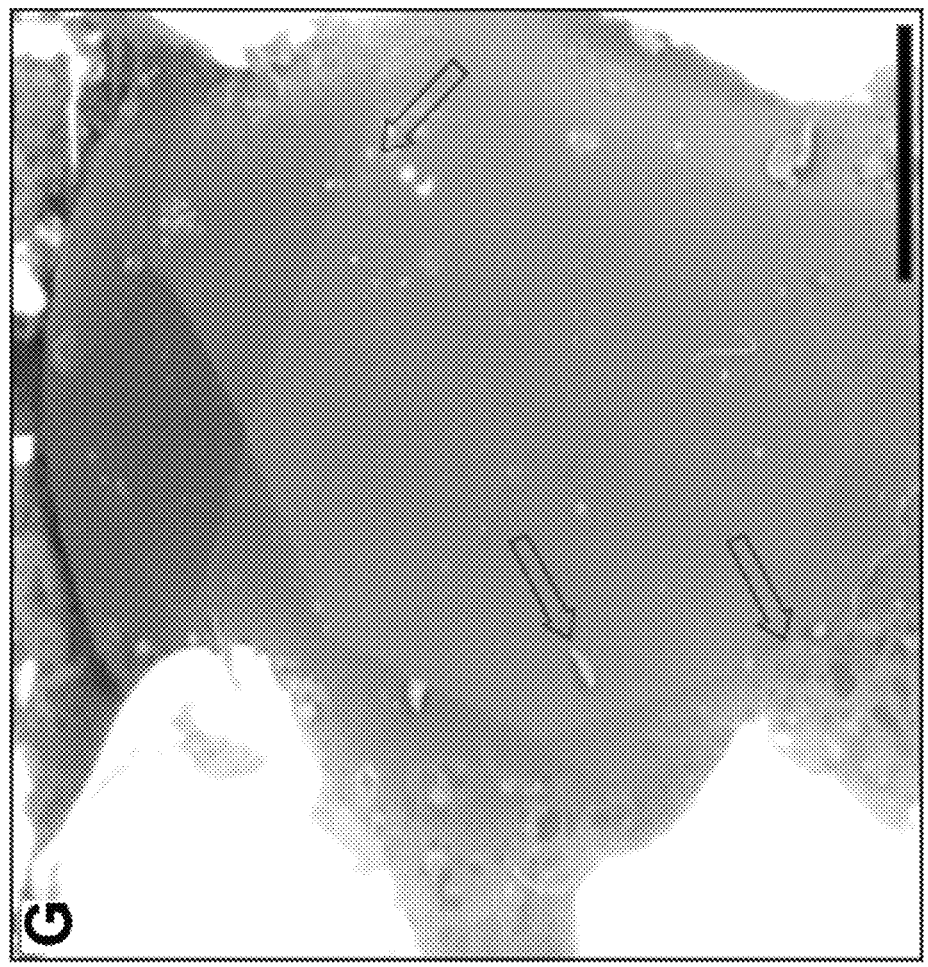

FIG. 1A shows a diamond attached to a piece of jewelry. A diamond is composed of a lattice of carbon atoms 100 as shown in FIG. 1B. As diamonds in jewelry are worn or stored, the hydrophobic carbon lattice 100 begins to attract grease and grime. Over time, grease and grime builds up and dulls the diamond's brilliance. This build-up is shown in FIGS. 1C-1G for diamonds. FIGS. 1C and 1E, respectively, show a photograph and an ASET image of a clean diamond. FIGS. 1D and 1F, respectively, show a photograph and an ASET images of a dirty diamond. As can be noted, FIGS. 1D and 1F have less shine and brilliance than the clean diamond of FIGS. 1C and 1E. FIG. 1G shows a representative SEM image of a fouled diamond that shows dirts and grime accumulated (see arrows). The scale bars indicate 2 mm and 200 μm. This dirt and grime build-up and/or fouling can significantly reduce the user's enjoyment of their jewelry.

This build-up happens at least in part due to the surface of a diamond being intrinsically hydrophobic. As a hydrophobic surface, it attracts hydrophobic residues, such as, smudges (from finger prints), oil, grease, and grime. Diamonds naturally attract grease (lipophilic), but repel water (hydrophobic). This is a reason why the fire and brilliance that attracts consumers to diamond jewelry is quickly lost after they leave the showroom. Upon the mere touch of a human finger, oils and lotions can be transferred to the clean crystal surface. Once the crystal is fouled by these chemicals, dirt, protein, or other debris can more easily bind nonspecifically to the crystal and thereby diminish its sparkling appeal. This buildup is evident by visual inspection as well as ASET analysis, and can be observed in SEM as shown in FIGS. 1C-1G.

Figure 1H:
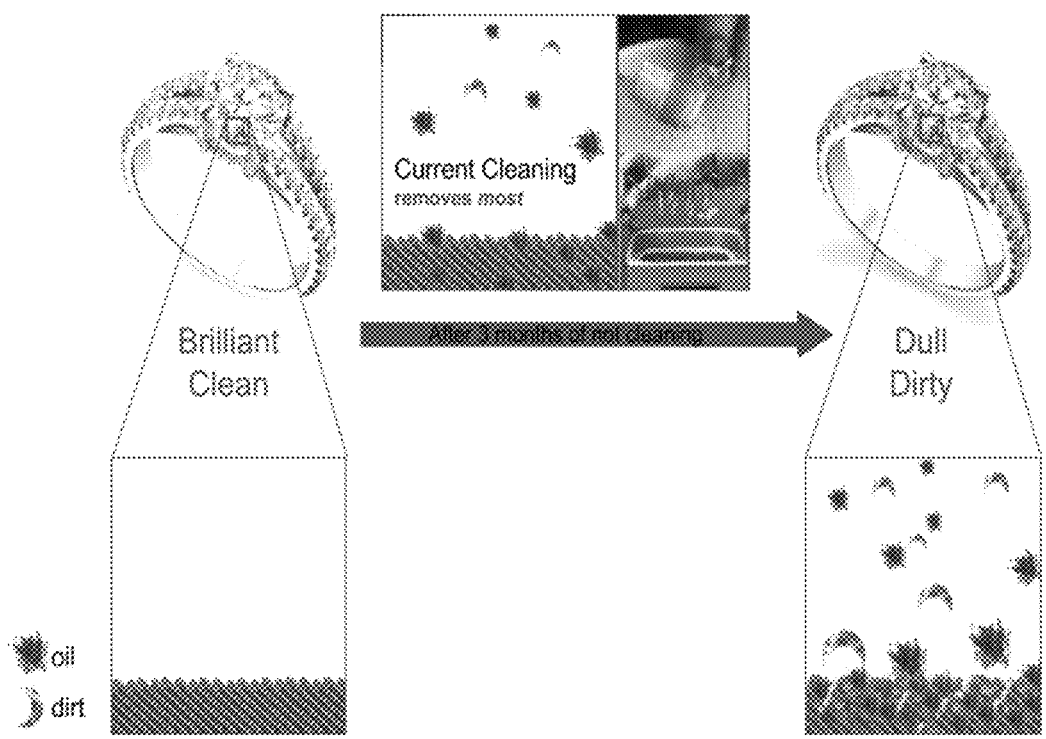
FIGS. 1H and 1I show the soiling of a conventionally cleaned diamond (FIG. 1H) versus the soiling of a diamond coated as disclosed in several embodiments herein (FIG. 1I). As shown in the comparison of the conventional cleaning methods (1H) and the disclosed coating approaches (1I), the coating approach as disclosed herein maintains the optical brilliance of a gemstone over time.

There are two conventional remedies to clean the grease and grime build up from the diamonds. The first is professional and/or commercial. A jeweler can clean soiled stones using an ultrasonic cleaner and/or a cleaning solution containing non-polar solvents. After cleaning, the brilliance and shine of the diamonds is restored (e.g., they are showroom-new). However, grease and grime will begin to accumulate as soon as the user leaves the showroom, because the diamond is hydrophobic. The second remedy consists of home cleaning products. Many home cleaners exist and work with varying degrees of success. Most will not clean the diamonds enough to restore the showroom-new brilliance of the stones. Furthermore, current solutions are merely restorative, meaning that any improvement in brilliance begins to fade immediately. FIG. 1H shows conventional cleaning of a diamond, which, within a few months of cleaning results in a soiled diamond surface.

Maintenance of the pristine optical properties of jewelry for everyday use is a major challenge. Cleaning requires repetitive, tedious labor with chemical solutions and special tools. Finished jewelry items are often physically complex with many differently sized stones and confined spaces between the stones and settings. Continuous maintenance can be done at home by chemical soaking (>2×/week), combined with an abrasive, mechanical action, such as a soft toothbrush, to remove remaining dirt, especially hard-to-reach places like the back of the diamond, which tends to collect the most contamination. Alternatively, ultrasonic cleaners are used professionally and are marketed to home users. While such cleaners can more effectively remove accumulated dirt and grime on diamonds, they are too physically disruptive and can dislodge stones from their settings. Repeated ultrasonic cleaning of mounted stones can chip the girdles of diamonds that are set next to each other, resulting in irreversible damage to the end product. Many end consumers lose interest in maintenance and tolerate chronically soiled jewelry simply because there are not practical viable alternatives. Both of the described current cleaning methods are either passive or post-treatment, they remove the offending material after it is present so that neither prevents the immediate recontamination of the piece.

Some embodiments disclosed herein solve these or other problems by providing gemstone coatings. In some embodiments, molecular nanotechnology is used. In some embodiments, the molecular technology changes the natural surface chemistry of a diamond and/or physical properties of the diamond surface. Diamonds (and/or some other gemstones) are largely chemically inactive, making it difficult to coat them to prevent soiling. Until now, techniques to attach a hydrophilic coating directly to a diamond surface have been ineffective. For instance, the diamond may resist interaction with the coating. In some embodiments, the surface chemistry of a diamond (or other gemstones) can be changed. For instance, a diamond is hydrophobic. In some embodiments, by molecularly functionalizing with an anchor and then a host molecule, a diamond with a hydrophilic coating can be prepared. In some embodiments, the hydrophilically-coated diamond is adapted to repel grease and grime. This modification results in a coated gemstone that repels dirt and oil for longer periods and prevents or slows the soiling of the diamond or gemstone surface (as shown in FIG. 1I).

Figure 1I:
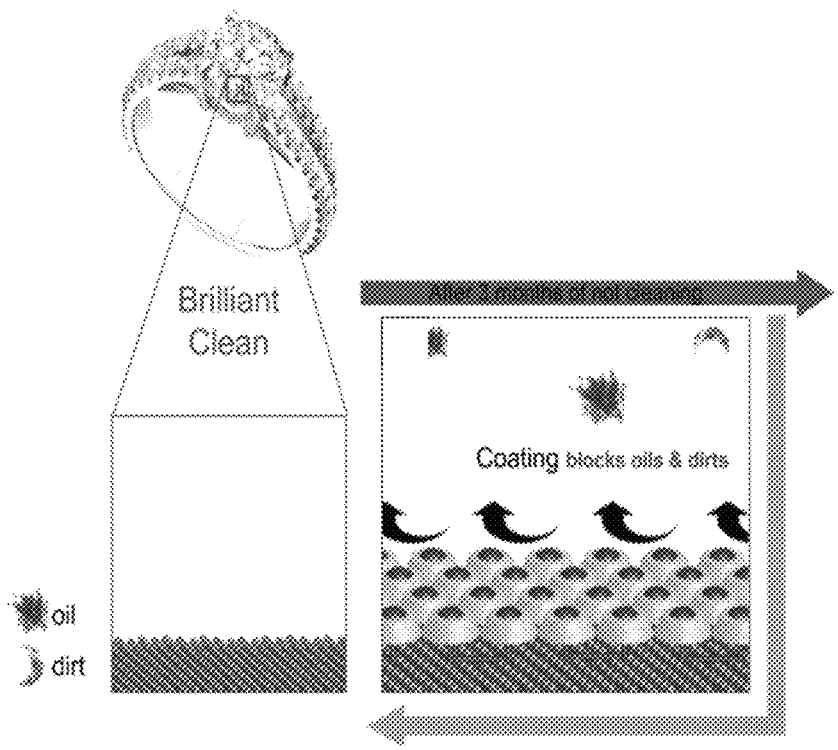

In some embodiments, the treated gemstones (e.g., molecularly coated diamonds) disclosed herein retain their brilliance, fire, luster, and scintillation for longer periods of time (e.g., for days, weeks longer, and months longer) than untreated gemstones (as shown in FIGS. 1H and 1I). Moreover, whereas the current mechanical or chemical cleaning methods do not completely remove all contaminants, the molecular layers as disclosed herein protect the gemstone surface from grease accumulation, granting optical quality. In some embodiments, the treated gemstones (e.g., diamonds) retain showroom quality shine under normal wearing conditions for a period of at least about: 1 week, 2 weeks, a month, 3 months, 6 months, or ranges including and/or spanning the aforementioned values. This surprising and unexpected improvement is significant considering that untreated diamonds begin to accumulate matter that dulls their appearance substantially immediately after cleaning.

Figure 2C:
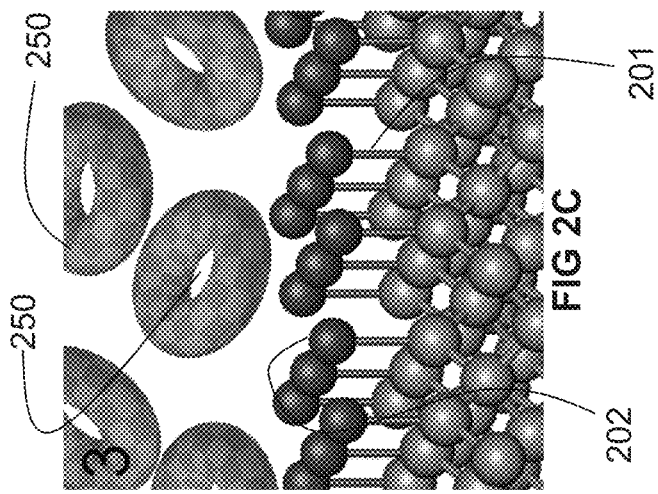
FIGS. 2A-2D depict a diamond surface (FIG. 2A), the functionalization of the diamond surface with an anchor molecule (FIG. 2B), the treatment of the anchor-functionalized diamond with a binding agent (e.g., a hydrophilic host) that binds to a portion of the anchor molecule (FIG. 2C), and the resultant treated diamond surface (FIG. 2D).
Figure 2B:
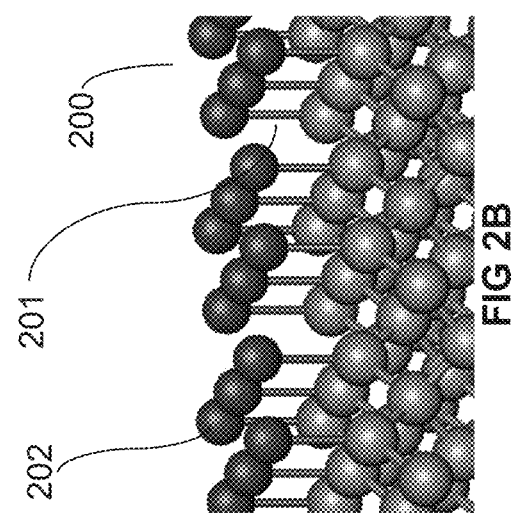
Figure 2A:
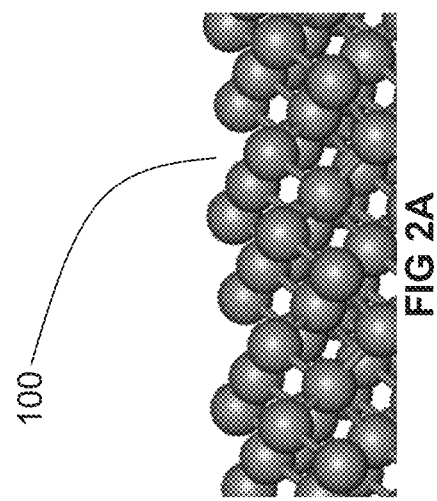
Figure 2D:
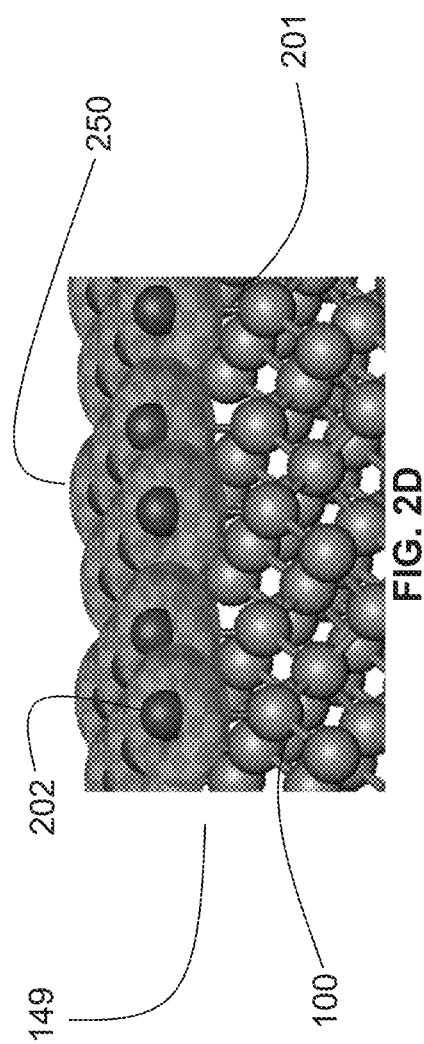

FIG. 2A-2D show a schematic overview of a method for providing a nanomolecular layer (e.g., a reversible lift-off layer comprising a host-guest unit) for diamond (as a non-limiting example of a gemstone surface that can be functionalized according to embodiments disclosed herein). In some embodiments, as shown in FIG. 2A, a diamond surface 100 is provided. In some embodiments, as shown in FIG. 2B, the diamond surface 100 is functionalized with an anchor molecule 200. In some embodiments, as shown in FIG. 2B, the anchor molecule can comprise an anchoring portion 201 that interacts with the diamond surface and a guest portion 202. For example, in some embodiments, the bare diamond surface is covalently functionalized by in-situ formation of a molecular carbene that reacts with diamond to provide an anchor unit with one or more pendant guest groups (e.g., adamantyl groups, etc.). In some embodiments, as shown in FIG. 2C, the functionalized diamond surface (or other gemstone) can be exposed to hydrophilic binding agents 250 (e.g., molecular host molecules). In some embodiments, for example, the functionalized surface creates a receptor (e.g., the pendant guest) for the subsequent attachment of β-cyclodextrin (e.g., a host). In some embodiments, as shown in FIG. 2D, the hydrophilic binding agent binds to the guest portion 202 of the anchor molecules through, for example, guest-host interactions (as shown). In some embodiments, the host molecule 250 comprises a cavity 251 (e.g., a pocket, aperture, void, etc.) that receives the guest portion 202 of the anchor molecule 200. In some embodiments, covalent bonding, ionic bonding, or chemisorption occurs to bind the host to the guest. In some embodiments, as shown in FIG. 2D, a coated diamond 149 results. In some embodiments, as shown in FIG. 2D, the diamond is thus functionalized by a thin, monolayer (e.g., nanomolecular layer) attached to the diamond substrate, modifying the interfacial properties of the diamond surface. In some embodiments, the anchor coating is one molecule thick. In some embodiments, the host fits over the guest portion of the anchor molecule and the nanomolecular layer is one molecule thick (e.g., the thickness of the anchor-guest molecule).

While β-cyclodextrin is used here as an illustration of a hydrophilic host molecule other hosts can be used. Similarly, the β-cyclodextrin can be optionally substituted to provide tailored properties. In some embodiments, the β-cyclodextrin host is optionally substituted (e.g., through a hydroxyl of the β-cyclodextrin or through displacement of a hydroxyl of the β-cyclodextrin) with one or more group(s) individually and independently selected from $C_1$ to $C_6$ alkyl, $C_1$ to $C_6$ alkenyl, $C_1$ to $C_6$ alkynyl, alkoxy, halogen, haloalkyl, haloalkoxy, a mono-substituted amine(alkyl), a di-substituted amine(alkyl), a diamino-group, a polyamino, a diether-group, and a polyether-.

In some embodiments, the size of the cyclodextrin ring can be adjusted to increase or decrease specificity to a particular chemical target. α (alpha)-cyclodextrin is a 6-membered sugar ring molecule having an internal diameter of 0.56 nm, β (beta)-cyclodextrin is a 7-membered sugar ring molecule having an internal diameter of 0.7 nm, and γ (gamma)-cyclodextrin is an 8-membered sugar ring molecule having an internal diameter of 0.88 nm and all three are recognized as safe by the US Food and Drug administration. In some embodiments, the guest portion can be tuned to be a better match to accommodate the alpha, beta, or gamma species. In some embodiments, any number of sugar molecules could be used to give the desired hydrophobic cavity size. In some embodiments, the adamantane cage matches the cavity diameter of the β (beta)-cyclodextrin and forms a highly stable inclusion complex. In some embodiments, smaller anchor molecules can be used with α (alpha)-cyclodextrin or larger ones with γ (gamma)-cyclodextrin.

In some embodiments, not every surface site (e.g., guest) is functionalized with a host molecule. In some embodiments, a dirt and grime resistant surface is obtained at a guest to host ratio of at least about: 1:1, 2:1, 4:1, 10:1, or ranges including and/or spanning the aforementioned values. In some embodiments, not every anchor molecule comprises a guest. Thus, non-guest containing anchor molecules can be used to space guest moieties a desired distance from each other. In some embodiments, a dirt and grime resistant surface is obtained at an anchor (comprising or not comprising a guest) to host ratio of at least about: 1:1, 2:1, 4:1, 10:1, or ranges including and/or spanning the aforementioned values. In some embodiments, two guest molecules on the surface of the diamond by a distance of equal to or at least about: 0.5 nm, 1 nm, 1.6 nm, 2 nm, 3 nm, 5 nm, 10 nm, or ranges including and/or spanning the aforementioned values.

In some embodiments, more than one type of host molecule can be used to functionalize a single surface to give rise to a range of surface properties. For example, a mixture of a unsubstituted β-cyclodextrin and a substituted a β-cyclodextrin is used, in some embodiments. In some embodiments, the guest portion will comprise single or multiple types of guest sites to accommodate multiple host molecules (not shown). In some embodiments, by varying one or more of the binding agent or agents (e.g., the host or hosts) or the guest molecule, a surface that is hydrophobic, hydrophilic, and/or amphiphilic can be obtained. In some embodiments, the contact angle for water on the coated gemstone is less than or equal to about: 0°, 1°, 2.5°, 5°, 10°, 20°, or ranges including and/or spanning the aforementioned values. In some embodiments, the contact angle for water on the coated gemstone is 50%, 75%, 90%, 95%, 99% less than the contact angle for water on the gemstone before coating (or ranges including and/or spanning the aforementioned values). In some embodiments, the contact angle for water on the coated gemstone is changed relative to the contact angle for water on the un-coated gemstone by equal to or at least about: 20°, 40°, 50°, 60°, or ranges including and/or spanning the aforementioned values.

In some embodiments, as shown in FIGS. 3A-3D, diamonds can be functionalized before setting in a piece of jewelry. In other embodiments, the diamond can be functionalized after being set in a piece of jewelry (e.g., a ring or pendant). In some embodiments, the gemstone has a surface that reacts with the anchor but the setting does not. In some embodiments, the setting is not damaged or changed by the coating process.

As shown in FIGS. 3A and B, a cut diamond 300 can be coated with anchor molecules by placing them in a bath of reactive untethered anchor molecules 204. In some embodiments, the anchor molecules 200 are bound to the atoms on the surface of the diamond 100. In some embodiments, the anchor molecules covalent bond to the diamond surface. In some embodiments, the anchor molecules 200 are hydrophobic. In some embodiments, as shown in FIG. 3C, the anchor-functionalized diamonds 350 are then treated with a host molecule 250. In some embodiments, the host molecule binds to a guest portion of the anchor molecule (not shown in FIG. 3C) and binds to the diamond via the anchor molecule. In some embodiments, the host molecule is hydrophilic. In some embodiments, the host molecule confers a desired physical property upon the diamond surface (e.g., a different hydrophilicity, amphiphilicity, hydrophobicity than of the bare gemstone, etc.). In some embodiments, the host molecule has been chemically modified to meet an external specification, such as, but not limited to, modified optical properties (i.e. reversible coloration, UV-blocking, or enhanced luster). In some embodiments, once the host molecules are bonded, the surface chemistry of the diamond is changed. In some embodiments, as shown in FIG. 3D, the color and overall appearance of the coated diamond 380 can be identical or substantially identical to the untreated diamond 300 (as shown in FIG. 3A).

In some embodiments, the anchor-functionalized diamond can be represented by Formula I:

Formula I where G represents a gemstone, A is an anchor moiety, X is a guest functionality covalently bound to A, and m is an integer between 1 and 5 (e.g., 1, 2, 3, 4, or 5). FIGS. 2B-2D show an embodiment where m is 1 and a single X guest functionality is bound to a single anchor moiety (e.g., covalently, etc.). FIG. 5E shows an embodiment where m is 2 and two X guest functionalities are bound to a single anchor moiety.

As disclosed elsewhere herein, in some embodiments, multiple different types of hosts may be employed on a single anchor moiety as shown in Formula I' below:

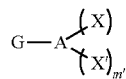

Formula I' where G is a gemstone, A is an anchor moiety, X is a first guest functionality covalently bound to A, X' is a second guest functionality covalently bound to A, where X' is different from X, m is an integer between 1 and 5, and m' is an integer between 1 and 5 (e.g., 1, 2, 3, 4, or 5). In some embodiments, m' is 0 (e.g., where the coated diamond comprises Formula I).

In some embodiments, G can be selected from the group consisting of alexandrite, amethyst, aquamarine, citrine, diamond, emerald, garnet, jade, lapis lazuli, moonstone, morganite, onyx, opal, paraiba, pearls, peridot, rubellite, ruby, sapphire, spinel, tanzanite, topaz, tourmaline, turquoise, and zircon.

In some embodiments, the anchor moiety A comprises an optionally substituted aryl or (bis)aryl group. In some embodiments, the anchor moiety A may further be represented by one or more of the following Formulae:

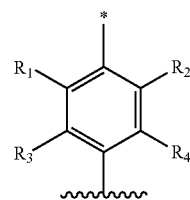

Formula AI

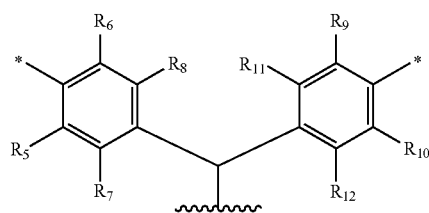

Formula AII where * indicates a bond to X, ⌇ indicates a bond to G, and each of $R_1$ to $R_{12}$ is independently selected from —H, $C_1$ to $C_6$ alkyl optionally substituted with halogen or hydroxy, $C_1$ to $C_6$ alkenyl optionally substituted with halogen or hydroxy, $C_1$ to $C_6$ alkynyl optionally substituted with halogen or hydroxy, $C_1$ to $C_6$ alkoxy, hydroxyl, halogen, $C_1$ to $C_6$ haloalkyl, $C_1$ to $C_6$ haloalkoxy, a mono-substituted amine($C_1$ to $C_6$ alkyl), a di-substituted amine($C_1$ to $C_6$ alkyl), a diamino-group, a polyamino, a diether-group, and a polyether-. While "*" is shown in the para position relative to the connection to "J" above, in some embodiments, "*" may be in the meta or ortho positions.

In some embodiments, as disclosed elsewhere herein, more than one guest molecule can be pendant from the anchor as shown in Formulae AIII and AIV:

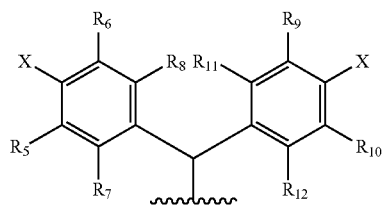

Formula AIII

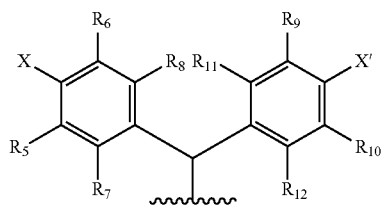

Formula AIV where each of $R_5$ to $R_{12}$ is independently selected from —H, $C_1$ to $C_6$ alkyl optionally substituted with halogen or hydroxy, $C_1$ to $C_6$ alkenyl optionally substituted with halogen or hydroxy, $C_1$ to $C_6$ alkynyl optionally substituted with halogen or hydroxy, $C_1$ to $C_6$ alkoxy, hydroxyl, halogen, $C_1$ to $C_6$ haloalkyl, $C_1$ to $C_6$ haloalkoxy, a mono-substituted amine($C_1$ to $C_6$ alkyl), a di-substituted amine($C_1$ to $C_6$ alkyl), a diamino-group, a polyamino, a diether-group, and a polyether-.

In some embodiments, X or X' are independently selected from one or more of the following groups: adamantyl, iodo- (—I), nitro- (—NO₂), napthyl, anthracenyl, perfluorooctanoic acid, pyronine Y, pyronine B, carboranyl, ferrocenyl, azobenzene, and tricyclooctyl. In some embodiments, the guest portion is selected based on its size and ability to reside within a cyclodextrin cavity. In some embodiments, X or X' are independently selected from one or more of optionally substituted: alkyl, alkenyl, aryl. In principle, a molecule that can fit in the hydrophobic cavities of cyclodextrin or related supramolecular host/guest compounds can be employed as an anchor (and/or guest portion of an anchor). In some embodiments, X or X' may be selected represented structurally by one or more of the following:

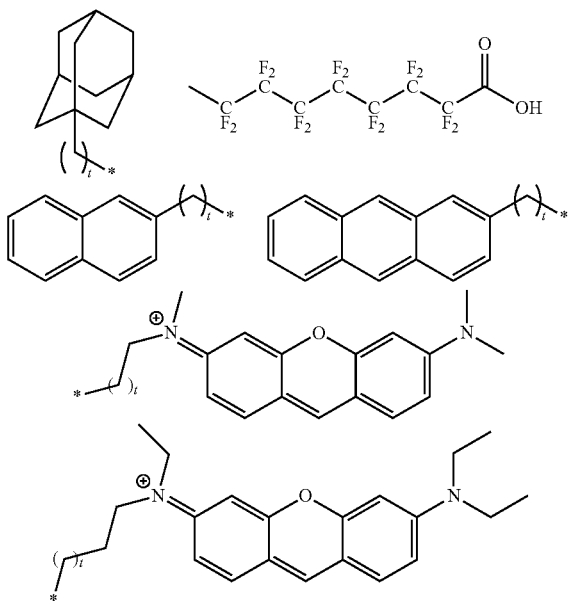

where * represents a bond to A and t is an integer from 0 to 5 (e.g., 0, 1, 2, 3, 4, 5, or ranges including and/or spanning the aforementioned values). In some embodiments, X' is H. In some embodiments, X or X' may be selected from any chemical species that is smaller or has some part smaller than the hydrophobic cavity of the cyclodextrin.

In some embodiments, the adamantyl, perfluorooctanoic acid, pyronine Y, pyronine B, may be independently optionally substituted. For example, each C—H or C—F bond located on the X group may be replaced with an optional substitution. In some embodiments, each of the adamantyl, perfluorooctanoic acid, pyronine Y, pyronine B, may be optionally substituted with one or more groups independently selected from —H, $C_1$ to $C_6$ alkyl optionally substituted with halogen or hydroxy, $C_1$ to $C_6$ alkenyl optionally substituted with halogen or hydroxy, $C_1$ to $C_6$ alkynyl optionally substituted with halogen or hydroxy, $C_1$ to $C_6$ alkoxy, hydroxyl, halogen, $C_1$ to $C_6$ haloalkyl, $C_1$ to $C_6$ haloalkoxy, a mono-substituted amine($C_1$ to $C_6$ alkyl), a di-substituted amine($C_1$ to $C_6$ alkyl), a diamino-group, a polyamino, a diether-group, and a polyether-.

In some embodiments, X is the following:

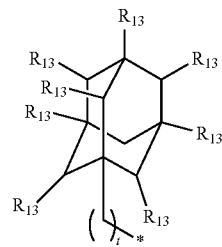

where each instance of $R_{13}$ is independently selected from —H, $C_1$ to $C_6$ alkyl optionally substituted with halogen or hydroxy, $C_1$ to $C_6$ alkenyl optionally substituted with halogen or hydroxy, $C_1$ to $C_6$ alkynyl optionally substituted with halogen or hydroxy, $C_1$ to $C_6$ alkoxy, hydroxyl, halogen, $C_1$ to $C_6$ haloalkyl, $C_1$ to $C_6$ haloalkoxy, a mono-substituted amine($C_1$ to $C_6$ alkyl), a di-substituted amine($C_1$ to $C_6$ alkyl), a diamino-group, a polyamino, a diether-group, and a polyether-.

In some embodiments, the anchor/guest motif is represented by one or more of the following structures:

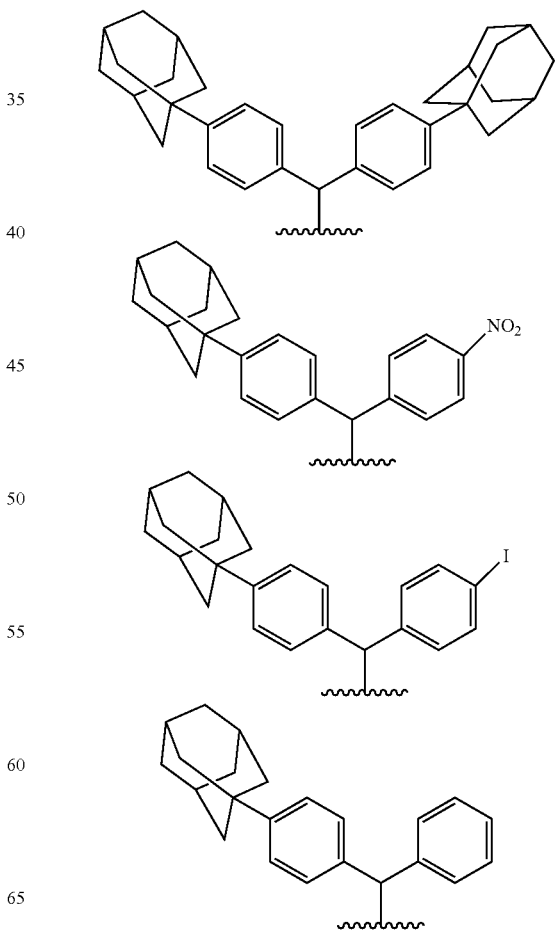

-continued

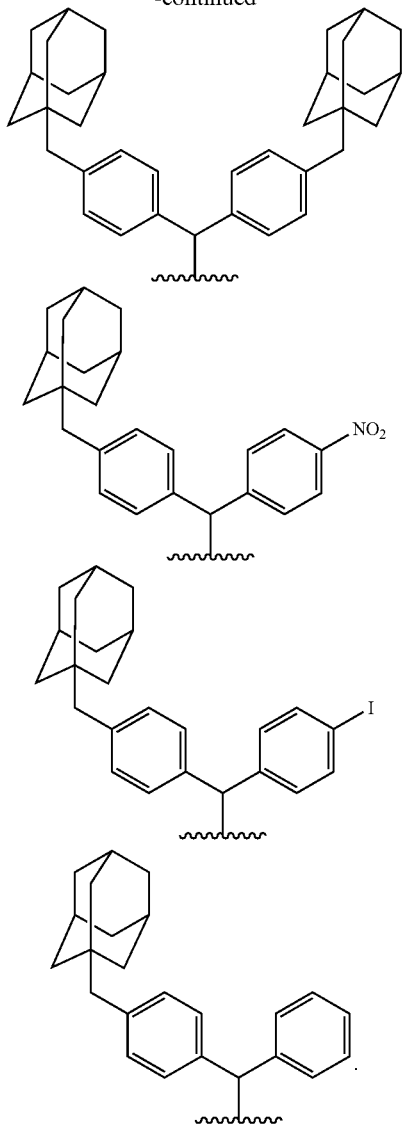

In some embodiments, where anchor spacer units are used, the anchor motif may be represented by one or more of the following:

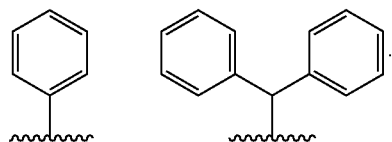 [SMILES: *c1ccccc1 ; *C(c1ccccc1)c1ccccc1]

In some embodiments, as disclosed elsewhere herein, the coated gemstone further comprises a host molecule. In some embodiments, the coated gemstone with a bound host molecule is represented by the Formula II:

$$G-A-(X)_{\overline{m}}(-Y)_q \qquad \text{Formula II}$$

where the host is represented by Y and q is an integer between 1 and 5. In some embodiments, q is the same as m. In some embodiments, q is an integer that is smaller than m.

In some embodiments, the "Y" can comprise a cyclodextrin. In some embodiments, "Y" can be optionally substituted. In some embodiments, "Y" can be represented by a cyclodextrin (e.g., α-cyclodextrin, β-cyclodextrin, γ-cyclodextrin, etc.) comprising the following structure:

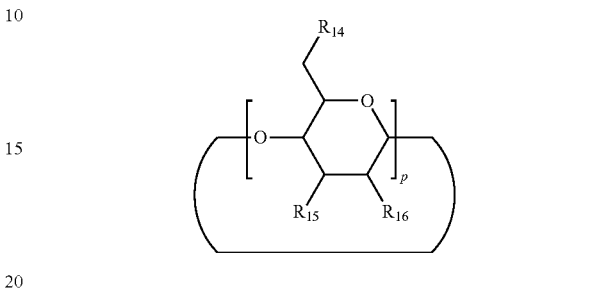

where "p" is an integer from 1 to 8, "(_)" represents optionally substituted glucopyranoside units of the cyclodextrin that are not shown, and each of $R_{14}$ to $R_{16}$ is independently selected from —H, $C_1$ to $C_6$ alkyl optionally substituted with halogen or hydroxy, $C_1$ to $C_6$ alkenyl optionally substituted with halogen or hydroxy, $C_1$ to $C_6$ alkynyl optionally substituted with halogen or hydroxy, $C_1$ to $C_6$ alkoxy, hydroxyl, halogen, $C_1$ to $C_6$ haloalkyl, $C_1$ to $C_6$ haloalkoxy, a mono-substituted amine($C_1$ to $C_6$ alkyl), a di-substituted amine($C_1$ to $C_6$ alkyl), a diamino-group, a polyamino, a diether-group, and a polyether-.

FIG. 4A-4C show a possible anchor guest motif unbound to a gemstone (FIG. 4A), the interaction between the guest of FIG. 4A and a host (FIG. 4B), and the interaction between a host and guest in a space-filling structural depiction (FIG. 4C). In some embodiments, prior to reaction with the gemstone, the anchor and guest molecule 200 comprise a 4-(1-adamantyl)aniline, as shown in FIG. 4A.

In some embodiments, the precursor anchor/guest motif mixed with the gemstone to provide the anchor-functionalized gemstone is a carbene. In some embodiments, the carbene has one or more of the following formula:

$$:A-(X)_m \qquad \text{Formula AV}$$

Formula AVI

In some embodiments, the carbene (e.g., as prepared from, for example, a coinciding diazo-compound) comprises 4-(1-adamantyl)phenyl carbene or 1,1'-((methylene-carbene)bis(4,1-phenylene))bis(methladamantane):

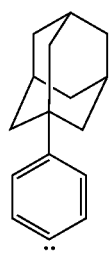

-continued

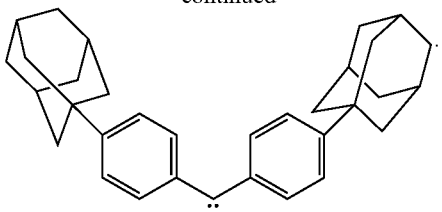

In some embodiments, other compounds that present an adamantyl group (the pendant guest group) or a similarly shaped guest can be used. In some embodiments the guest molecule 200 is commercially available anchor molecule 400.

In some embodiments, the untethered anchor molecules are bound to the diamond by heating them together to a temperature of at least about 127° C. In some embodiments, the untethered anchor molecules are bound to the diamond by heating them together to a temperature of at least about: 80° C., 110° C., 125° C., 150° C., 180° C., values between the aforementioned values, ranges including and/or spanning those values, or otherwise. In some embodiments, heating liberates a nitrogen from a diazo group to provide the carbene which then reacts with the gemstone surface (e.g., a diamond surface).

In some embodiments, as shown in FIG. 2B, the anchor molecule comprises a single anchor site 201, or multiple anchor sites (not shown). In some embodiments, the anchor molecule comprises a single guest site 202, as shown in FIG. 2B, or multiple guest sites (shown in FIG. 5A). In some embodiments, the anchor site is an amine group 401 (as shown in FIG. 4A). In some embodiments the guest site is an adamantane-based group 402, bonded at the 4 positions of a phenyl group 403, respectively. In some embodiments, the anchor molecule will be a single-branched commercially available anchor molecule (e.g., 4-(adamantan-1-yl)aniline, a similar guest, or the like). In some embodiments, the adamantane guest site 402 reversibly binds to a host molecule 450 via a pocket 451 of the host molecule 450, as shown in FIG. 4B. In some embodiments, the host molecule is cyclodextrin. In some embodiments, the host molecule is β-cyclodextrin 450, as shown. In some embodiments, as shown in FIG. 4C, the guest site 402 forms intermolecular interactions with the host molecule to form a guest-host interaction, as shown in skeletal structure form in FIG. 4B. In some embodiments, as disclosed elsewhere herein, prior to binding to the anchor molecules, β-cyclodextrin can be further functionalized to adjust the surface chemistry of the diamond, specifically to make it more or less hydrophilic. In some embodiments, modification or partial modification of exposed hydroxyl groups on the guest molecule 250, 450 enables customization of surface properties before and/or after reversible binding of surface molecules (e.g., the guest molecules). For instance, using cyclodextrin as an example, one or more of the following groups can be covalently linked to a surface hydroxyl of the cyclodextrin: $C_{1-6}$ alkyl, polyethers (e.g., triethylene glycol, oligoethylene glycol, polyethylene glycol), etc.

In some embodiments, the anchor/guest unit is functionalized to the gemstone using a Grignard reagent via a Grignard reaction. In some embodiments, the Grignard reagent is a organometallic magnesium halide bonded to the anchor/guest unit. In some embodiments, upon mixing with the gemstone, the Grignard reagent couples the anchor/guest unit to the gemstone surface. In some embodiments, a Grignard reagent represented by one or more of the following formulae is used to prepare the anchor/guest coated gemstone: $Mg(A(X)_m)Cl$, $Mg(A(X)_m(X')_{m'})Cl$, $Mg(A(X)_m)Br$, $Mg(A(X)_m(X')_{m'})Br$, $Mg(A(X)_m)I$, $Mg(A(X)_m(X')_{m'})I$, where A, X, X', m, and m' are as disclosed elsewhere herein.

In some embodiments, pendant adamantane groups at the termini of anchor molecules 200 act as receptors for β-cyclodextrin 450. In some embodiments, functionalized diamond is treated with β-cyclodextrin to form a β-cyclodextrin/anchor complex (or couple) that exposes the cyclodextrin functionality at the diamond surface.

In some embodiments, as shown in FIG. 5A, the anchor molecule 500 has a multiple-branched structure, comprising more than one guest portion 502 and a single anchor portion 501. In some embodiments, as shown in FIG. 5A, the anchor molecule is a dual-branched structure 500 of adamantane guest sites 502, each bonded to the 4 position of a phenyl group 505, the two phenyl groups co-terminating in a single attachment point 501 that acts as the anchor portion of the anchor molecule. FIG. 5B shows an expanded view of a cyclodextrin.

FIG. 5C shows a schematic for the direct functionalization of diamond (or other gemstone). In some embodiments, as disclosed elsewhere herein, a carbene is produced in solution from a diazo-compound. In some embodiments, the carbene (or carbene precursor that generates the carbene) is mixed with a gemstone in solution to functionalize the gemstone. In some embodiments, the carbene solution (and/or the or carbene precursor solution) is applied to the gemstone or the gemstone is submerged (or partially submerged) in the solution. In some embodiments, as disclosed elsewhere herein, the carbene solution (and/or the or carbene precursor solution) is heated with the gemstone to functionalize the gemstone with the anchor/guest molecule. In some embodiments, a precursor with diazo group is heated gently to drive off the nitrogen groups as nitrogen ($N_2$), leaving a reactive carbene intermediate. This carbene group rapidly binds to the diamond surface, for example, forming the anchor layer for our reversible lift-off resist layer (left panel of FIG. 5C). In some embodiments, the target molecule includes two pendant adamantyl groups that serve as guest for β-cyclodextrin (shown in the middle panel of FIG. 5C) in solution. The end result is a thin film of covalent receptors for β-cyclodextrin grafted to the diamond surface (right panel of FIG. 5C).

Figure 5D:
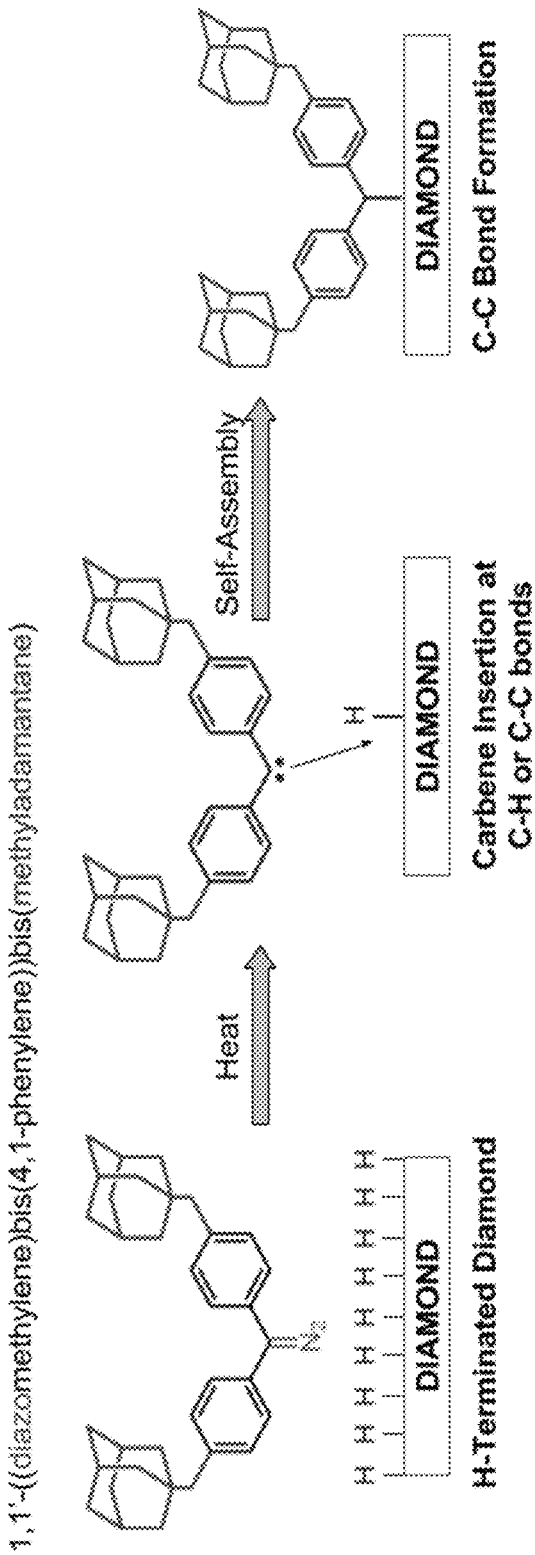
FIGS. 5D-5E depict a scheme showing an anchor molecule functionalized to a diamond (FIG. 5E) and a depiction of the motif of FIG. 5D with a host moiety (left panel) interacting with a host molecule (middle panel) to provide bound host-guest functionalized gemstone (right panel) (FIG. 5E).
Figure 5E:
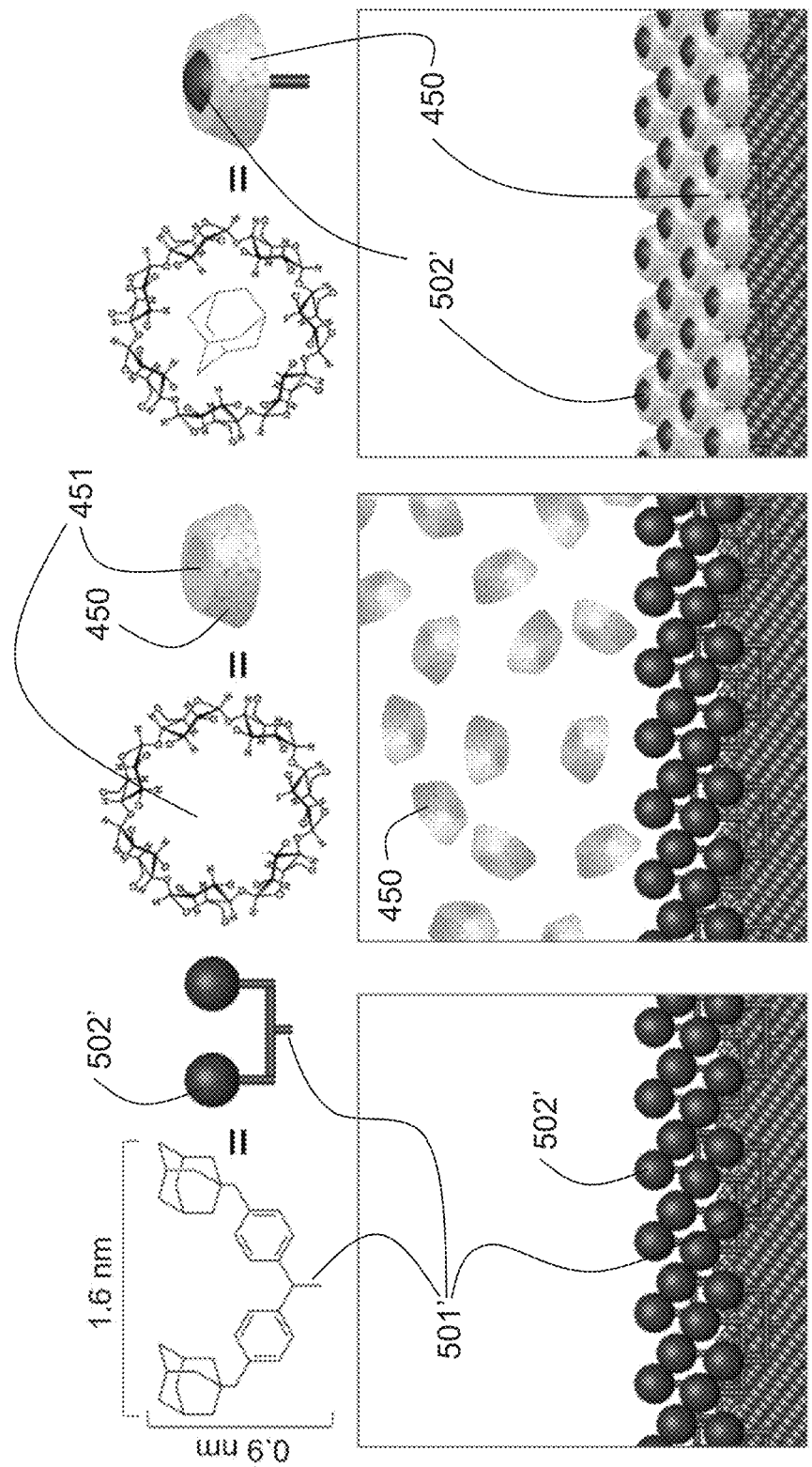

FIG. 5D shows a schematic for the direct functionalization of diamond (or other gemstone) using 1,1'((diazomethylene)bis(4,1-phenylene))bismethyladamantane). As shown, this diaryldiazo compound contains two main components: methyladamantane (receptor part) and carbene precursor (diaryldiazo unit, anchor part). A bare diamond surface is covalently functionalized by in-situ formation of a molecular carbene with pendant adamantyl groups. FIG. 5E shows a schematic using space filling depictions of a β-cyclodextrin and the anchor/guest motif of FIG. 5D. In some embodiments, as shown in FIG. 5E, the reversible lift-off layer for a diamond is prepared from a bare diamond surface (not shown) that is covalently functionalized by in-situ formation of a molecular carbene with pendant adamantyl groups (FIG. 5E, left panel). This creates a receptor for the subsequent attachment of β-cyclodextrin (β-CD) (FIG. 5E, middle panel). The diamond is thus functionalized by a thin, monolayer resist attached to the diamond substrate, modifying the interfacial properties of the diamond surface (FIG. 5E, right panel).

In some embodiments, as shown in FIGS. 6A-6B and as disclosed elsewhere herein, the functionalization of the anchor molecule to the gemstone involves the use of a precursor 604, having variable guest groups 607, 607' at the 4-position of each phenyl group, in this case represented by X and X'. In some embodiments, variable groups are not used and identical X groups are used. In some embodiments, the X groups, as shown in FIGS. 5D and 6C, are both adamantyl, making the guest portion of the precursor anchor molecule 604 bis(4-adamantylphenyl). In some embodiments, the anchor portion 606 of the precursor anchor molecule is a diazo group bonded to form diazomethane (e.g., 1,1'-((diazomethylene)bis(4,1-phenylene))bis(adamantane)). In some embodiments, the precursor molecule is bis(4-adamantylphenyl) diazomethane.

In some embodiments, as shown in FIG. 6B and as disclosed elsewhere herein, the precursor anchor molecule 604' is reacted in solution at an elevated temperature (e.g., at or around 130° C.), to begin the process of binding the anchor portion to a diamond surface. In some embodiments, the reaction proceeds by removing the diazo group 606 from the diazomethane, producing an activated anionic methyl group 606'. In some embodiments, this activated methyl group is reacted with a diamond surface, as shown in FIG. 6D, to form a bound anchor molecule (e.g., 1,1'-bis(4,1-phenylene))bis(adamantane)). In some embodiments, this forms a bis(4-adamantylphenyl) anchor molecule 610 bound to the diamond surface.

As disclosed elsewhere herein, a two-step process for the preparation of a reversible lift-off-layer on diamond substrates can be used shown schematically in FIG. 5C. In some embodiments, the first step is to covalently bond a custom-designed "anchor" molecule (e.g., (1,1'-((diazomethylene) bis(4,1-phenylene))bis(adamantane)), etc. (FIG. 6A)) to the diamond's surface (FIG. 6D). In some embodiments, chemical vapor deposition (CVD) diamond substrates are used as substrates (e.g., as a model for diamond, other gem surfaces, or non-gem surfaces) for functionalization. In some embodiments, as disclosed elsewhere herein, the anchor molecule comprises an adamantyl group (or some other guest molecule). In some embodiments, the hydrophobic compound is applied to a diamond surface (or other test surface) and then heated gently in excess of 100° C. Without being bound to a particular mechanistic theory, in some embodiments, a chemical reaction eliminates the diazo group as nitrogen gas, forming a carbene. In some embodiments, the carbene then reacts with the hydrogen terminated diamond surface. In some embodiments, the chemical reaction can be performed in a vacuum oven at a modest temperature.

In some embodiments, once covalently linked to the surface, pendant adamantyl cages are affixed to the substrate (FIG. 6D). In some embodiments, these groups serve as the guest for a host-guest interaction with β-cyclodextrin, among the strongest known supramolecular host-guest assemblies known. In some embodiments, the substrate is then immersed in a hydrophilic β-cyclodextrin solution, enabling the formation of a β-cyclodextrin monolayer, shown schematically in FIG. 5E. β-cyclodextrin is an inexpensive, water-soluble, commercially available compound that poses little hazard and is the active ingredient in a number of home fragrances and air sanitizers (e.g. Febreeze™).

Figure 7:
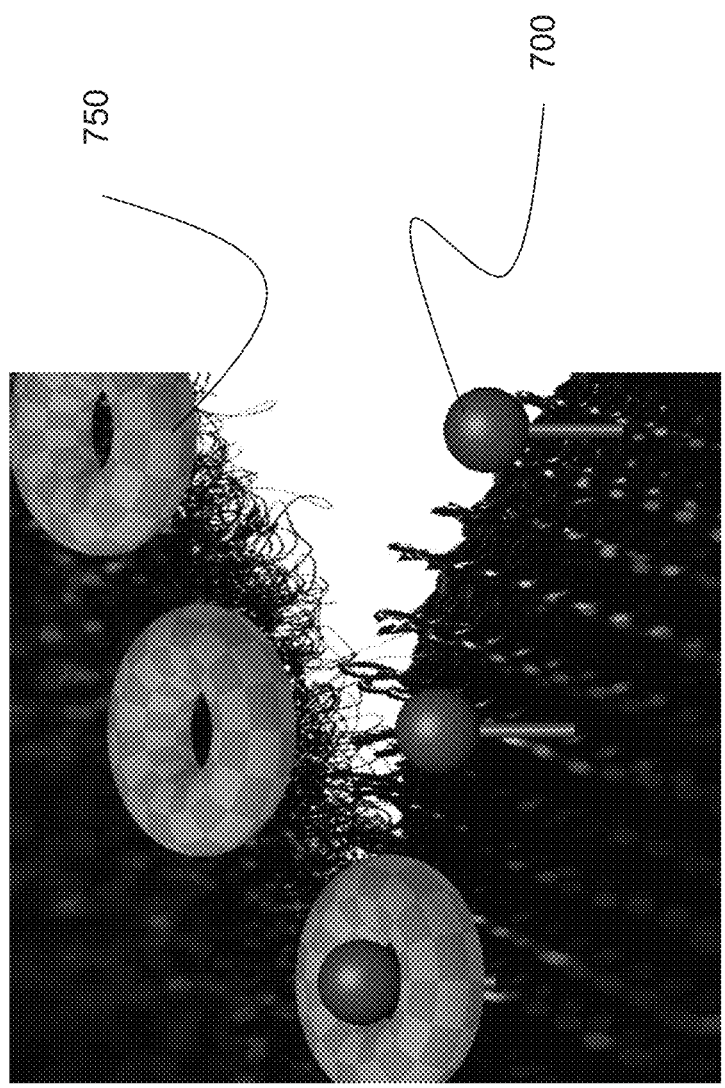
FIG. 7 illustrates an embodiment of a method of functionalizing a diamond according to several non-limiting embodiments disclosed herein.

In some embodiments, as shown in FIG. 7, the system acts like Velcro, where the anchor molecules 700 act as the hooks for attaching the host molecules 750. In some embodiments, the anchor molecules 700 attract and secure the host molecules 750. In some embodiments, the finished functionalized surface resembles a bi-layer Velcro ribbon, with anchor molecules (hooks) attached to a diamond surface in an ordered monolayer, binding to itself a disorganized layer of host molecules (felt) above the surface. In some embodiments, the outward face of the treated surface is hydrophilic.

In some embodiments, the anchor coating attached to the diamond (or gemstone) surface is permanent. In some embodiments, as disclosed elsewhere herein, the hydrophilic host functionalities of the gemstone are attached via host-guest inclusion complexes. In some embodiments, because the host-guest interactions are not permanent in nature, the host may become separated from the guest and the surface properties of the coating may degrade over time. In some embodiments, advantageously, the host can be replaced using a maintenance step. In some embodiments, the maintenance step can be performed to reintroduce the hydrophilic functionalities (or amphiphilic or hydrophobic functionalities where the host has such properties).

Figure 8F:
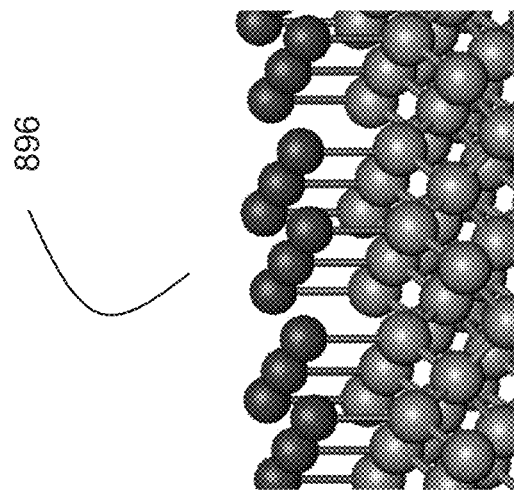
Figure 8E:
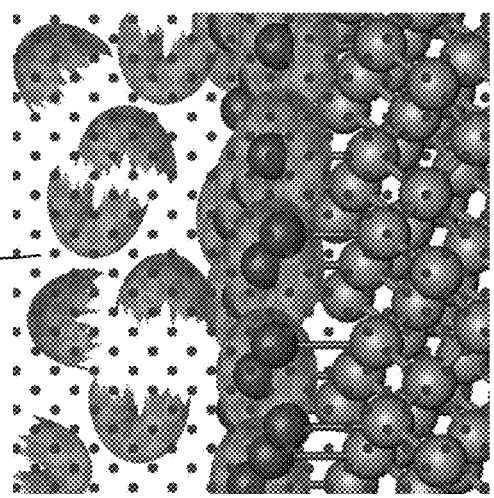
Figure 8D:
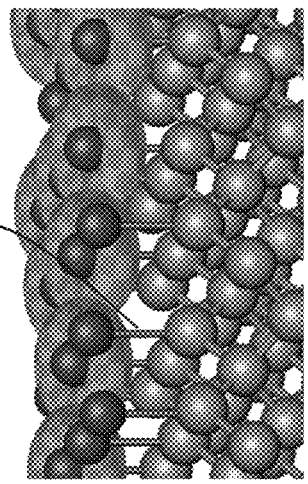

In some embodiments, as shown in FIGS. 8A-8H, the molecules that impart the surface functionality (e.g., the host molecules, such as β-cyclodextrin) will wear off over time, leaving some of the anchor molecules exposed 800. In some embodiments, as shown in FIG. 8B, functionalized diamonds that have been soiled or aged are held in a solution 890 of soap and/or host molecule 850 or a derivative thereof. In some embodiments, soap lifts off any contaminant (not shown) and free host molecules 850 bind free anchor guest moieties 802. In some embodiments, when functionalized and coated surfaces become heavily soiled by grease and grime, and the host molecules 850 disassociate from the surface as shown in FIG. 8D. In some embodiments, soiled surfaces can be returned to their original anchor-functionalized state by chemical treatment with a cleanser 895, as shown in FIG. 8E. In some embodiments, the cleanser is an acid or base. In some embodiments, the acid has a pH of less than or equal to about: 3, 2, 1, 0, or ranges including and/or spanning the aforementioned values. In some embodiments, the base has a pH of greater than or equal to about: 11, 12, 13, 14, or ranges including and/or spanning the aforementioned values. In some embodiments, hydrolysis of the remaining bound host molecules in a surfactant solution removes all traces of bound host molecules from the film (as shown in FIG. 8F). In some embodiments, treatment with acid, base, and/or surfactant solution does not substantially remove or otherwise affect anchor molecules. In some embodiments, after treatment with acid, base, and/or surfactant solution, the cleaned surface 896 is restored to condition for re-application of host molecules 850, as shown in FIG. 8G. In some embodiments, a functionalized diamond surface 849 is thereby refinished with a bound layer of host molecules, reforming the host-guest unit and molecular coating (e.g., the structure described in FIG. 7).

In some embodiments, the cleaning and/or re-functionalization process (using host molecules) can be performed on a monthly, weekly, or daily basis to maintain the diamond surface in showroom condition. In some embodiments, a solution of host molecules (and/or host molecules and surfactant) can be used to fill in any gaps in coverage. In some embodiments, the acid and/or base solutions and the solution of host molecules (and/or host molecules and surfactant) can be used in tandem to completely renew the coating (e.g., the hydrophilic coating) to the diamonds. In some embodiments the renewal can be performed at home by a user. In some embodiments, these solutions can completely resurface the diamond with a hydrophilic layer. In some embodiments, the process including anchor placement and or host placement is reversible or irreversible. Some embodiments provide a kit comprising a host solution and a cleaning solution (e.g., acid, base, and/or surfactant solution) to allow a user to perform the re-coating of the gemstone.

Some embodiments provide one or more of the following benefits: a surface that is not heat sensitive, a coating solution system that is safe and easy to use, a coating and coating removing system that can be performed at home, the use of inexpensive materials (cyclodextrin, etc.), non-destructive diamond renewal and protection (additive coating), and the ability to test these systems on diamond chips.

In some embodiments, as disclosed elsewhere herein, the nanomolecular coating is a surface coating on diamond that converts passive, non-reactive, hydrophobic/lipophilic diamond into a functional surface capable of binding and retaining a one-molecule-thick layer of a hydrophilic/lipophobic compound. This added layer is formulated to impart any desired functionality to the diamond surface. The presence of a hydrophilic coating will achieve one or more of the following advantages, or others, (a) decrease the rate of soiling of jewelry diamonds (b) simplify the cleaning of the diamonds. In some embodiments, the coating itself is (c) reversible (d) restorable and (e) will not degrade or modify the diamond surface itself beyond application of the initial coating. In some embodiments, the methods and compositions disclosed herein allow preventative maintenance of diamonds and other gemstones. In some embodiments, the coatings described herein keep diamonds looking showroom new.

In some embodiments, the custom dual-branched anchor molecule has as a precursor a bis(phenyl)-diazomethylene (e.g., 1,1'-((diazomethylene)bis(4,1-phenylene)) with two variable moieties, X and X', each bound to the 4 position of one of the two phenyl groups. The variable moieties being specified to reversibly bind to a ring molecule (e.g., a hydrophilic ring, etc.) through guest-host interaction. In some embodiments, the variable moieties include non-binding sections that do not interact with the host molecule, but instead provide a structural function (e.g. reducing steric-hindrance effects, increasing binding efficiency, increasing availability of guest functionalities, etc.). In some embodiments, the structural sections are flexible. In some embodiments, the structural sections are inflexible. In some embodiments, the precursor anchor molecule 604 can be designed to include flexible linkers between the phenyl and adamantyl moiety (not shown). For example, in some embodiments, the flexible linker is a medium size alkylene or lower alkylene terminated with guest portion. In some embodiments, the flexible linker is a polyamino having 1-10 repeat units and terminated with a guest portion. In some embodiments, the flexible linker is a polyether having 1-10 repeat units and terminated with a guest portion. In some embodiments, the adamantyl groups can be replaced with alternative hydrophobic structures of similar size (or hydrophilic structures). In some embodiments, asymmetric anchor molecules may be used. In some embodiments, different anchor molecules can be used on a single surface. In some embodiments, different host molecules can be used on a single surface. In some embodiments, host molecules (e.g., cyclodextrins) of any size could be matched to anchors guests specifically targeted to them (e.g., based on size). In some embodiments, hydrocarbons that are larger or smaller moieties than adamantane can be selected as guests. In some embodiments, larger cyclodextrins can be used. In some embodiments, this selection of guests and hosts is made in such a way to tailor the interaction between the precursor and cyclodextrin.

In some embodiments, as disclosed elsewhere herein, the diazo group is removed leaving an activated species in free-radical form or anionic form. In some embodiments, the activated form is subsequently exposed to a native diamond surface, to which it binds by covalent bonding. The final product of the binding reaction is a dual-branched anchor molecule, bound to the diamond surface at one end, presenting two active anchor points for subsequent attachment of ring molecules.

In some embodiments, diamonds are placed in a bath of molecules that are both attracted to the molecules on the surface of the diamonds and are intrinsically hydrophilic (e.g., host molecules). The hydrophilic molecules bond to the surface of the diamonds. Once the molecules are bonded, the surface chemistry of the diamond has been changed. In some embodiments, guest-host chemistry is used to introduce custom-designed and custom-made molecules to a commercially available hydrophilic molecule (e.g., cyclodextrin). In some embodiments, the guest-host interaction is permanent, nearly permanent, or substantially permanent under normal wearing conditions. However, in some embodiments, over time, the molecules that create the hydrophilic surface will wear off. In some embodiments the cyclodextrin (or another different host molecule) can be chemically functionalized to precisely tune the surface chemistry of the gemstone. For example, hydrophobic, hydrophilic, or amphiphilic chains can be chemically attached (covalently, ionically, etc.) to the exterior of a cyclodextrin. In some embodiments, cyclodextrin can be functionalized via covalent attachments at the exposed hydroxyl sites. In some embodiments, added functionality can be selected so that it does not substantially affect the binding constant of the host (e.g., cyclodextrin) in the guest (e.g., adamantyl). In some embodiments, added functionality can be chosen to affect the surface properties of the diamond enabling a secondary avenue for direct and precise control over the coating (e.g., film) performance.

In some embodiments, the method of coating a diamond (or gemstone) involves one or more of the following steps. A gemstone is acquired. The gemstone is placed in a solution of a reactive anchor precursor. In some embodiments, the anchor solution is heated. In some embodiments, the anchor-solution is sonicated. In some embodiments, the gemstone is then soaked in solvent (e.g., toluene, acetone, water, etc.) to remove unbound and/or unreacted anchor precursor. In some embodiments, the gemstone is sonicated or heated in the soak solution to remove unreacted or unbound anchor. In some embodiments, the precursor is added to the gemstone through vapor deposition, by dropwise addition, or in solution. In some embodiments, the anchor-coated diamond (or gemstone) is exposed to a host solution (e.g., a β-cyclodextrin or derivative solution). In some embodiments, the anchor-coated diamond is held in an aqueous solution of surfactant (e.g., soap) and β-cyclodextrin or derivative. Soap lifts off any contaminant and free cyclodextrin complexes any uncovered receptors. In some embodiments the aqueous solution does not contain soap. In some embodiments, heavily soiled diamonds can be returned to their original uncoated state by treatment with acid or base. In some embodiments, hydrolysis of the cyclodextrin in a surfactant solution removes all traces of product from the film, but does not remove anchors. In some embodiments, the cleaned surface is then ready for re-application of the host molecule solution (restoration solution) to restore the target surface functionality. In some embodiments, the hydrolysis and restoration treatments are done on a regular basis. In some embodiments, the hydrolysis and restoration treatment solutions are used in tandem to completely renew the hydrophilic coating to the diamond. In some embodiments, the hydrolysis and restoration treatments can be performed on a weekly, monthly, or yearly basis without substantial loss of the dirt and grime repelling ability of the coating between treatments. In some embodiments, the hydrolysis (or renewing) solution completely removes the hydrophilic surface from the diamond. In some embodiments, the refresh (or restoration) solution completely re-surfaces the hydrophilic surface on the diamond.

In some embodiments, the diamond (and/or gemstone) is acquired by a user. In some embodiments, the anchor molecule is added to diamond (and/or gemstone). In some embodiments, the diamond (and/or gemstone) is coated to become intrinsically hydrophilic (e.g., with a host molecule that binds a guest portion of the anchor). In some embodiments, the diamond (and/or gemstone) can then be set and sold.

In some embodiments, the solutions disclosed herein can be sold as a kit (e.g., a maintenance kit). In some embodiments, the maintenance kit can comprise one or more of an anchor solution, a heating element to bond the anchor to a diamond, a host solution, an acid and/or base solution (renew solution), a refresh solution (with the guest molecule and/or a surfactant/guest molecule solution). In some embodiments, the kit does not comprise one or more of these items (e.g., the anchor solution or the heating element, etc.).

In some embodiments, the host coating is sufficiently durable for long-term use (e.g., is able to maintain integrity and substantially unreduced efficacy over a period of at least six months with regular and normal usage). In some embodiments, under normal wear and tear conditions, the host remains bound to the anchor moiety (e.g., the host coating) for a period of equal to or at least about: one week, one month, six months, one year, or ranges spanning and/or including the aforementioned values. In some variants, the look of the gemstone (e.g., diamond) remains substantially unchanged and/or the grime/smudge resistant properties of the coating remain substantially unchanged during long term use (e.g., for periods of six months, 1 year, 2 years, etc., as could be measured over time or with accelerated stress conditions).

In some embodiments, the coating is sufficiently durable to withstand repeated cleanings or washings. For instance, because gemstones are typically exposed to washing conditions during, for example, bathing of the user, in certain variants, the coating is configured to maintain its anti-smudge/anti-grime properties after repeated cleanings that include scrubbing and washing with soapy water. In some embodiments, a durable coating maintains its anti-smudge/anti-grime properties after at least about 25, at least about 50, at least about 100, or more washes with a standard wash cloth and soapy water. In certain variants, the coating maintains its anti-smudge/anti-grime properties after at least about 100, at least about 200, at least about 500, or more wipes with a paper towel (e.g., a dry, damp, or wet paper towel with or without soap).

In some embodiments, X-ray photoelectron spectroscopy can be used to probe the surface composition of the functionalized gemstones (e.g., of the diamond surface, of the surface after the anchor molecule is bound, and/or of the surface after the host molecule is bound forming an inclusion complex). In some embodiments, comparisons of elemental abundance versus the intensity of the diamond substrate can be employed to analytically determine the specific coverage of adsorbed species pertaining to the anchor and to the host/guest complex. In some embodiments, XPS can be used to determine durability of the gemstone coating by performing measurements at various stages of time after normal use after the host/guest inclusion complexes are formed.

In some embodiments, water contact angle goniometry can be used to probe the surface properties and performance of the functionalized gemstones (e.g., of the diamond surface, of the surface after the anchor molecule is bound, and/or of the surface after the host molecule is bound forming an inclusion complex). In some embodiments, comparisons of water contact angle can be employed to analytically determine the specific coverage of adsorbed species pertaining to the anchor and to the host/guest complex. In some embodiments, water contact angle can be used to determine the durability of the gemstone coating by performing measurements at various stages of time after normal use after the host/guest inclusion complexes are formed.

In some embodiments, the methods described herein pertain to 1) performing and/or demonstrating covalent attachment of a receptor/anchor molecule (e.g., 1,1'-((diazomethylene)bis(4,1-phenylene))bis(adamantane)) to a test substrate (e.g., a hydrogen-terminated substrate, a diamond surface, etc.) consisting of chemical-vapor deposition (CVD) diamond on a silicon wafer. In some embodiments, the projects described herein pertain to 2) the use of the modified substrate to support formation of a supramolecularly self-assembled cyclodextrin monolayer on diamond. In some embodiments, the methods described herein pertain to 3) demonstrating a change in diamond surface hydrophobicity on exposure to the supramolecular self-assembly via elipsometry, contact angle goniometry, and X-ray photoelectron spectroscopy. In some embodiments, the methods described herein pertain to quantification of coating performance, robustness/degradation studies of the thin film, solubility of the coating, and optimization of the lift-off-layer performance.

In some embodiments, the surface coverage of both anchor molecule and β-CD, the change in hydrophobicity, and the durability and reversibility of the layers is quantified. In some embodiments, XPS, confocal raman imaging, SEM, FESEM, AFM, XRD, ellipsometry, contact angle goniometry, and atomic layer deposition is used for characterizing the films and for performing controls and comparison experiments. In some embodiments, particular formulations of anchor molecule and β-cyclodextrin are selected based on analysis and, experiments are performed to test the layer in a variety of environmental conditions that would normally be encountered during normal wear-and-tear: heat, cold, various solutions (soaps, lotions, alcohols), etc. In some embodiments, this exposure will also allow us the opportunity to test the efficacy of re-exposure to a β-cyclodextrin solution, for self-restoration of the monolayer. In some embodiments, XPS, AFM, and SEM sessions are used to study the surface coverage and thickness after various modifications are performed. In some embodiments, contact angle measurements are performed to monitor, for example, extent of change to the surface's hydrophilicity (and/or hydrophobicity). In some embodiments, fluorescently labeled cyclodextrins are used. In some embodiments, the use of fluorescent labeling allows an additional method for examining the coverage and/or robustness of the film. In some embodiments, a zeiss confocal microscope can be used to analyze such features in a biological nanostructures facility.

In some embodiments, durability studies are performed. In some embodiments, determining the durability and "shelf-life" of the nanolayer of the invention is performed.

In some embodiments, the shelf-life of the host-guest molecular layer (where shelf-life means that no more than 10% of the host is lost from the anchor-guest unit during that time) is greater than or equal to about one month, 6 months, 12 months, 18 months, or ranges including and/or spanning the aforementioned values. In some embodiments, after extended periods of times in harsh conditions (e.g., wipes with paper towels, washes with soapy water, elevated temperature (60° C.), exposure to various environmental conditions and cleaners, exposure to dirt and/or oils, etc.), the surface maintains its anti-smudge/anti-grime properties. In some embodiments, XPS, AFM (e.g., nanomagnetometric), STM (e.g., photon), TEM, Raman, UV-Vis, and SEM sessions may be used, along with contact angle measurements to demonstrate the durability of the coating. In some embodiments, after extended periods of times in harsh conditions (e.g., accelerated where conditions), the shelf-life is greater than or equal to about one month, 6 months, 12 months, 18 months, or ranges including and/or spanning the aforementioned values. In some embodiments, the brilliance and aesthetic qualities of the gemstone remain substantially unchanged to the naked eye after at least about 25, at least about 50, at least about 100, or more washes with a standard wash cloth and soapy water. In some embodiments, the brilliance and aesthetic qualities of the gemstone remain substantially unchanged to the naked eye after at least about 100, at least about 200, at least about 500, or more wipes with a paper towel (e.g., a dry, damp, or wet paper towel with or without soap). In some embodiments, the brilliance and aesthetic qualities of the gemstone remain substantially unchanged to the naked eye for a period of greater than or equal to about: one month, 6 months, 12 months, 18 months, or ranges including and/or spanning the aforementioned values.

In some embodiments, instead of a direct bond to the diamond surface via a methine, an alkylene link may be used to connect the diamond surface to the methine. In some embodiments, a $C_1$ to $C_{10}$ alkylene is used to connect the methine to the diamond. In some embodiments, this may be used to afford denser attachment to the surface and/or additional β-cyclodextrin compounds to impart even greater hydrophilicity to the surface.

Part of the intentional design of this novel nanomolecular layer is that it remain undetectable once attached to the diamond's surface. In some embodiments, there are no visual indications to the naked eye or even a jeweler's loop that the diamond has been modified. In some embodiments, the anchor molecule is composed entirely of carbon, once covalently bonded, so that atomically the makeup of the original diamond is unchanged or substantially unchanged. In some embodiments, the fabrication forms a monolayer after reaction. In some embodiments, the use of carbon is attractive as it does not add heteroatoms. In some embodiments, heteroatoms can be points of potential chemical instability and degradation (e.g., as amide or ester-based linkages). In some embodiments, heteroatoms can be used in conjunction with or instead of carbon-only configurations. In some embodiments, the diamondoid-based anchor is bound via an additive process, rather than a subtractive one. In some embodiments, spectroscopy, microscopy, and ellipsometry, etc. can be used to characterize the products (and/or other techniques described herein). In some embodiments, the absence of heteroatoms makes differentiating the thin film from the bulk diamond can be performed using the techniques described herein.

In some embodiments, nanofabrication facilities can be used for characterization. In some embodiments, ellipsometry and contact angle goniometry can provide reliable assessments of surfaces to determine if, for example, measureable changes have been made or if the synthesis procedure needs to be modified. In some embodiments, atomic layer deposition may be used to create test substrates as controls. In some embodiments, AFM can be used to measure the roughness of the diamond before and after treatments (and or other features of the surfaces, such as level of functionalization, binding strength of the cyclodextrin layer, etc.). In some embodiments, XPS will allow us to look for the buried $sp^2$ hybridized carbons in the phenyl ring of our molecule, and even more easily we can use it to detect the presence of the B-cyclodextrin molecules on the surface. In some embodiments, XPS is expected to be a useful analytical tool for determining the coverage and functionality of our thin films. In some embodiments, imaging with FESEM will be useful for the preparation of display figures. In some embodiments, the useful instruments for assessing coverage of the thin films (e.g., confocal RAMAN microscope), the structure and morphology of the diamond substrate (e.g., tabletop SEM) are employed.

Some embodiments pertain to a glisten molecule (e.g., a host-guest unit) which comprises a covalent/noncovalent pair (e.g., adamantyl-anchor molecule and associated adamantyl). In some embodiments, the guest can reside in the hydrophobic pocket of a second species (the host) and can be used to create one or more effects as disclosed herein. In some embodiments, the host-guest unit comprises adamantane/β-CD, but other pairing units can be present, including for example, napthlene/α-CD. In some embodiments, as disclosed elsewhere herein, though several exemplary guest moieties are used, any guest that can reside in a cyclodextrin can be used.

In some embodiments, as disclosed elsewhere herein, the coatings disclosed herein serve to control the wetting properties of the interfaces and therefore can be tailored to prevent or diminish contamination by greases, lotions, dust, dirt, or any other specific or non specific contaminant.

In some embodiments, as disclosed elsewhere herein, a "carbene method" is used, which involves use of a class I explosive that can be applied easily to a surface and then gently heated to drive functionalization of a given surface.

In some embodiments, as disclosed elsewhere herein, the basis for the nanomolecular coating relies on the supramolecular association of a β-CD with adamantane cage (C10H14). This is among the strongest host-guest supramolecular couplings available. In some embodiments, the adamantane cages can be placed on a surface in a sufficiently dense 'molecular carpet' and β-CD groups adhere spontaneously to these sites and remain on the surface after the diamond has been removed from the treatment solution. In some embodiments, the presence of these molecules will determine the surface chemistry of the interface. β-cyclodextrin is a cyclic oligosaccharide composed of 7 D-glucopyranoses. It has a lipophilic/hydrophobic interior and hydrophilic exterior with hydroxyl edges. Docking β-CD units to adamantyl cages transforms the interface to be more hydrophilic, but much less lipophilic, which consequently would block oil particles.

In some embodiments, as disclosed elsewhere herein, the adamantane moiety is not the only compound that can be used as a receptor. In some embodiments, as disclosed elsewhere herein, a molecule that fits within the hydrophobic pocket of a cyclodextrin molecule could be employed. Examples include: napthyl groups, anthracenyl, or quinonyl. If the receptor moiety is larger than the B-CD cavity, larger and smaller CDs can be used. For example, the α-CD has a smaller pocket and is used for covalently-linked napthylene moieties.

EXAMPLES

Materials and Instrumentation

Exemplary vendors and instrumentation are disclosed here. Unless otherwise indicated reagents were purchased from Spirochem. Methylene chloride (reagent grade) and β-cyclodextrin ≥97% was obtained from Sigma Aldrich. All reactions were performed under an air atmosphere, unless otherwise stated.

Instrumentation. $^1$H and $^{13}$C NMR spectra were obtained using a Varian 400 spectrometer energized to 399.85 MHz or a Varian 500 spectrometer energized to 499.9 MHz. All NMR spectra were analyzed at 25° C. and evaluated against residual solvent peaks.

X-ray photoelectron spectroscopy (XPS) was performed on a K-Alpha Plus from Thermo Fisher and analyzed using the included Avantage software. A flood gun was utilized for charge compensation and no milling was performed.

Example 1

Preparation of Bis(4-Iodophenyl) Functionalized Diamond Surface

Sample Preparation

The following procedures and analyses were performed to evaluate the formation of molecular layer on a hydrogen-terminated diamond surface using bis(4-iodophenyl)diazomethane. The following scheme shows the formation of a bis(4-iodophenyl) functionalized diamond surface:

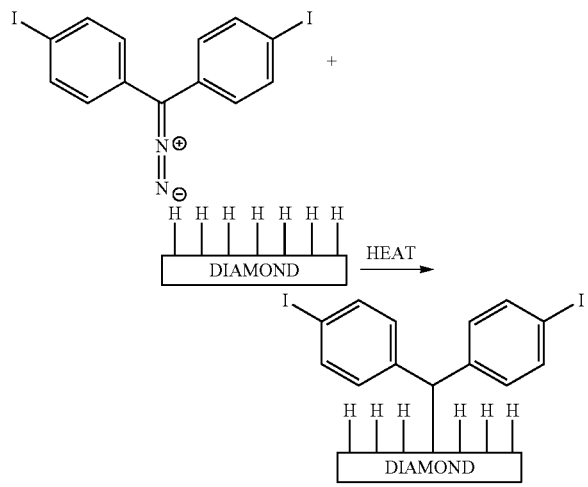

Figure 9B:
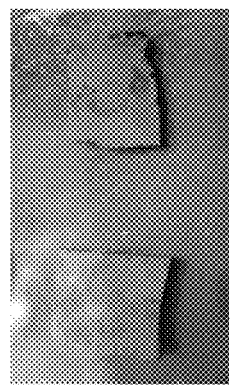
FIGS. 9A-9D depict the functionalization of a diamond-coated wafer (FIGS. 9A-C) and a diamond (FIG. 9D) using coating by droplets of solution.
Figure 9D:
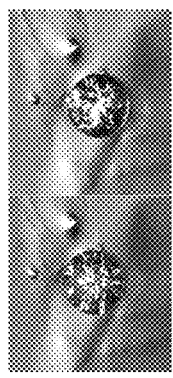
Figure 9A:
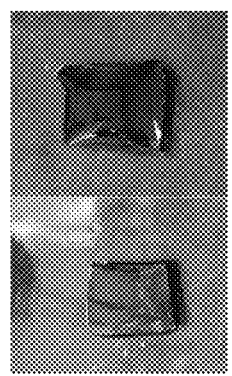

Briefly, to form the bis(4-iodophenyl) functionalized diamond surface, a 1% w/v (where a 1% solution is equivalent to 1 gram of compound per 100 mL of solution) solution of bis(4-iodophenyl)diazomethane) (1 mg, 0.0022 mmol) in dichloromethane (DCM, 100 μL) is prepared. This solution was stirred until the bis(4-iodophenyl)diazomethane) dissolved completely (affording "Solution 1.1"). A second, 0.2% w/v solution of bis(4-iodophenyl)diazomethane) (1 mg, 0.0022 mmol) in dichloromethane (DCM, 500 μL) was also prepared with stirring until complete dissolution ("Solution 1.2"). At that time, each bis(4-iodophenyl)diazomethane) solution was applied to a separate diamond-coated silicon wafer (used as a model surface for diamond) using a dropper and bulb. The diamond-coated silicon wafer before and after drop-coating is shown in FIG. 9A with the Solution 1.1 coated wafer on the left and the Solution 1.2 coated wafer on the right. The diamond-coated silicon wafer was evaporated at room temperature for 30 minutes. After the DCM evaporated, a layer of material was visible (FIG. 9B; with the Solution 1.1 coated wafer on the left and the Solution 1.2 coated wafer on the right).

Figure 9C:
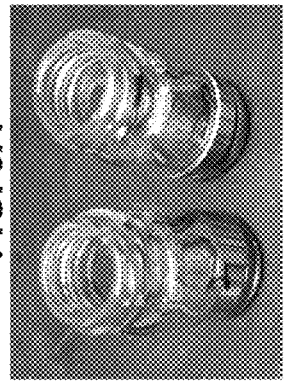

After application of the one drop of solution to each wafer, the drop-coated diamond-coated silicon wafers were annealed in a vacuum oven for 5 minutes at a temperature of 400K (127° C.). The drop-coated diamond-coated silicon wafers were then rinsed in a DCM bath for approximately 5 minutes, as shown in FIG. 9C (with the Solution 1.1 coated wafer on the left, herein after "Sample 1.1", and the Solution 1.2 coated wafer on the right, herein after "Sample 1.2"). FIG. 9D shows the treatment of two faceted diamonds using Solution 1.1 (diamond on the left) or Solution 1.2 (diamond on the right).

Example 2

XPS Sample Preparations and Analysis

Sample Preparation

To form bis(4-iodophenyl) functionalized diamond surfaces, similar procedures as those used for Example 1 were performed with the noted differences below. For "Sample 2.1", a 1% w/v solution of bis(4-iodophenyl)diazomethane) (1 mg, 0.0022 mmol) in dichloromethane (DCM, 100 μL) was prepared. For "Sample 2.2", a second solution having 0.5% w/v bis(4-iodophenyl)diazomethane) (1 mg, 0.0022 mmol) in dichloromethane (DCM, 200 μL) was prepared. For "Sample 2.3", "Sample 2.4", and "Sample 2.5", 0.2% w/v solution of bis(4-iodophenyl)diazomethane) (1 mg, 0.0022 mmol) in dichloromethane (DCM, 500 μL) was prepared. At that time, a dropper containing each bis(4-iodophenyl)diazomethane) solution was used to drop the solution onto a diamond-coated silicon wafer (used as a model surface for diamond). For Samples 2.1 and 2.2, the solution on the diamond-coated silicon wafer was evaporated at room temperature for a period of 10 minutes or until dry. For Sample 2.3, the wafer was placed on a hot plate at 130° C. during evaporation for a period of 5 minutes. For Sample 2.4, the wafer was placed on a hot plate at 180° C. during evaporation for a period of 5 minutes. For Sample 2.5, the wafer was placed on a hot plate at 140° C. during evaporation for a period of 5 minutes.

Analysis

Figure 10A:
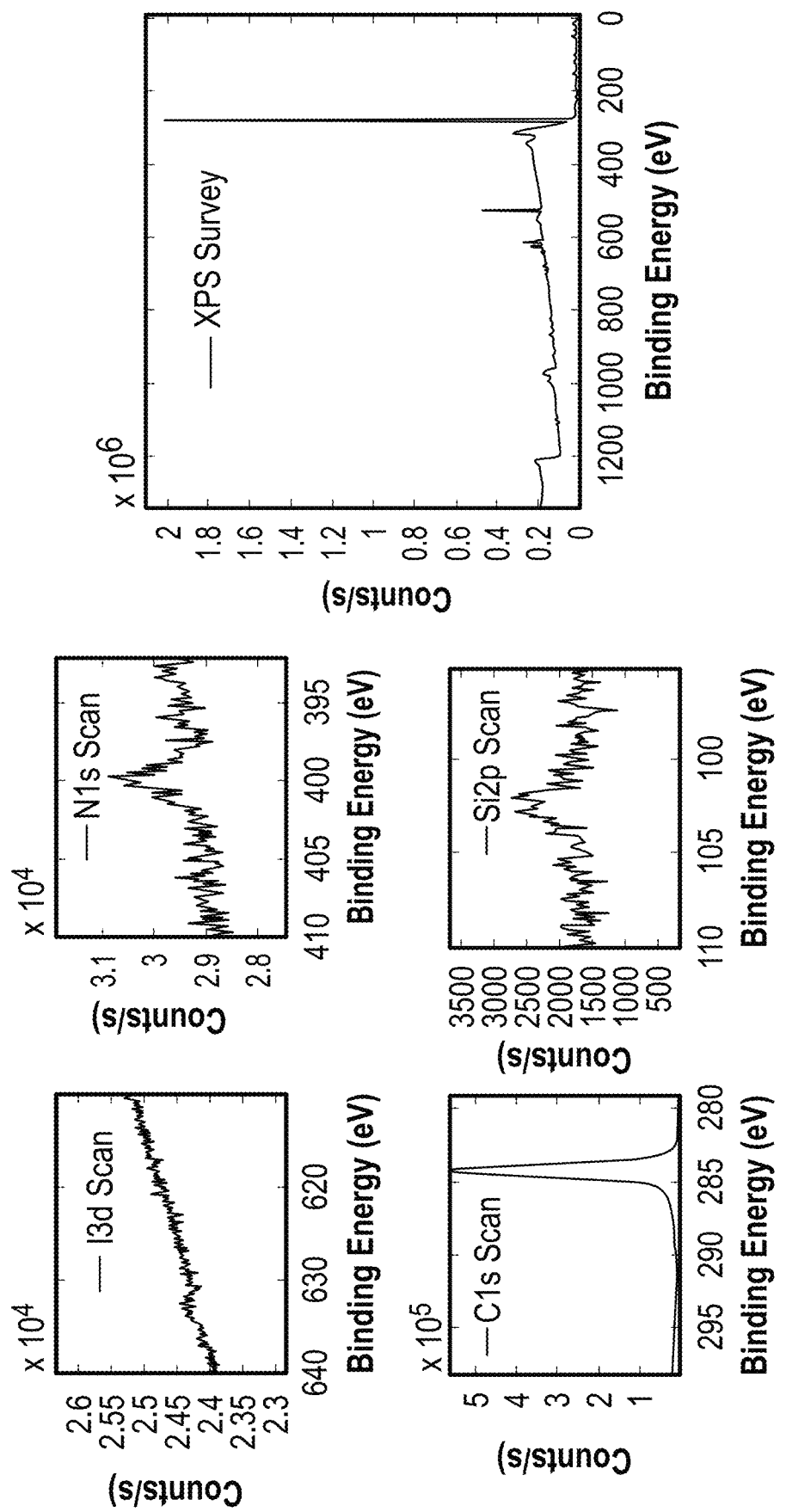
FIGS. 10A-10G provide X-ray photoelectron spectroscopy (XPS) data for samples of anchor-functionalized wafers.
Figure 10B:
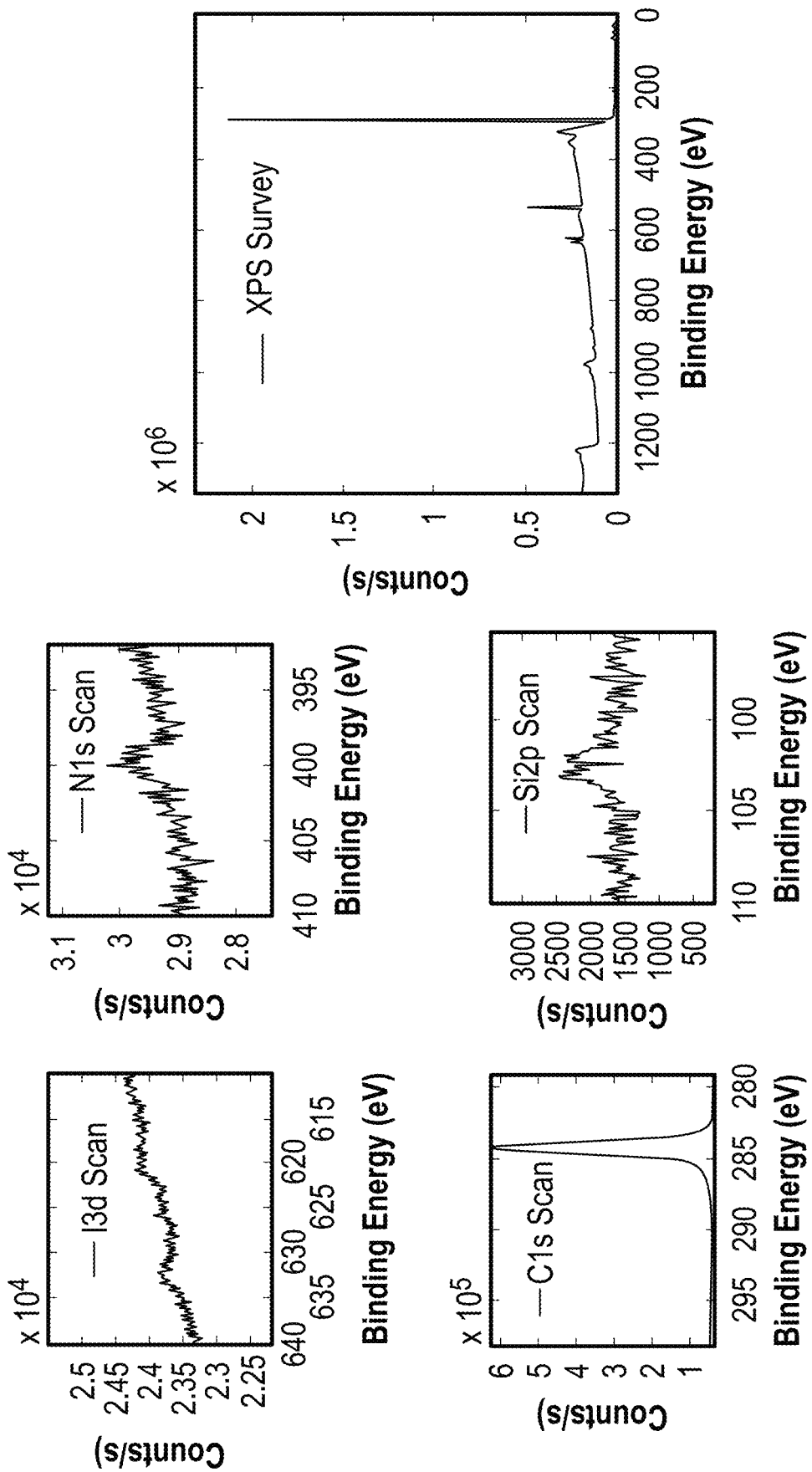
Figure 10C:
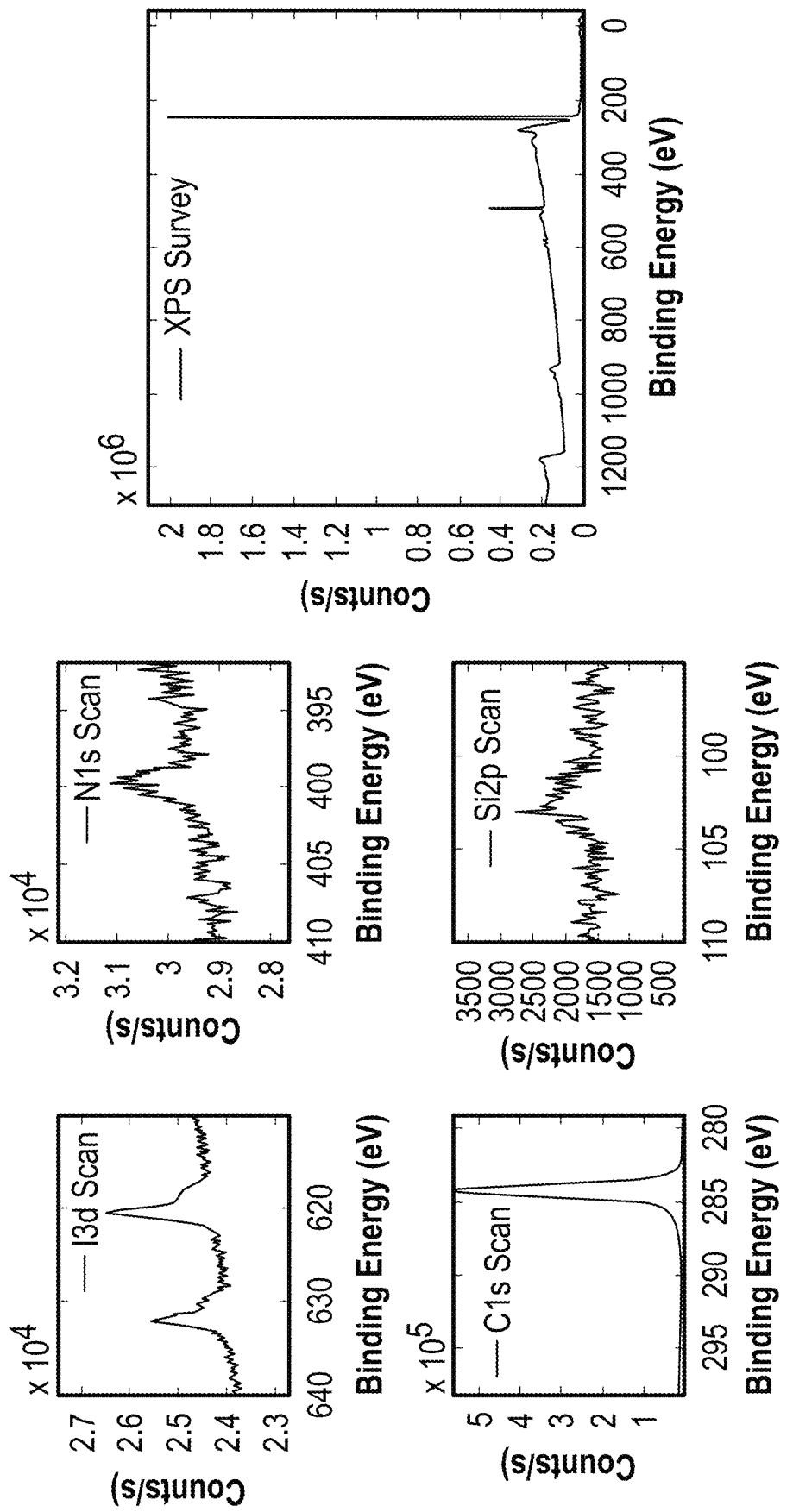
Figure 10D:
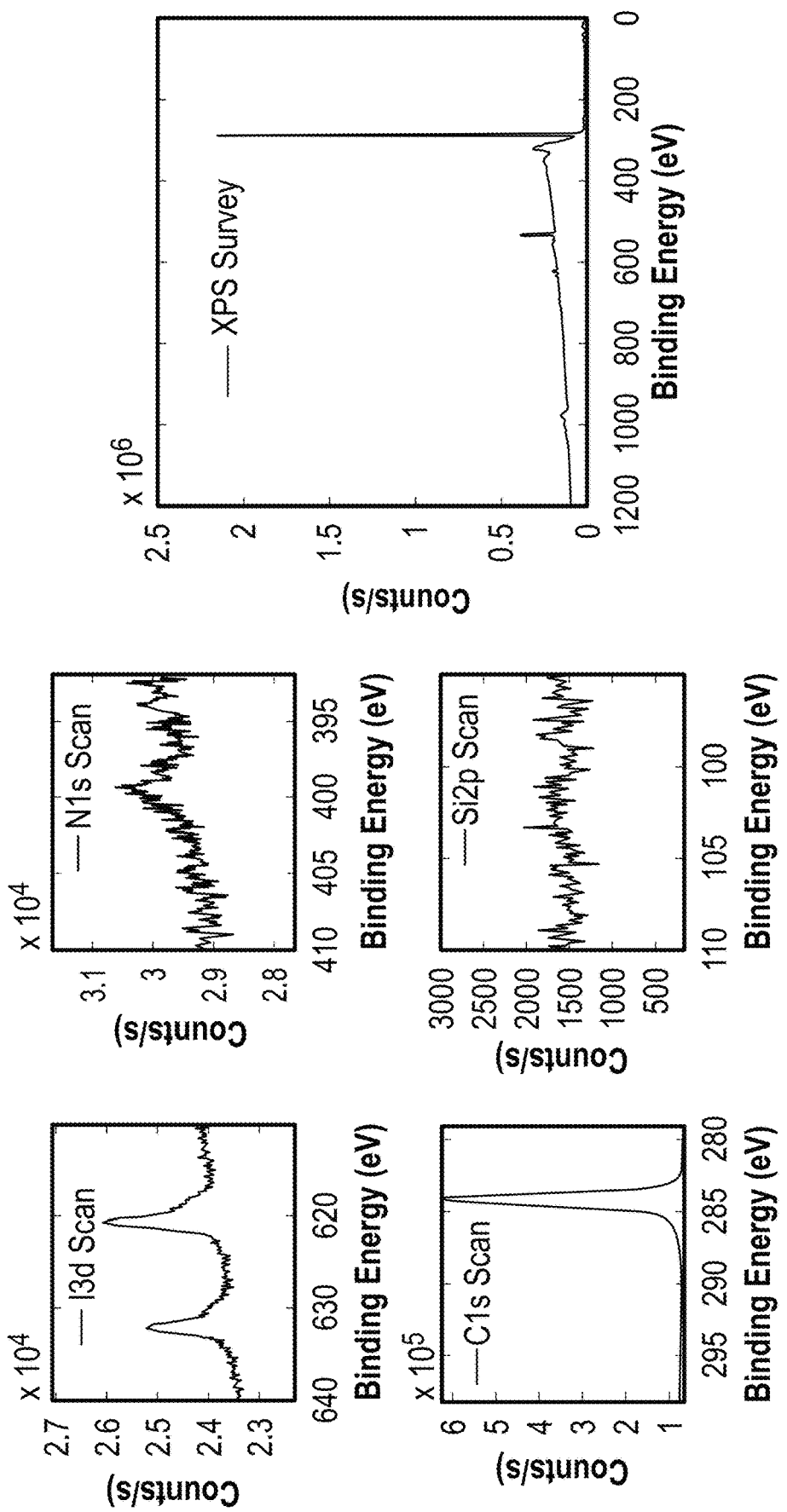
Figure 10E:
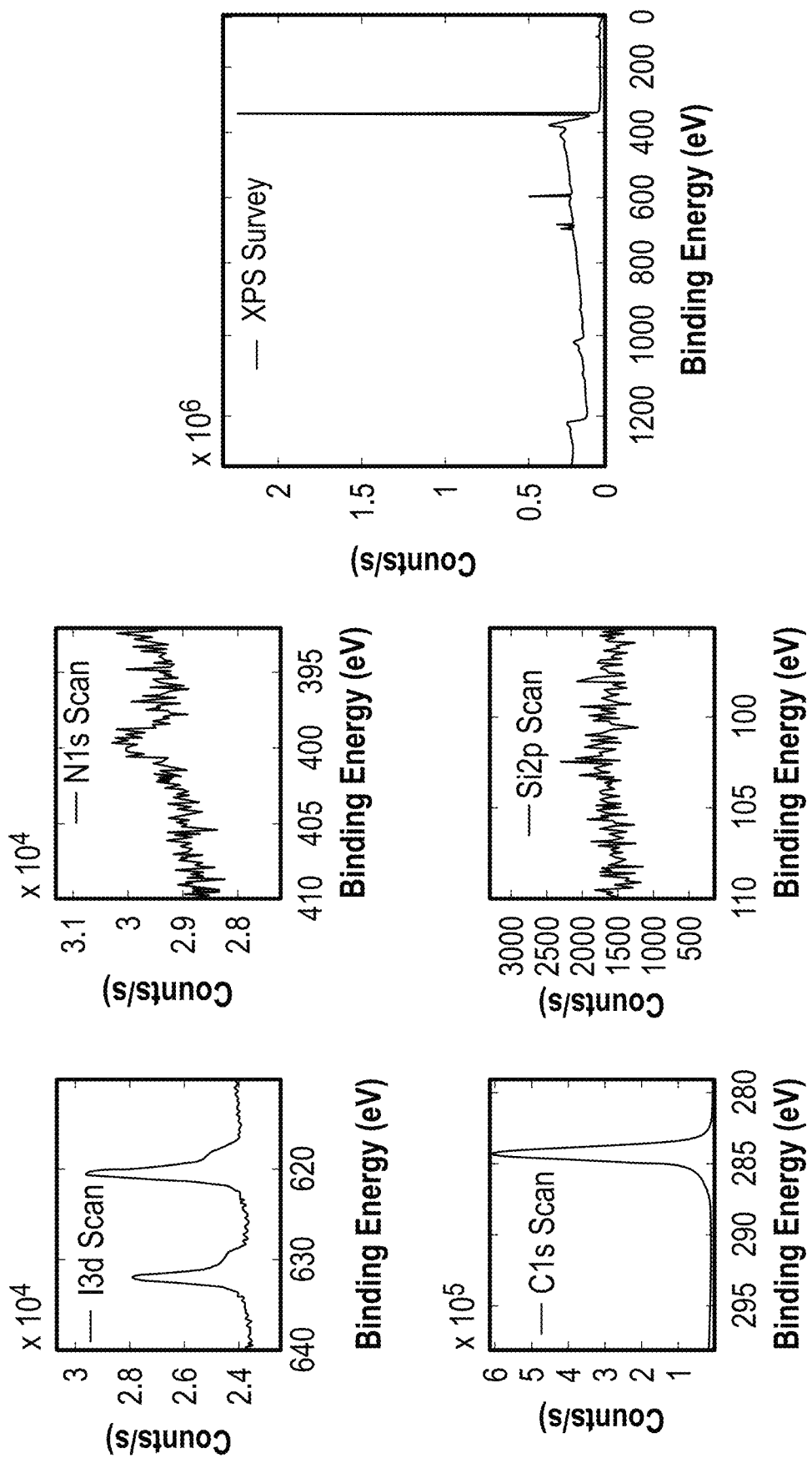
Figure 10F:
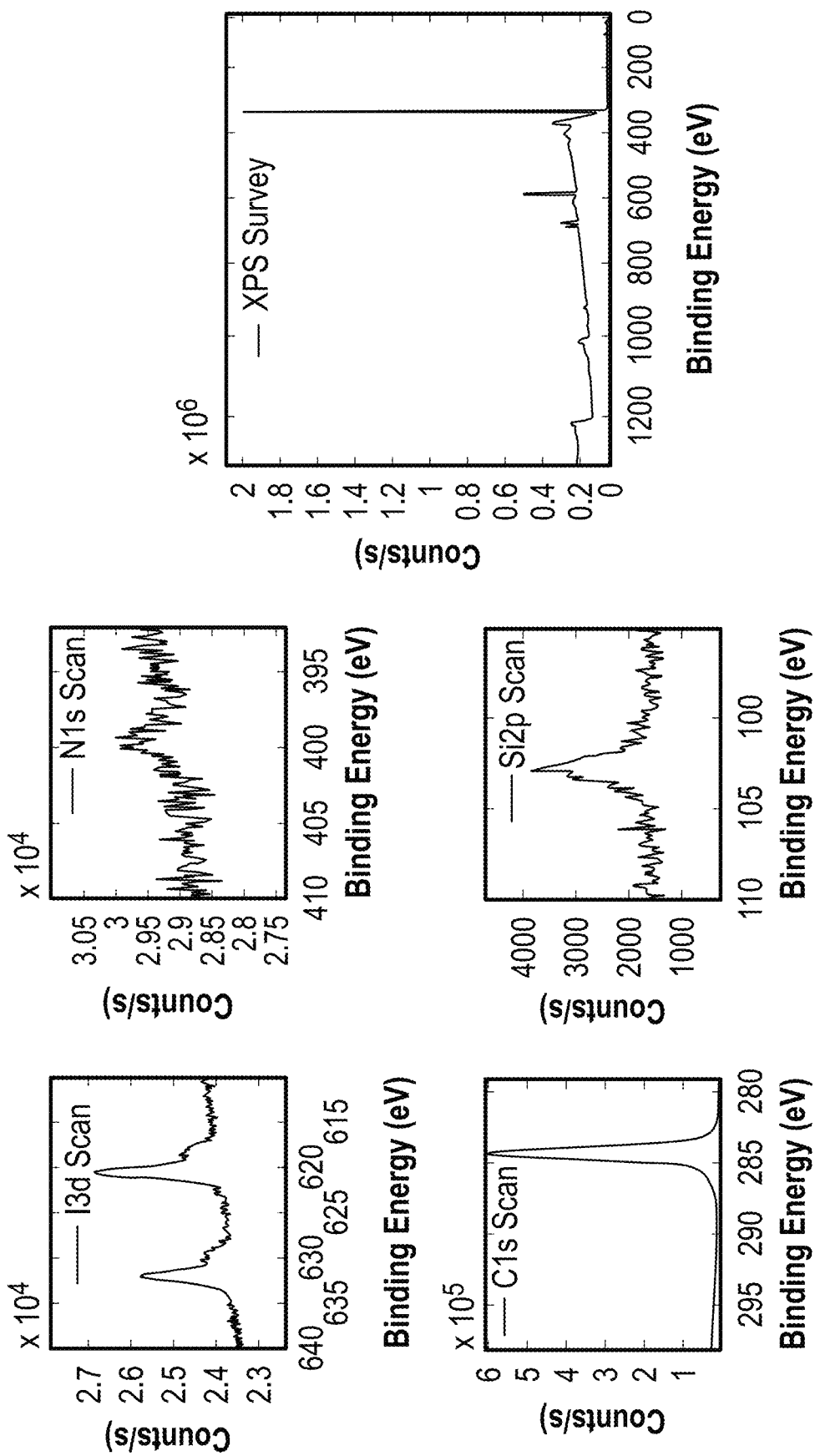
Figure 10G:
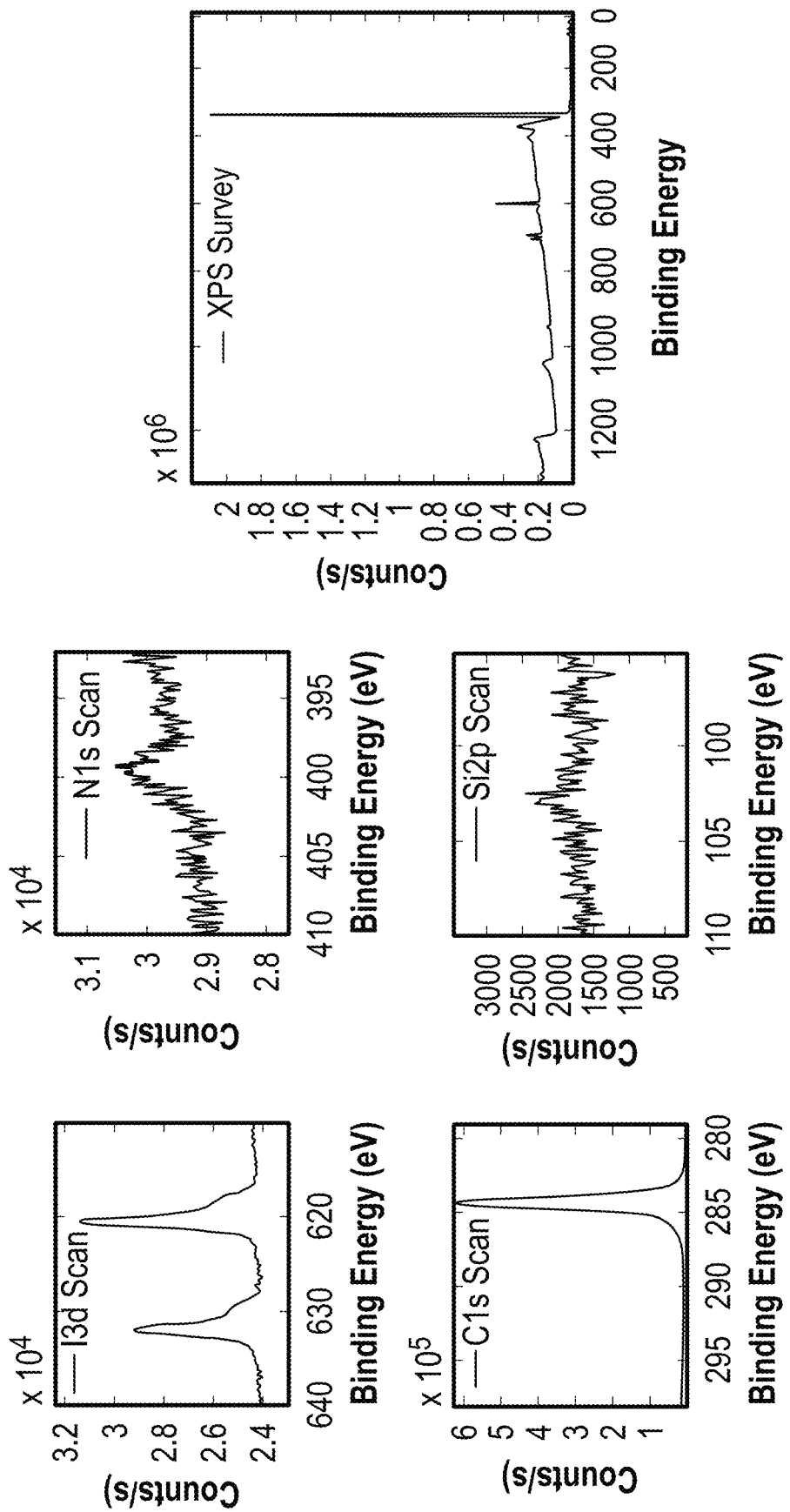

XPS was performed at three different portions of each of Samples 2.1-2.5 were performed versus a Control (where treatment with bis(4-iodophenyl)diazomethane) was not performed). In each instance, three different points on the wafer were probed with XPS. Exemplary XPS spectra for points on each sample are shown in FIGS. 10A-10G. FIG. 10A shows the data for the Control. FIGS. 10B and 10C show the data for Sample 2.1 at a first point and a second point, respectively. FIG. 10D shows the data for Sample 2.2. FIG. 10E shows the data for Sample 2.3. FIG. 10F shows the data for Sample 2.4. FIG. 10G shows the data for Sample 2.5.

From the XPS data, the following observations were made. The carbon signals for all samples were dominated by single crystal diamond and were largely unchanged across samples. Nitrogen signals were low in all examples and is attributed to nitrogen trapped in the diamond lattice via nitrogen vacancy defects, a common modality in these systems. The silicon features are attributed to pinhole defects in the diamond film and are a measure for sample quality; the silicon features are low in all cases. Sample 2.1, the unbaked control sample, showed a small residual signal for the iodine atoms. This weak signal originates from some physisorbed, unreacted bis(4-iodophenyl)diazomethane). Conversely, all heated samples exhibit strong iodine features consistent with chemisorption of the bis(4-iodophenyl)diazomethane) to the diamond substrate.

Example 3

Depositing Techniques

Figure 11A:
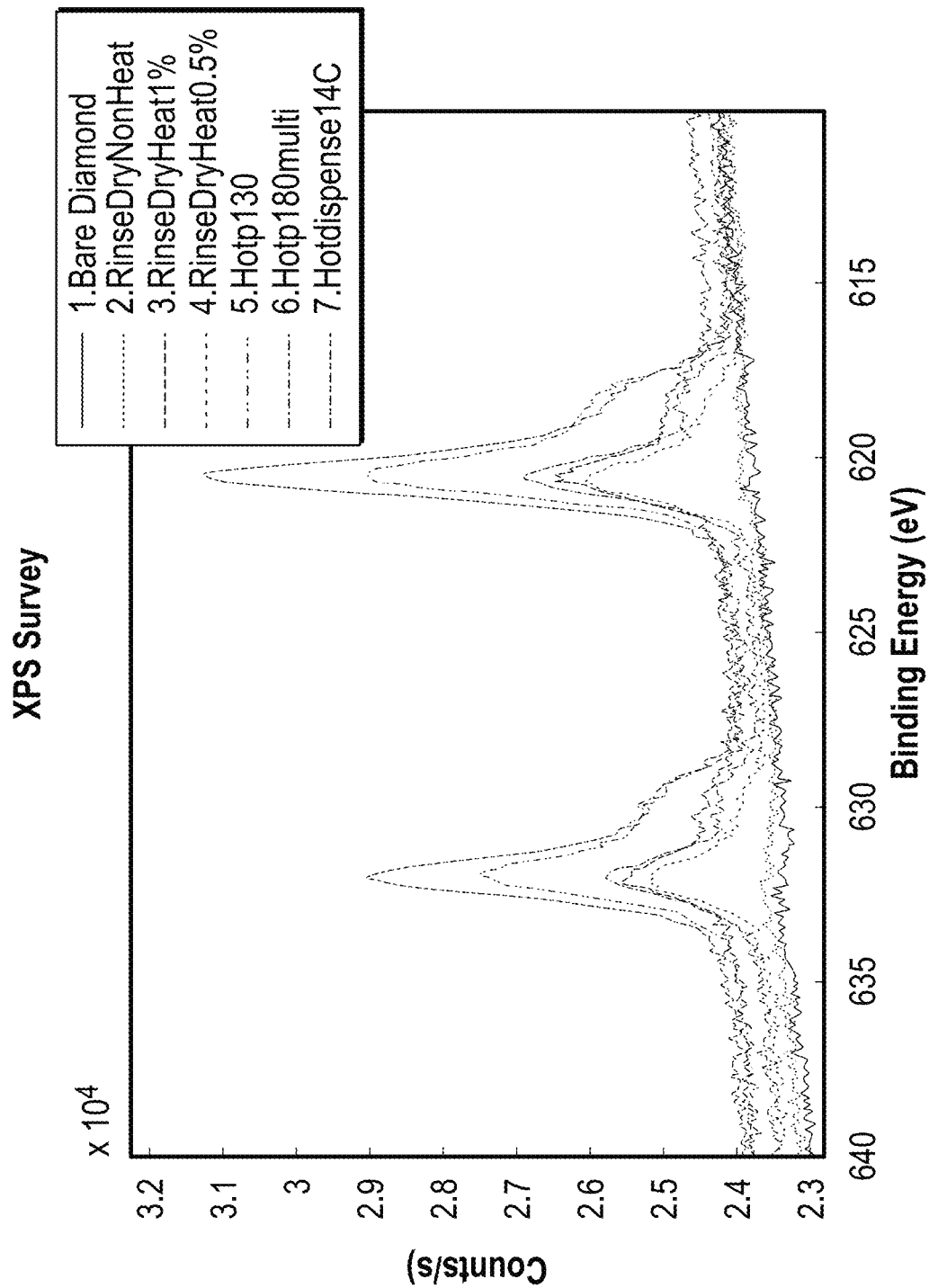
FIGS. 11A and 11B provide XPS overlays for functionalized diamond surfaces versus a control diamond surface without an anchor moiety.
Figure 11B:
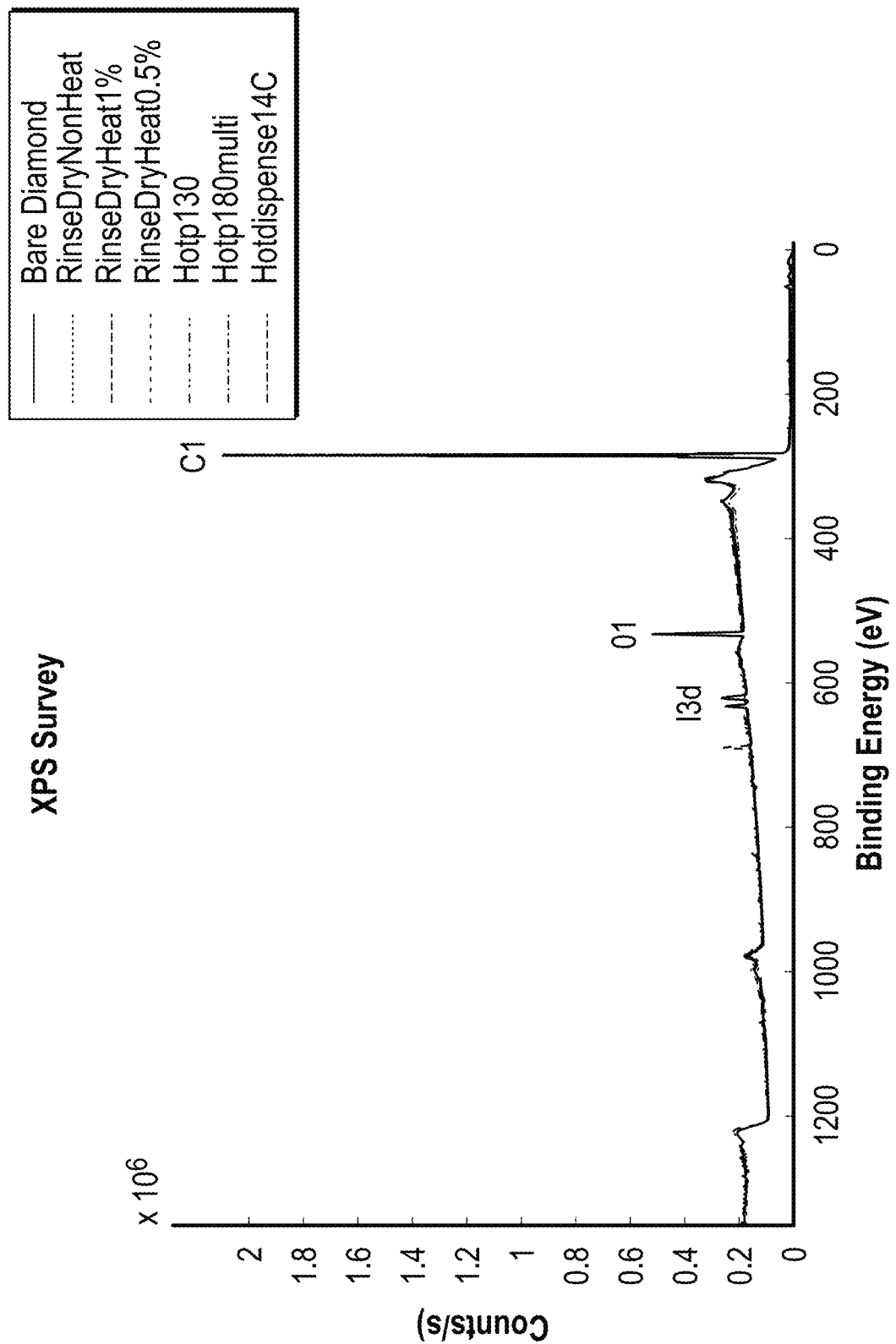

A variety of techniques for depositing the bis(4-iodophenyl)diazomethane) in methylene chloride were employed to identify whether trends existed for deposition type, temperature, and bis(4-iodophenyl)diazomethane) concentration. The iodine XPS spectra are shown in FIGS. 11A and FIG. 11B, where 11A shows an expanded view. The data demonstrate that no additional atoms are detected or lost. This experiment compared substrates for which bis(4-iodophenyl)diazomethane) was dried on the wafer surface and then heated (samples noted Rinse-Dry-Heat 1% and Rinse-Dry-Heat 0.5% employed w/v solutions of 1% and 0.1%, respectively). Solutions were allowed to dry and were then heated at 140° C. Hotp130 and Hotp140 were preheated wafers and the solution was dropped onto them and allowed to react. These showed higher iodine coverage relative to all other samples. This hot treatment eliminated the waiting for the solvent to dry. These samples had the best performance with the highest iodine coverage. Sample Hotp-180multi was an attempt to ascertain whether the sample coverage was incomplete after the first reaction. Three depositions were performed onto a wafer preheated to 180° C. The solvent rapidly evaporated in each case. The sample had to be sonicated to remove residual decomposed carbon from the surface. No relative increase in iodine was observed.

Example 4

Gemstone Diamond: Chemical Reaction with Iodo-Diaryl Carbon

Sample Preparation

To form additional bis(4-iodophenyl) functionalized diamond surfaces, similar procedures were performed as for the Example 1 and 2 procedures. A 1% w/v solution of bis(4-iodophenyl)diazomethane) (1 mg, 0.0022 mmol) in dichloromethane (DCM, 100 μL) was prepared and deposited on a diamond that was perched upright on a stand. The solution was allowed to dry for 20 minutes. The small size of the diamond increased the drying time of the DCM solvent. The bis(4-iodophenyl)diazomethane)-coated diamond was heated at 150° C. for a period of 10 minutes. The diamond was sonicated in toluene for 1 hour and was subsequently rinsed.

Analysis

Figure 12:
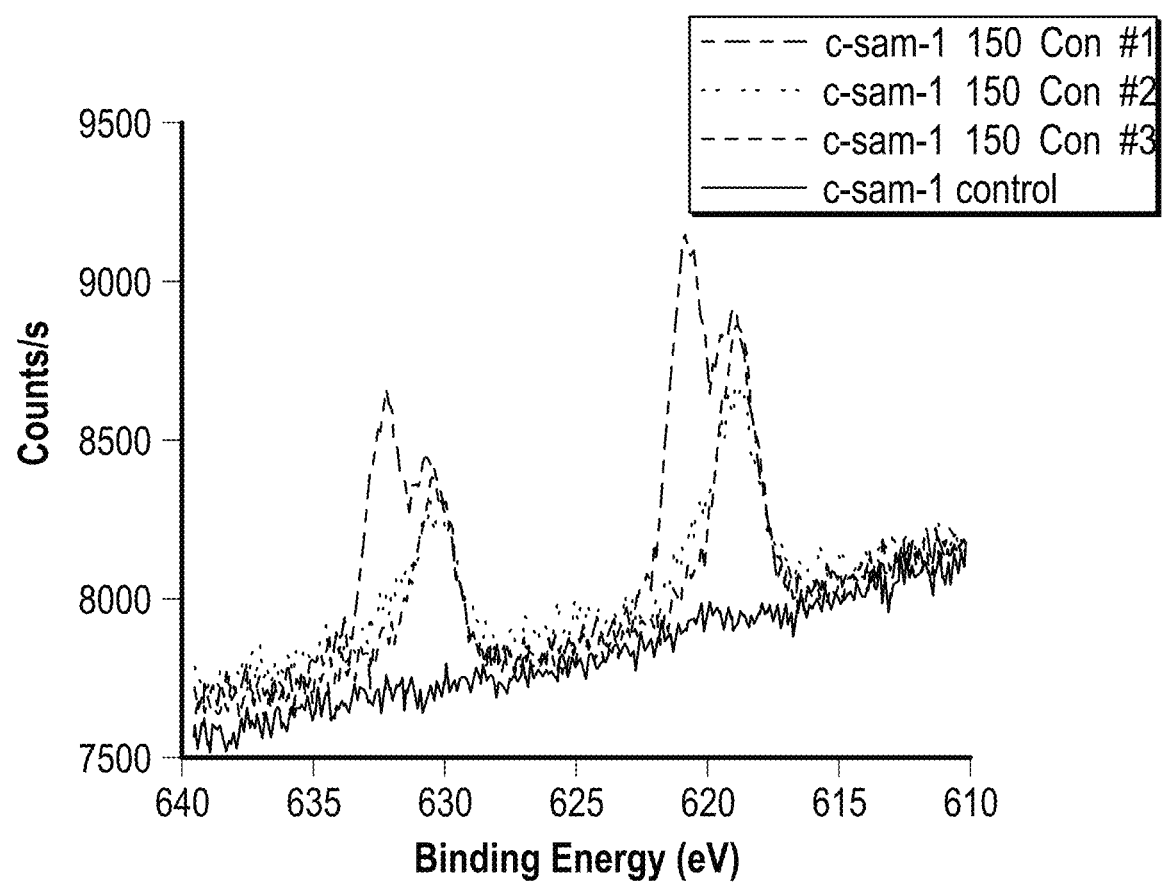
FIG. 12 shows XPS overlays for a functionalized diamond versus a control diamond surface without an anchor moiety.

XPS data is shown in FIG. 12. XPS was performed at three different portions of the diamond versus an un-functionalized control. The control experiment showed no iodine coverage. The modified diamond had detectable iodine. There was some variability across single sample surfaces relating to the ratio of chemisorbed to physisorbed compounds. These differences in iodine signal was attributed to the sample topography. Some regions of the diamond may not have been suitably heated because of its shape and small contact area with the hotplate. Nevertheless, a strong chemisorbed iodine signal was a first demonstration of functionalization of single-crystal gemstone diamond.

Example 5

Reaction and Rinse Cycles

Sample Preparation

To form bis(4-iodophenyl) functionalized diamond surfaces, similar procedures as those used for Example 1 were performed with the noted differences below. For "Sample 5.1-5.5", a 1% w/v solution of bis(4-iodophenyl)diazomethane) (1 mg, 0.0022 mmol) in dichloromethane (DCM, 100 μL) was prepared. This sample was allowed to dry, and samples were heated. was then heated. All samples were sonicated in dichloromethane for 5 minutes and rinsed. Samples 5.2-5.5 then had another cycle of deposition, heating and sonication. This pattern was continued so that sample 1 had 1 cycle and sample 5.5 had been subjected to 5 cycles.

Analysis

Figure 13:
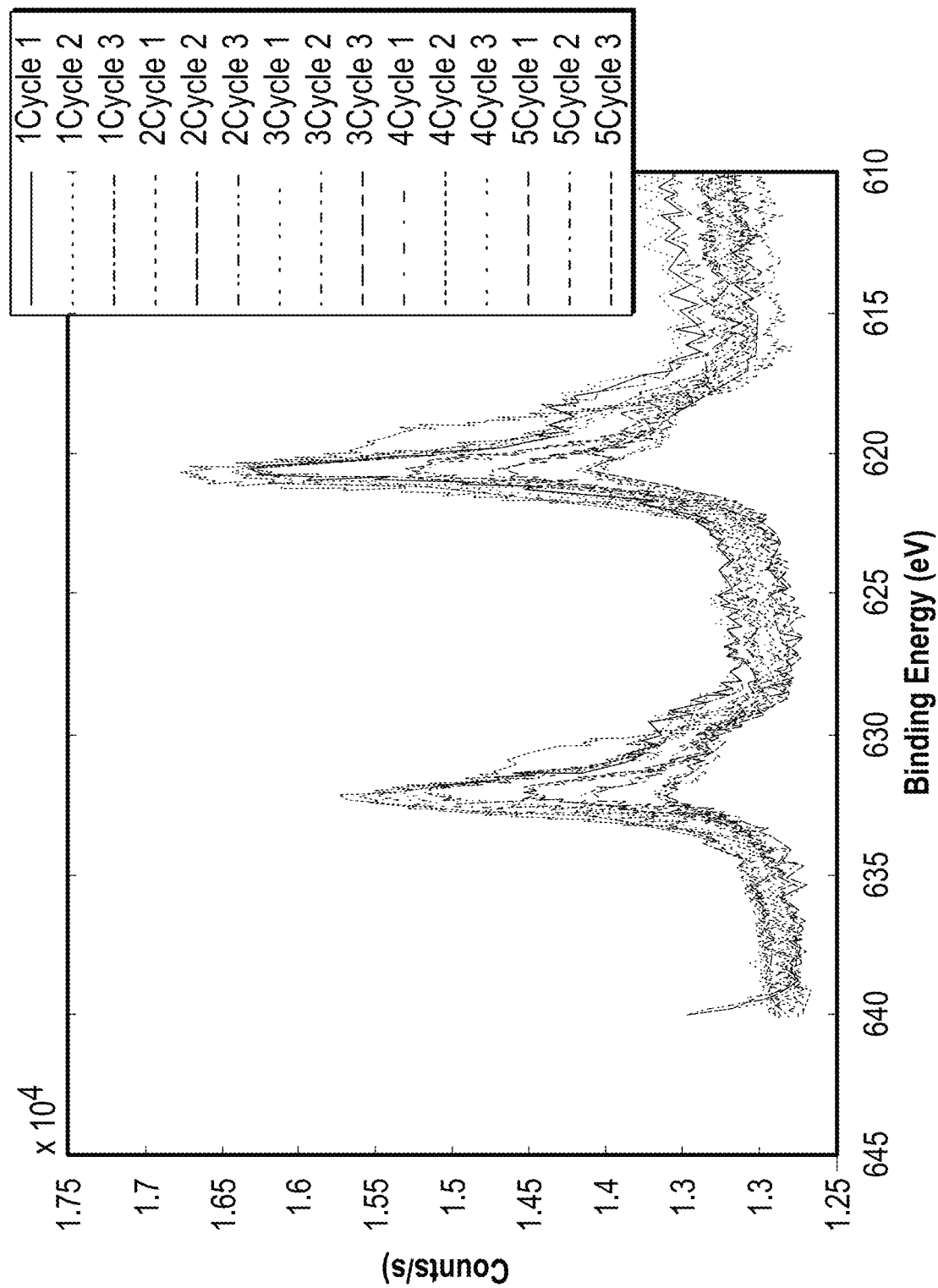
FIG. 13 provides XPS data for experiments where several depositions of anchor-functionalizing agent was used to functionalize a substrate.

XPS was performed at three different portions of each of Samples 5.1-5.5 were performed. In each instance, three different points on the wafer were probed with XPS. FIG. 13 shows the results and demonstrates that single cycles can provide good functionalization. Differences in iodine signal was attributed to sample-to-sample variability of accessible sites for binding rather than incomplete coverage after a single cycle.

Example 6

Temperature Variation

Sample Preparation

To form bis(4-iodophenyl) functionalized diamond surfaces, similar procedures as those used for Example 1 were performed with the noted differences below. Samples were named according to temperature employed-120, 130, 140, 150, 160, 170, 180. A 1% w/v solution of bis(4-iodophenyl)diazomethane) (1 mg, 0.0022 mmol) in dichloromethane (DCM, 100 μL) was prepared and deposited on the wafers. This solution was allowed to dry, and samples were heated to the prescribed temperature. All samples were sonicated in dichloromethane for 60 minutes and rinsed.

Analysis

Figure 14A:
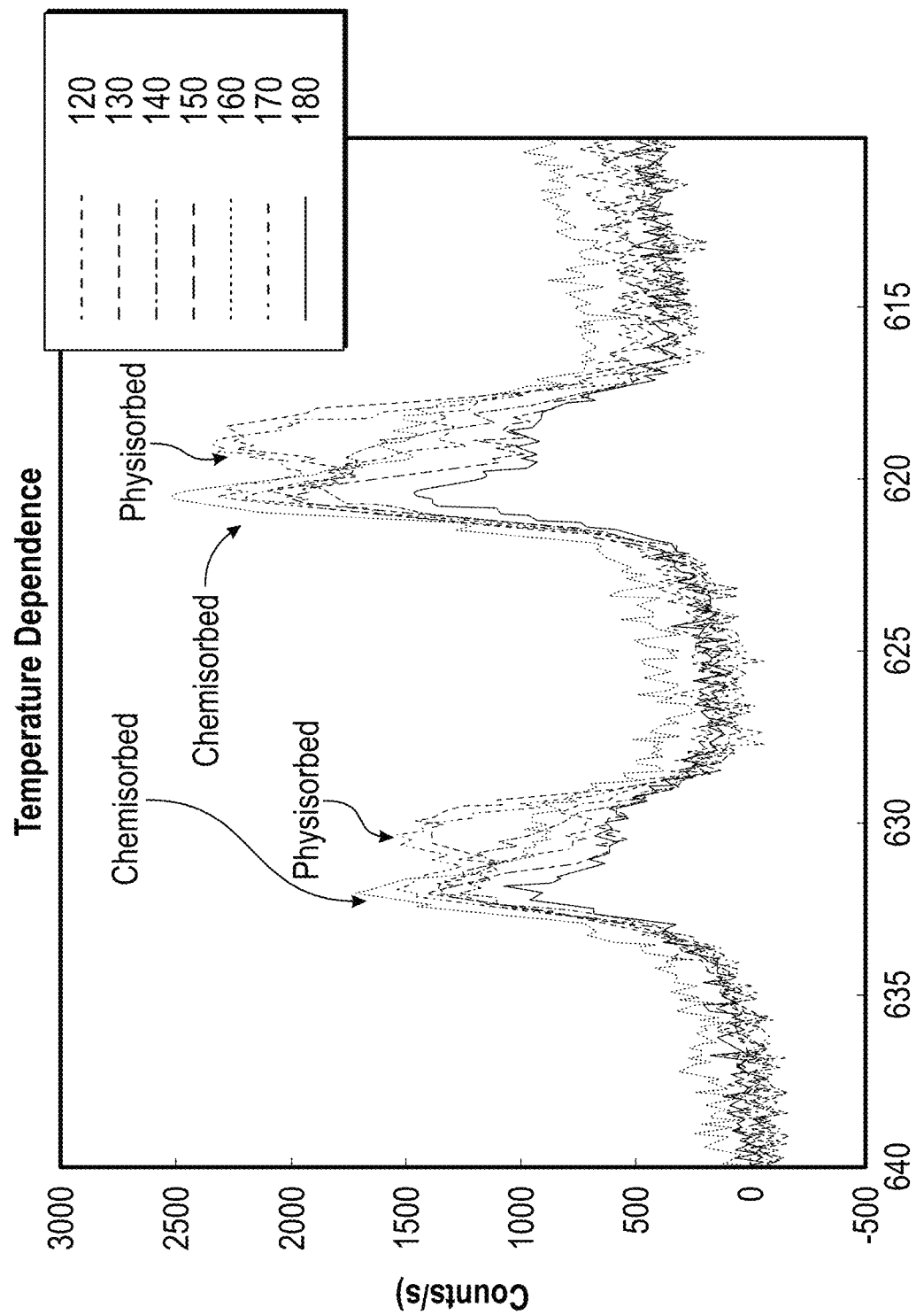
FIGS. 14A-14B show XPS data overlays for experiments where various temperatures were used during deposition of the anchor functionality on a substrate.
Figure 14B:
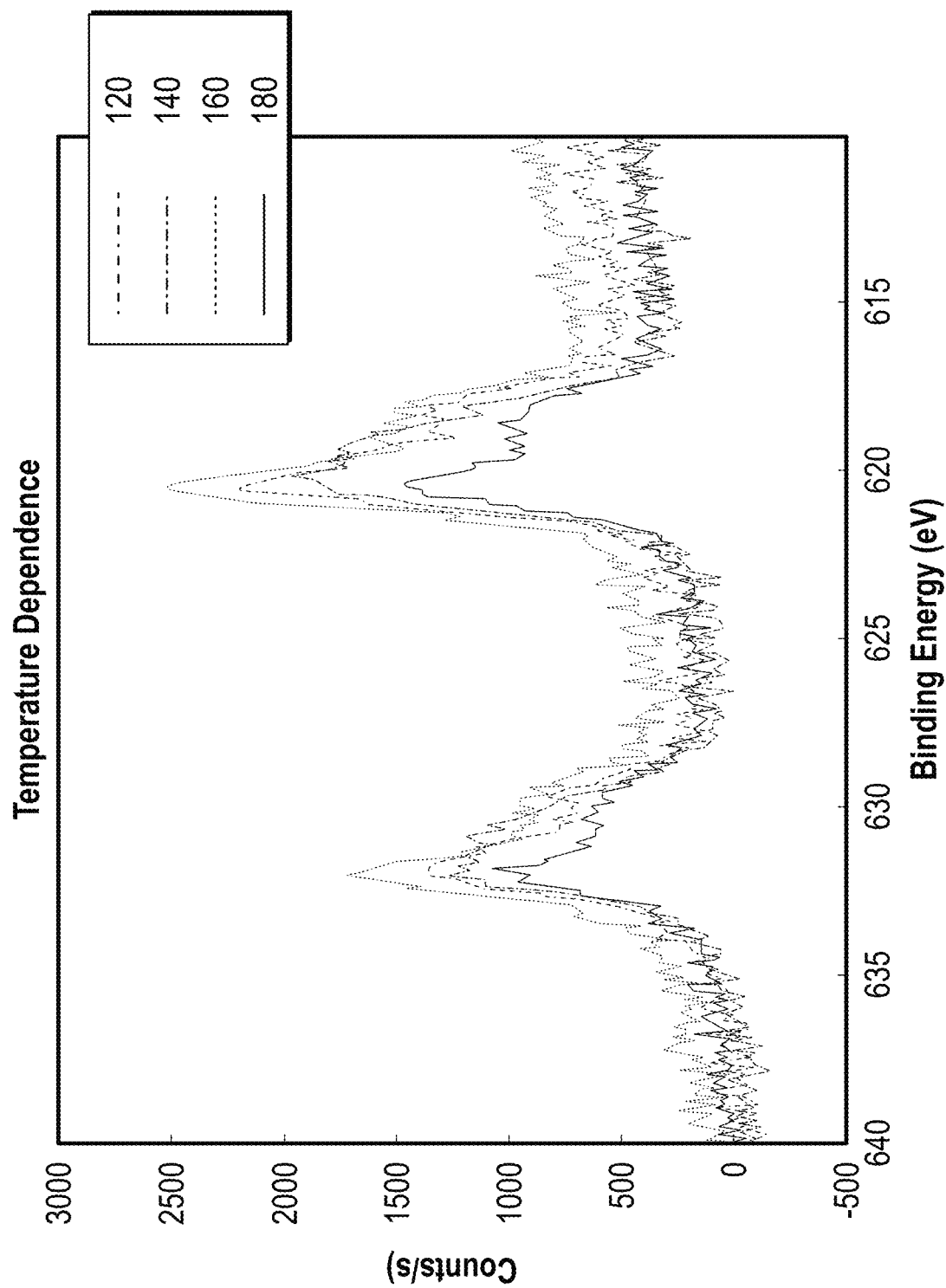

Temperature was not found to be a reliable control for coverage or method development. All temperatures suitable for causing the reaction successfully functionalized the diamond surface. Two anomalies were observed. In FIG. 14A physisorbed features are noted by the orange arrows. These features were observed at 130° C. and 170° C. The physisisorbed features were attributed to inadequate rinsing. FIG. 14B shows that the samples yielded coverage at a variety of temperatures.

Example 7

Reaction Time Variation

To form bis(4-iodophenyl) functionalized diamond surfaces, similar procedures as those used for Example 1 were performed with the noted differences below. A 0.2% w/v solution of bis(4-iodophenyl)diazomethane) (1 mg, 0.0022 mmol) in dichloromethane (DCM, 500 μL) was prepared and deposited on the wafers. This was allowed to dry for 5 minutes. Dropcasting was repeated to ensure high coverage, and dried for an additional 5 minutes. The samples were then baked on a hot plate at 160° C. for the following times: 1 min, 5 min, 10 min, 20 min. All samples were sonicated in toluene for 30 minutes. The toluene was exchanged for fresh solvent and sonicated an additional 30 minutes to ensure sample cleanliness.

Analysis

Figure 15:
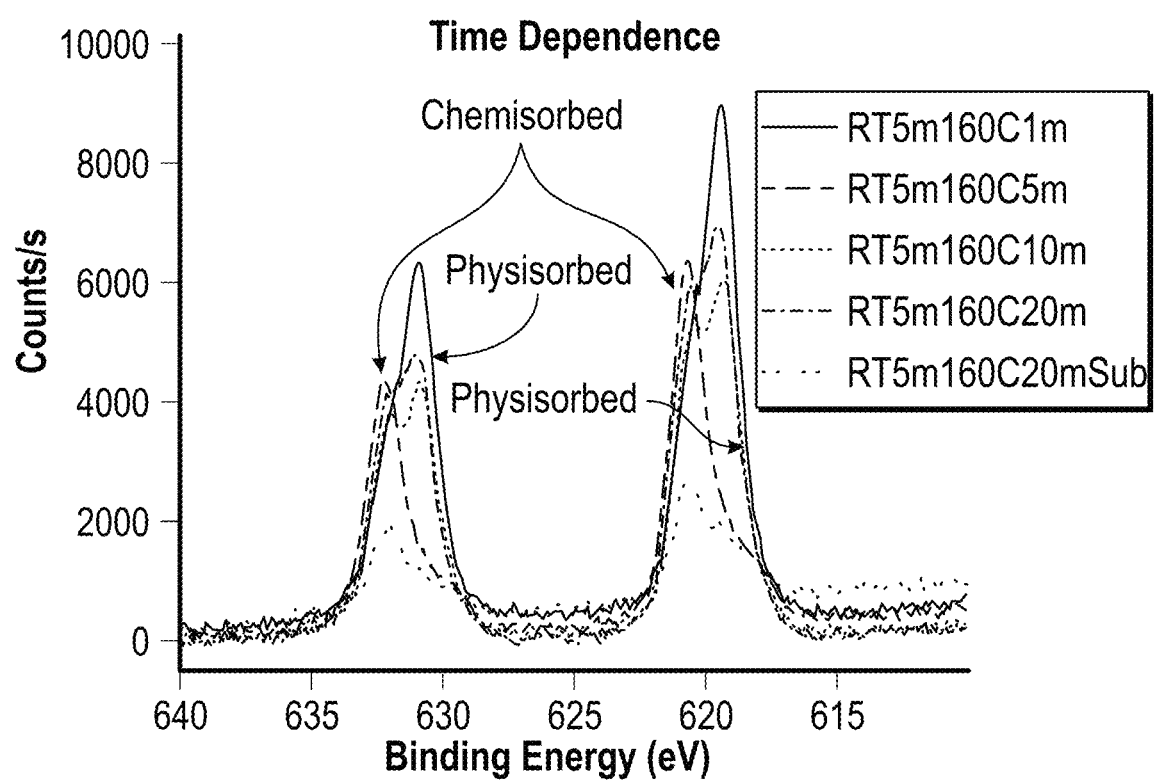
FIG. 15 shows XPS data overlays for experiments where various reaction times were used during deposition of the anchor functionality.

The iodine region of the XPS spectra are compared to assess coverage. The peaks attributed to chemisorbed and physisorbed bis(4-iodophenyl)diazomethane) are noted in FIG. 15. Reacting for shorter times favored physisorption, whereas longer times favored chemisorption.

Example 8

Reactions Using Submerged Substrates

Figure 16:
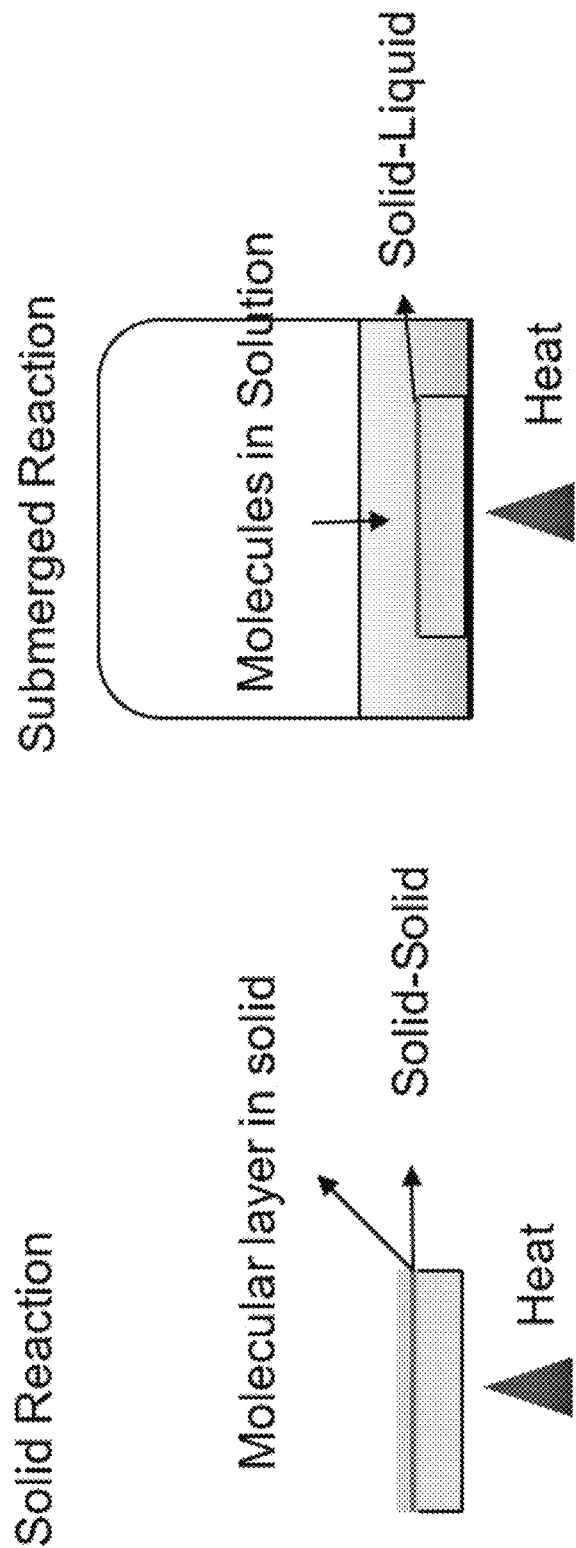
FIG. 16 shows a schematic for experiments where droplet coating or submersion was used during deposition of the anchor functionality.

To form bis(4-iodophenyl) functionalized diamond surfaces, a 1% w/v solution of bis(4-iodophenyl)diazomethane) (1 mg, 0.0022 mmol) in dichloromethane (DCM, 100 μL) was prepared. The diamond coated wafer was placed in this solution. This solution was heated in a sealed vial at a hot plate setting of 160° C. Due to pressure build-up, this reaction can be performed at small quantities or in a PARR style reactor. The solution lost color after 20 minutes of heating. FIG. 16 shows a schematic depiction of the droplet coating and submerged approaches for depositing bis(4-iodophenyl)diazomethane). In the Solid-Solid reaction, the dry reagent is applied to the wafer surface and heated. In the Solid-Liquid reaction, the solution of reagent is exposed to the substrate and heated.

Analysis

Chemisorption was evident on the submerged diamond-coated wafers but the coverage was lower than the solid-solid method. Although the coverage of the solid-liquid was lower than the solid-solid case, there are other mechansims at play that may consume the carbene reagent as it is generated by temperature. Side reactions between solvent and the carbene could be avoided by choosing different solvents (e.g., non-hydrocarbon containing solvents, such as, tetrachloromethane).

Example 10

Functionalization with Cyclodextrin Molecules

Sample Preparation

To form bis(4-iodophenyl) functionalized diamond surfaces, similar procedures as those used for Example 1 were performed with the noted differences below. A 1% w/v solution of bis(4-iodophenyl)diazomethane) (1 mg, 0.0022 mmol) in dichloromethane (DCM, 100 μL) was prepared and deposited on a diamond coated wafer. This was allowed to dry for 5 minutes. The sample was heated at 150° C. for 5 minutes. Sonication for 1 hour in toluene to remove residual material is performed. Aqueous solutions of cyclodextrin of 10 mg/mL were prepared gravimetrically. Cyclodextrin solutions were applied to the modified diamond-coated wafer and to an unmodified diamond-coated wafer for 1 minute. The solution was rinsed from the wafer under a stream of distilled water for 45 seconds.

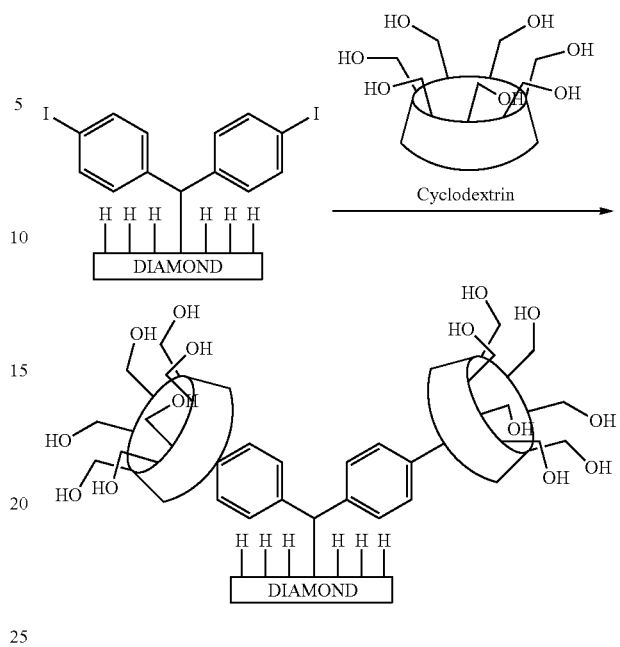

Analysis

Figure 17:
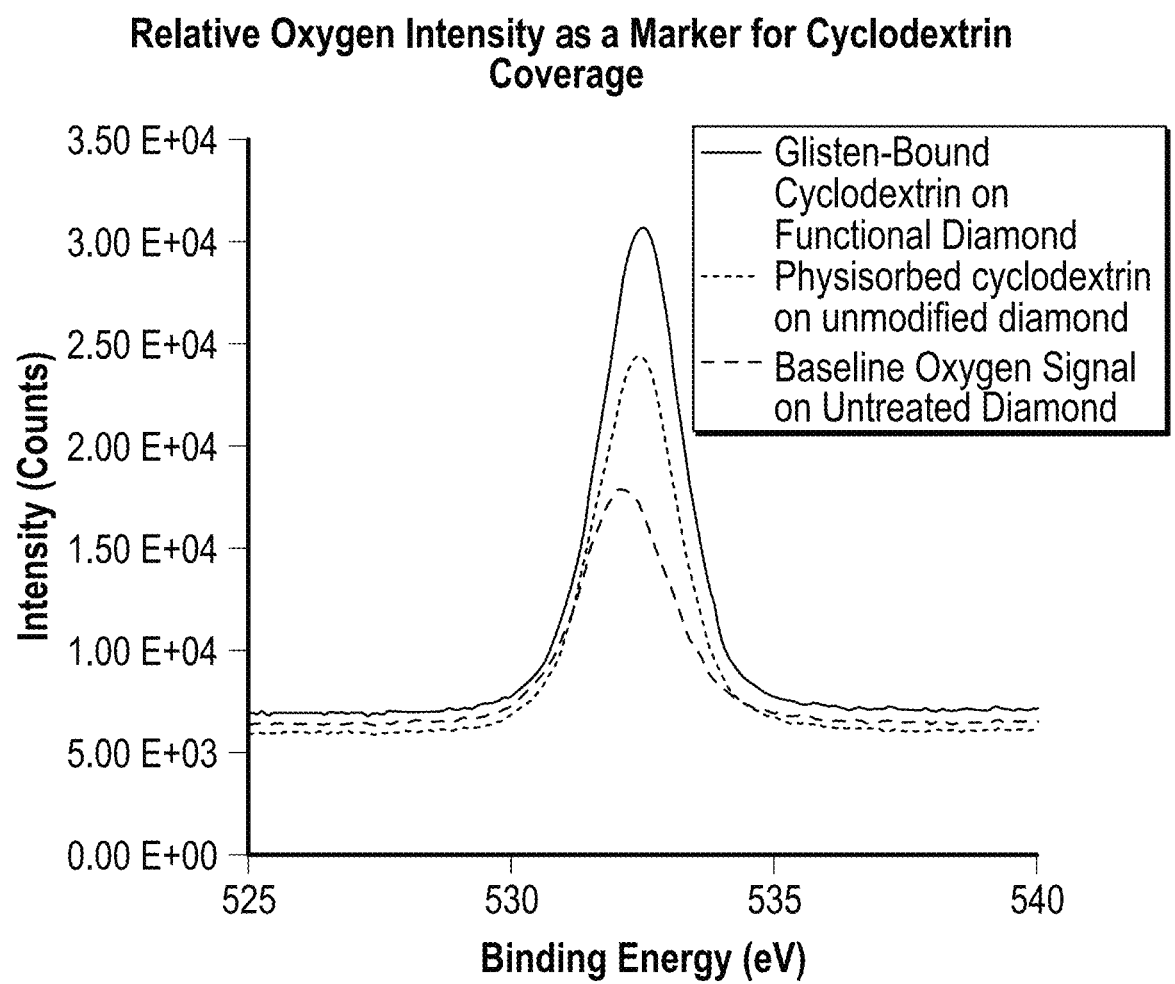
FIG. 17 shows XPS data overlays for experiments where host functionalities were used to treat the anchor-coated surfaces.

XPS was performed at three different portions of each of sample comparing cyclodextrin coverage on bis(4-iodophenyl)diazomethane) treated diamond-coated wafer and untreated diamond-coated wafer to the control unmodified diamond-coated wafers. In each instance, three different points on the wafer were probed with XPS. The iodine signal was confirmed on the bis(4-iodophenyl)diazomethane) treated diamond-coated wafer. The O1s signal was used as a proxy for cyclodextrin coverage because cyclodextrin is an oxygen rich molecule and contributed carbon against the strong background of diamond is difficult to distinguish. The O1s signal enhanced on both cyclodextrin-exposed wafers consistent with cyclodextrin remaining on both surfaces after rinsing. The bis(4-iodophenyl)diazomethane) had persistant increase in coverage relative to the unmodified diamond. Exemplary XPS spectra for points on each sample are shown below in FIG. 17. Comparisons of the O1s XPS region is shown for each sample. Oxygen is a proxy for cyclodextrin coverage in this example. The untreated diamond has a baseline oxygen intensity. Exposing cyclodextrin to a unmodified diamond surface and then rinsing results in a higher observed signal. The modified diamond has the largest signal. Samples were rinsed for 45 seconds under a stream of water.

Example 11

Preparation of Bis(4-Adamantyl) Functionalized Diamond Surface

Sample Preparation

The following is a prophetic example for the functionalization and testing of bis(4-adamantyl) diamond surface.

The following scheme shows the formation of a bis(4-adamantyl) functionalized diamond surface:

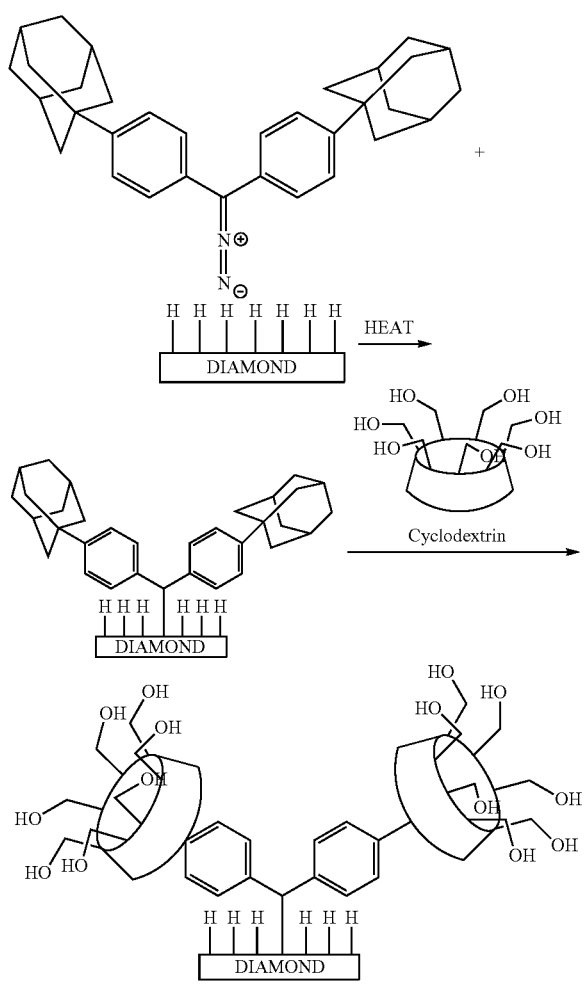

Briefly, to form the bis(4-adamantyl)diazomethane functionalized diamond surface, a 1% w/v (where a 1% solution is equivalent to 1 gram of compound per 100 mL of solution) solution of bis(4-adamantyl)diazomethane) (1 mg, 0.00323 mmol) in dichloromethane (DCM, 100 µL) is prepared. At that time, to the bis(4-adamantyl)diazomethane solution is added a diamond-coated wafer or a single crystal diamond. The solvent is allowed to evaporate for 5 to 10 minutes. At that time the diamond of diamond-coated wafer is heated to a temperature of 120-180° C. for a period of 5-20 minutes. The sample is then held in a solution of toluene and sonicated for 10 hour. Alternatively, the sample is preheated to 120-180° C. and the solution is applied to it and dried at elevated temperature prior to sonication. Regardless, after cleaning the reaction affords an anchor-functionalized diamond.

Contact angle testing will show that the diamond is hydrophobic with a contact angle of approximately 60°.

To functionalize the pendant adamantyl groups with β-cyclodextrin, the anchor-functionalized diamond is placed in a solution of β-cyclodextrin at a concentration of >10 mg/mL. Cyclodextrin solutions are applied to the modified diamond-coated wafer and to an unmodified diamond-coated wafer for 1 minute. The solution is rinsed from the wafer under a stream of distilled water for 45 seconds.

Analysis

XPS is performed on the test substrate and versus an untreated β-cyclodextrin exposed Control (where treatment with bis(4-adamantyl)diazomethane) is not performed) and an unmodified diamond. Comparison of the data shows that the oxygen signal is higher on the modified diamond. Because the adamantane cage is tailored to the cavity size of the cyclodextrin, a higher binding coefficient is expected to produce a more stable and resilient cyclodextrin coating.

Self-assembly of the β-cyclodextrin is analyzed with water contact angle. Angles will decrease according to the quantity of cyclodextrin residing on the substrate. The change in the refractive index of the surface after molecular coating is determined using optical ellipsometry. This will yield to an added film thickness of 1-3 nm. The contact angle of the host functionlized diamond is between 0° and 15°

Soiling testing is then performed. A coated diamond and a non-coated diamond are placed side-by-side in a ring setting. The diamonds are compared before and after treatment using the angular spectrum evaluation tool (ASET), a standardized technique for examining the optical performance of diamond. The fouling on the coated diamond is undetectable by ASET (as shown in FIGS. 1C and 1E). Soiling performance is evaluated both in real-world applications for a ring worn on a person and by testing the diamond coating against soaps, dirt, lotion, and oil. The treated and untreated diamonds are cleaned to remove adventitious and large particles and are compared on ASET to evaluate the fire and brilliance lost to adsorbed dirt and grime. Over the course of one month of normal wear and tear, the host-coated diamond does not accumulate dirt or oil as shown in FIGS. 1C and 1E. The un-treated diamond, however, is soiled as shown in FIGS. 1D, 1F, and 1G.

Example 12

Preparation of 1,1'(bis(4,1-phenylene))bismethyl-adamantane)-Functionalized Diamond Surface Sample Preparation The following is a prophetic example for the functionalization and testing of a coated diamond surface.

The following scheme shows the formation of an adamantyl-functionalized diamond surface:

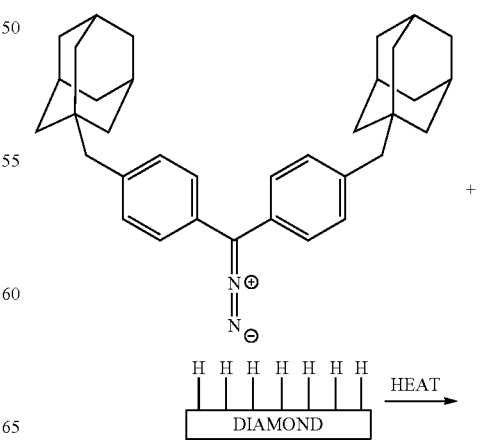

-continued

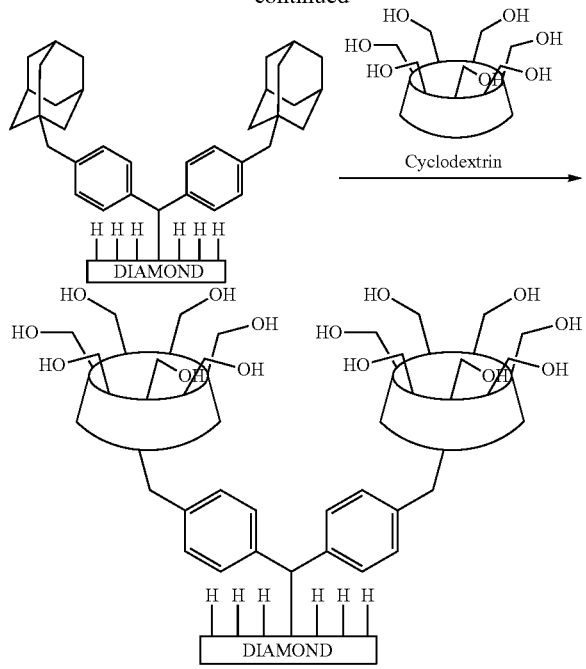

Briefly, to form the bis(4-adamantyl)diazomethane functionalized diamond surface, a 1% w/v (where a 1% solution is equivalent to 1 gram of compound per 100 mL of solution) solution of 1,1'((diazomethylene)bis(4,1-phenylene)) bismethyladamantane) (1 mg) in dichloromethane (DCM, 100 µL) is prepared. At that time, to the 1,1'((diazomethylene) bis(4,1-phenylene))bismethyladamantane) solution is added a diamond-coated wafer or a single crystal diamond. The solvent is allowed to evaporate for 5 to 10 minutes. At that time the diamond of diamond-coated wafer is heated to a temperature of 120-180° C. for a period of 5-20 minutes. The sample is then held in a solution of toluene and sonicated for 10 hour. Alternatively, the sample is preheated to 120-180° C. and the solution is applied to it and dried at elevated temperature prior to sonication. Regardless, after cleaning the reaction affords an anchor-functionalized diamond.

Contact angle testing will show that the diamond is hydrophobic with a contact angle of approximately 65°.

To functionalize the pendant adamantyl groups with β-cyclodextrin, the anchor-functionalized diamond is placed in a solution of β-cyclodextrin at a concentration of >10 mg/mL. Cyclodextrin solutions are applied to the modified diamond-coated wafer and to an unmodified diamond-coated wafer for 1 minute. The solution is rinsed from the wafer under a stream of distilled water for 45 seconds.

Analysis

XPS is performed on the test substrate and versus an untreated β-cyclodextrin exposed Control (where treatment with 1,1'((diazomethylene) bis(4,1-phenylene)) bismethyladamantane) is not performed) and an unmodified diamond. Comparison of the data shows that the oxygen signal is higher on the modified diamond. Because the adamantane cage is tailored to the cavity size of the cyclodextrin, a higher binding coefficient is expected to produce a more stable and resilient cyclodextrin coating.

Self-assembly of the β-cyclodextrin is analyzed with water contact angle. Angles will decrease according to the quantity of cyclodextrin residing on the substrate. The change in the refractive index of the surface after molecular coating is determined using optical ellipsometry. This will yield to an added film thickness of 1-3 nm. The contact angle of the host functionlized diamond is between 0° and 10°

Soiling testing is then performed. A coated diamond and a non-coated diamond are placed side-by-side in a ring setting. The diamonds are compared before and after treatment using the angular spectrum evaluation tool (ASET), a standardized technique for examining the optical performance of diamond. The fouling on the coated diamond is undetectable by ASET (as shown in FIGS. 1C and 1E). Soiling performance is evaluated both in real-world applications for a ring worn on a person and by testing the diamond coating against soaps, dirt, lotion, and oil. The treated and untreated diamonds are cleaned to remove adventitious and large particles and are compared on ASET to evaluate the fire and brilliance lost to adsorbed dirt and grime. Over the course of one month of normal wear and tear, the host-coated diamond does not accumulate dirt or oil as shown in FIGS. 1C and 1E. The un-treated diamond, however, is soiled as shown in FIGS. 1D, 1F, and 1G.

What is claimed is:

1. A coated gemstone comprising a coating and a gemstone, the coated gemstone represented by Formula I:

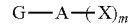

Formula I where
G represents the gemstone and the coating comprises -A(-X)$_m$;
A is an anchor moiety covalently bonded to G;
X is a guest moiety covalently bonded to A;
m is an integer between 1 and 5; and
wherein the coated gemstone is configured to resist the accumulation of oil and dirt on the surface of the gemstone when functionalized with the host,
wherein the gemstone is a diamond and -A(-X)$_m$ is represented by the following structure:

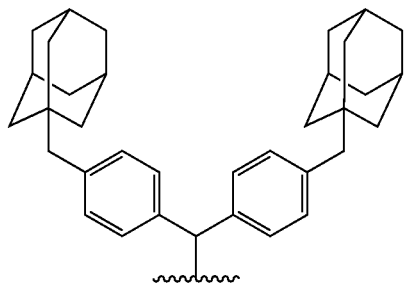 [SMILES: *C(c1ccc(CC23CC4CC(CC(C4)C2)C3)cc1)c1ccc(CC23CC4CC(CC(C4)C2)C3)cc1]

where ⌇ indicates a bond to G.

2. The coated gemstone of claim 1, wherein the coated gemstone comprises a host molecule.

3. The coated gemstone of claim 2, wherein the host molecule is β-cyclodextrin.

4. The coated gemstone of claim 1, wherein the guest moiety is configured to be received in the pore of a cyclodextrin selected from the group consisting of an α-cyclodextrin, a β-cyclodextrin, and a γ-cyclodextrin.

5. A coated, soil-resistant gemstone comprising an anchor irreversibly linked to the gemstone and a binding agent, wherein the anchor comprises a pendant binding portion that reversibly binds to the binding agent,
wherein the binding agent is hydrophilic.

6. The coated gemstone of claim 5, wherein the binding agent is configured to change one or more surface properties of the gemstone to provide soil resistance.

7. The coated gemstone of claim 5, wherein the coated gemstone has a contact angle for water that is at least 50° lower than a contact angle of the gemstone prior to coating.

8. A jewelry piece comprising the coated gemstone of claim 1.

9. A method of manufacturing the coated gemstone of claim 1, the method comprising:
reacting an anchor-guest reagent with the gemstone to provide a gemstone having pendant guest moieties.

10. The method of claim 9, further comprising exposing the gemstone comprising pendant guest moieties to a host molecule.

11. A method of preventing or delaying the soiling of a gemstone, the method comprising:
providing the coated gemstone of claim 1; and
exposing the coated gemstone to host molecule to provide a soil-resistant gemstone.

12. The method of claim 11, further comprising reapplying the host molecule to the gemstone after a period of use of the soil-resistant gemstone.

13. The method of claim 11, further comprising washing soil resistant gemstone to remove residual host molecules after a period of use of the soil-resistant gemstone.

14. The method of claim 13, further comprising reapplying the host molecule to the gemstone after a period of use of the soil-resistant gemstone.

15. The coated gemstone of claim 1, further represented by Formula II:

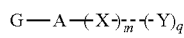

Formula II where
Y is represented by the following structure:

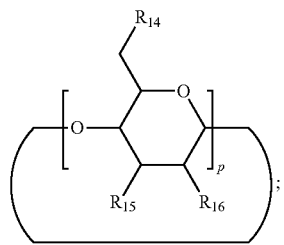

where
p is an integer from 1 to 8;
each of $R_{14}$, $R_{15}$, and $R_{16}$ is independently selected from —H, $C_1$ to $C_6$ alkoxy, halogen, and polyether; and
q is an integer between 1 and 5.

16. A coated gemstone comprising a coating and a gemstone, the coated gemstone represented by Formula I:

Formula I where
G represents the gemstone and the coating comprises -A(-X)$_m$;
A is an anchor moiety covalently bonded to G;
X is a guest moiety covalently bonded to A;
m is an integer between 1 and 5; and
wherein the coated gemstone is configured to resist the accumulation of oil and dirt on the surface of the gemstone when functionalized with the host,
wherein, A is represented by Formula AIII:

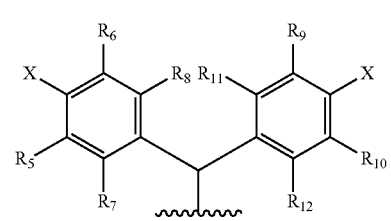

Formula AIII wherein ⁓ indicates a bond to G;
$R_5$, $R_6$, $R_7$, $R_8$, $R_9$, $R_{10}$, $R_{11}$, and $R_{12}$ are independently selected from —H, $C_1$ to $C_6$ alkyl optionally substituted with halogen or hydroxy, $C_1$ to $C_6$ alkenyl optionally substituted with halogen or hydroxy, $C_1$ to $C_6$ alkynyl optionally substituted with halogen or hydroxy, $C_1$ to $C_6$ alkoxy, hydroxyl, halogen, $C_1$ to $C_6$ haloalkyl, $C_1$ to $C_6$ haloalkoxy, a mono-substituted amine($C_1$ to $C_6$ alkyl), a di-substituted amine($C_1$ to $C_6$ alkyl), a diamino-group, a polyamino, a diether-group, and a polyether; and
X is a guest moiety represented the following structure:

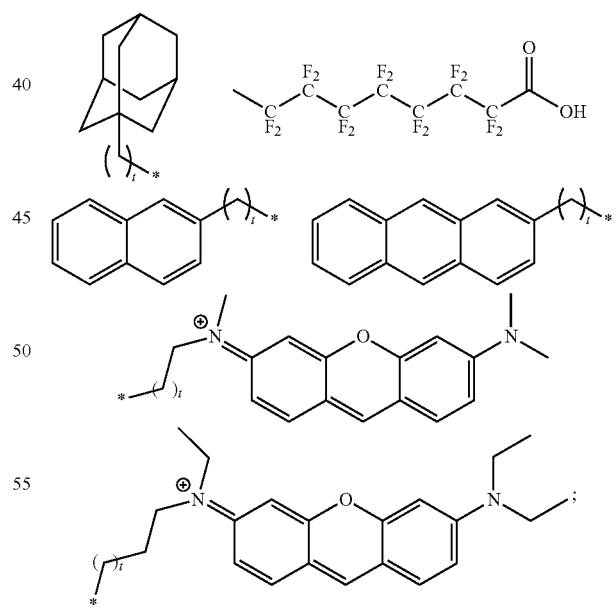

where * represents a bond to A; and
t is an integer from 0 to 5.

17. The coated gemstone of claim 16, wherein the coated gemstone comprises a host molecule.

18. The coated gemstone of claim 17, wherein the host molecule is β-cyclodextrin.

19. The coated gemstone of claim 16, wherein the gemstone is selected from the group consisting of alexandrite, amethyst, aquamarine, citrine, diamond, emerald, garnet, jade, lapis lazuli, moonstone, morganite, onyx, opal, paraiba, pearls, peridot, rubellite, spinel, tanzanite, topaz, tourmaline, turquoise, and zircon.

* * * * *